United States Patent
Nozawa et al.

(10) Patent No.: US 10,542,228 B2
(45) Date of Patent: Jan. 21, 2020

(54) IMAGING SYSTEM INCLUDING ILLUMINATOR AND IMAGING DEVICE

(71) Applicant: Panasonic Intellectual Property Management Co., Ltd., Osaka (JP)

(72) Inventors: Katsuya Nozawa, Osaka (JP); Yasuo Miyake, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 246 days.

(21) Appl. No.: 15/497,157

(22) Filed: Apr. 25, 2017

(65) Prior Publication Data

US 2017/0332025 A1  Nov. 16, 2017

(30) Foreign Application Priority Data

May 11, 2016  (JP) .................................. 2016-095055
May 11, 2016  (JP) .................................. 2016-095056

(51) Int. Cl.
*H04N 5/374* (2011.01)
*H01L 27/144* (2006.01)
(Continued)

(52) U.S. Cl.
CPC ......... *H04N 5/374* (2013.01); *H01L 27/1446* (2013.01); *H01L 27/14601* (2013.01);
(Continued)

(58) Field of Classification Search
CPC .... H04N 5/374; H04N 5/378; H04N 5/35563; H04N 5/2256; H04N 5/351; H04N 5/369;
(Continued)

(56) References Cited

U.S. PATENT DOCUMENTS 5,218,558 A * 6/1993 Omura .................. G06F 17/141
                                                     348/E5.079
5,579,103 A   11/1996 Tachikawa
(Continued)

FOREIGN PATENT DOCUMENTS

JP          10-009834         1/1998
JP          2001-153612       6/2001
(Continued)

OTHER PUBLICATIONS

The partial European search report (R.64 EPC) dated Nov. 7, 2017, for the related European Patent Application No. 17167663.8.

*Primary Examiner* — Twyler L Haskins
*Assistant Examiner* — Angel L Garces-Rivera
(74) *Attorney, Agent, or Firm* — McDermott Will & Emery LLP

(57) ABSTRACT

An imaging system includes a first illuminator that irradiates a subject with light whose intensity varies over time; and a first imaging device that includes a first imaging cell having a variable sensitivity, and a first sensitivity control line electrically connected to the first imaging cell. The first imaging cell includes a photoelectron conversion area that receives light from the subject to generate a signal charge, and a signal detection circuit that detects the signal charge. During an exposure period, the first sensitivity control line supplies to the first imaging cell a first sensitivity control signal having a waveform expressed by a first function that takes only positive values by adding a first constant to one basis from among bases of a system of functions constituting an orthogonal system.

13 Claims, 25 Drawing Sheets

(51) Int. Cl.
  *H01L 27/146* (2006.01)
  *H04N 5/225* (2006.01)
  *H04N 5/351* (2011.01)
  *H04N 5/369* (2011.01)
  *H04N 5/378* (2011.01)
(52) U.S. Cl.
  CPC ..... *H01L 27/14665* (2013.01); *H04N 5/2256* (2013.01); *H04N 5/351* (2013.01); *H04N 5/369* (2013.01); *H04N 5/378* (2013.01)
(58) Field of Classification Search
  CPC ............ H04N 5/3745; H01L 27/14665; H01L 27/1446; H01L 27/14601; G01S 17/89; G01S 17/36
  See application file for complete search history.

(56) References Cited

U.S. PATENT DOCUMENTS

| | | |
|---|---|---|
| 5,754,280 A | 5/1998 | Kato et al. |
| 2005/0156121 A1 | 7/2005 | Bamji et al. |
| 2007/0076108 A1 | 4/2007 | Misawa |
| 2016/0119562 A1 | 4/2016 | Takase et al. |

FOREIGN PATENT DOCUMENTS

| | | |
|---|---|---|
| JP | 2006-050343 | 2/2006 |
| JP | 2006-153773 | 6/2006 |
| JP | 2007-104114 | 4/2007 |

* cited by examiner

IMAGING SYSTEM INCLUDING ILLUMINATOR AND IMAGING DEVICE

BACKGROUND

1. Technical Field

The present disclosure relates to an imaging device, an imaging system, and a photodetection method.

2. Description of the Related Art

Recently, charge-coupled device (CCD) sensors and complementary MOS (CMOS) sensors are being used widely. As is well known, these photosensors include photodiodes formed on a semiconductor substrate, and generate a signal corresponding to illuminance. Recently, a structure in which a photoelectric conversion layer is disposed on top of an inter-layer insulating layer that covers a semiconductor substrate on which is formed a readout circuit, or in other words, a laminated structure, has also been proposed.

Each imaging cell of a digital image sensor as typified by a CMOS image sensor generally includes a photoelectron conversion area such as a photodiode, a charge accumulation region (also called a "floating diffusion"), and a readout circuit electrically connected to the charge accumulation region. The charge accumulation region accumulates signal charge generated by the photoelectron conversion area, and the readout circuit reads out a signal (typically a voltage signal) corresponding to the amount of signal charge accumulated in the charge accumulation region.

The amount of signal charge accumulated in the charge accumulation region of each imaging cell has a magnitude proportional to the illuminance with respect to the imaging cell and the integral value over the exposure period of the integral of the sensitivity during image capture. Typically, during image capture, a sensitivity corresponding to the scene is set, and this sensitivity is kept constant during the acquisition of the image for one frame. In other words, the sensitivity of each imaging cell is constant over the entire frame term. Consequently, the signal that is ultimately read out from each imaging cell corresponds to the result of accumulating over time the signal charge produced at each instant during the exposure period.

This means that if the position of the subject changes during the exposure period, for example, an image is obtained in which a picture of the subject at one instant is overlaid onto a picture of the subject at another instant. In other words, blur is produced in the picture of the subject in the image. Japanese Unexamined Patent Application Publication No. 2006-050343 discloses an image forming method of detecting the movement speed of a subject (for example, a vehicle) whose position changes during the exposure period. In the method, the movement speed is detected based on the pictures of the subject at instants during the exposure period, and a picture of the subject at the start of the exposure is constructed.

SUMMARY

In one general aspect, the techniques disclosed here feature an imaging system including a first illuminator that irradiates a subject with light whose intensity varies over time; and a first imaging device that includes a first imaging cell having a variable sensitivity, and a first sensitivity control line electrically connected to the first imaging cell. The first imaging cell includes a photoelectron conversion area that receives light from the subject to generate a signal charge, and a signal detection circuit that detects the signal charge. During an exposure period from a reset of the first imaging cell until a readout of the signal charge accumulated in the first imaging cell by exposure, the first sensitivity control line supplies to the first imaging cell a first sensitivity control signal having a waveform expressed by a first function that takes only positive values by adding a first constant to one basis from among bases of a system of functions constituting an orthogonal system.

It should be noted that general or specific embodiments may be implemented as an element, a device, an apparatus, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
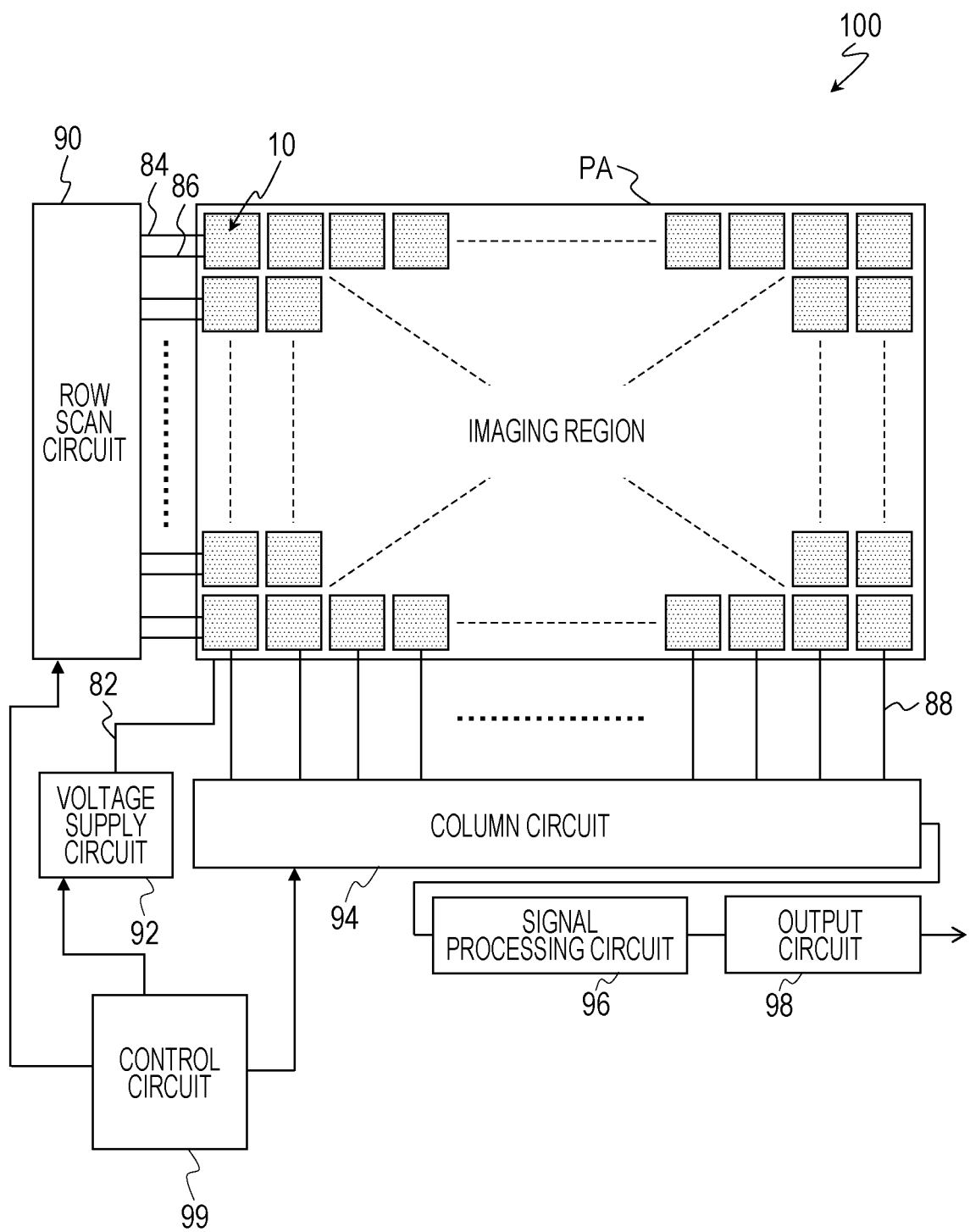
FIG. 1 is a diagram schematically illustrating an exemplary configuration of an imaging device according to a first embodiment of the present disclosure.

Underlying Knowledge Forming Basis of the Present Disclosure

As discussed above, the signal output from each imaging cell in an image sensor of the related art is a signal that corresponds to the total amount of signal charge generated during the exposure period. Consequently, even if the brightness of the subject varies during the exposure period, the brightness variation may not be ascertained from the output of each imaging cell. In other words, with an image sensor of the related art, it is not possible to acquire information related to variations in the brightness of a subject over a time shorter than the exposure period. The technology described in Japanese Unexamined Patent Application Publication No. 2006-050343 is effective at removing blur when capturing a subject whose position changes spatially during the exposure period, but does not consider variations in the brightness of the subject itself during the exposure period. The image data ultimately obtained by the technology described in Japanese Unexamined Patent Application Publication No. 2006-050343 is image data of the subject at the start of exposure, and this image data does not include information related to brightness variations in the subject during the exposure period.

In principle, if the exposure period is shortened, brightness information that varies in a comparatively shorter time is acquirable. However, if the exposure period is shortened, the number of photons that arrive at the imaging cell in the exposure period decreases, and the amount of charge generated by photoelectric conversion (the amount of signal charge) decreases. In a photosensor, signal charge produced by causes other than the radiance of light (that is, noise) is unavoidable, and a decrease in the amount of signal charge results in a worsened signal-to-noise ratio (also designated S/N).

Image sensors which act as photodetection elements are used not only to capture moving images or still images for commemorative purposes, but also in situations of measurement or analysis. Furthermore, image sensors are useful for machine vision. For this reason, it is beneficial to be able to utilize a photodetection element to acquire more information from a subject.

According to an embodiment of the present disclosure, it is possible to acquire information related to variation over time in the brightness of a subject inside the exposure period.

An overview of aspects of the present disclosure is given below.

[Item 1]

An imaging system, comprising:
a first illuminator that irradiates a subject with light whose intensity varies over time; and
a first imaging device that comprises a first imaging cell having a variable sensitivity, and a first sensitivity control line electrically connected to the first imaging cell, wherein
the first imaging cell comprises a photoelectron conversion area that receives light from the subject to generate a signal charge, and a signal detection circuit that detects the signal charge, and
during an exposure period from a reset of the first imaging cell until a readout of the signal charge accumulated in the first imaging cell by exposure, the first sensitivity control line supplies to the first imaging cell a first sensitivity control signal having a waveform expressed by a first function that takes only positive values by adding a first constant to one basis from among bases of a system of functions constituting an orthogonal system.

According to the configuration of Item 1, brightness variation may be produced in the subject, and information corresponding to a specific component may be extracted from among the variation over time in the brightness of the subject.

[Item 2]

The imaging system according to Item 1, wherein
the illuminator periodically varies the intensity of the light.

[Item 3]

The imaging system according to Item 1 or 2, wherein
the first imaging device further comprises a synchronization circuit that synchronizes the first sensitivity control signal with the variation over time in the intensity of the light.

According to the configuration of Item 3, it is possible to align the phase of the variation over time in the brightness of the subject with the phase of the variation over time in the sensitivity of the first imaging cell.

[Item 4]

The imaging system according to any of Items 1 to 3, further comprising a second illuminator and a second imaging device that constitute a pair, wherein
the second illuminator irradiates the subject with light whose intensity varies over time,
the second imaging device comprises a second imaging cell having a variable sensitivity, and a second sensitivity control line electrically connected to the second imaging cell,
the second imaging cell comprises a photoelectron conversion area that receives light from the subject to generate a signal charge, and a signal detection circuit that detects the signal charge, and
during an exposure period from a reset of the second imaging cell until a readout of the signal charge accumulated in the second imaging cell by exposure, the second sensitivity control line supplies to the second imaging cell a second sensitivity control signal having a waveform expressed by a second function that takes only positive values by adding a second constant to another basis from among the bases.

According to the configuration of Item 4, even if multiple imaging systems are used at the same time, crosstalk therebetween may be prevented.

[Item 5]

The imaging system according to any of Items 1 to 4, wherein
the one basis from among the bases is a trigonometric function.

According to the configuration of Item 5, information related to a component in which the amplitude varies at a specific frequency may be extracted from among the components constituting the variation in the illuminance during the exposure period.

[Item 6]

The imaging system according to any of Items 1 to 4, wherein
the one basis from among the bases is a Walsh function that is not a constant function.

[Item 7]

The imaging system according to any of Items 1 to 6, wherein
during a second exposure period later than the exposure period, the first sensitivity control line supplies to the first imaging cell a third sensitivity control signal having a waveform expressed by a third function obtained by time-shifting the first function.

According to the configuration of Item 7, an image signal for cancelling out excess offset in lightness may be acquired more rapidly.

[Item 8]

The imaging system according to any of Items 1 to 6, wherein
during a second exposure period later than the exposure period, the first sensitivity control line supplies to the first imaging cell a third sensitivity control signal having a waveform expressed by a constant function.

According to the configuration of Item 8, an image may be formed in which excess offset in lightness is cancelled out.

[Item 9]

The imaging system according to any of Items 1 to 6, wherein
the first imaging device further comprises a third imaging cell having a variable sensitivity, and a third sensitivity control line electrically connected to the third imaging cell,
the third imaging cell comprises a photoelectron conversion area that receives light from the subject to generate a signal charge, and a signal detection circuit that detects the signal charge, and
during an exposure period from a reset of the third imaging cell until a readout of the signal charge accumulated in the third imaging cell by exposure, the third sensitivity control line supplies to the third imaging cell a fourth sensitivity control signal having a waveform expressed by a fourth function obtained by time-shifting the first function.

According to the configuration of Item 9, an image may be formed in which excess offset in lightness is cancelled out.

[Item 10]

The imaging system according to any of Items 1 to 6, wherein
the first imaging device further comprises a third imaging cell having a variable sensitivity, and a third sensitivity control line electrically connected to the third imaging cell,
the third imaging cell comprises a photoelectron conversion area that receives light from the subject to generate a signal charge, and a signal detection circuit that detects the signal charge, and
during an exposure period from a reset of the third imaging cell until a readout of the signal charge accumulated in the third imaging cell by exposure, the third sensitivity control line supplies to the third imaging cell a fourth sensitivity control signal having a waveform expressed by a constant function.

According to the configuration of Item 10, an image signal for cancelling out excess offset in lightness may be acquired more rapidly.

[Item 11]

The imaging system according to any of Items 1 to 10, wherein the orthogonal system is a complete orthogonal system.

According to the configuration of Item 11, even if the variation over time in the brightness of the subject is not periodic, information related to a specific component may be extracted from the variation over time in the brightness of the subject.

[Item 12]

An imaging system, comprising:

a first illuminator that irradiates a subject with light whose intensity varies over time; and a first imaging device that comprises a first imaging cell having a variable sensitivity, and a first sensitivity control line electrically connected to the first imaging cell, wherein the first imaging cell comprises a photoelectron conversion area that receives light from the subject to generate a signal charge, and a signal detection circuit that detects the signal charge, and during an exposure period from a reset of the first imaging cell until a readout of the signal charge accumulated in the first imaging cell by exposure, the first sensitivity control line supplies to the first imaging cell a first sensitivity control signal having a pulse waveform.

According to the configuration of Item 12, it is possible to vary the sensitivity of the first imaging cell in a pulsed manner.

[Item 13]

The imaging system according to Item 12, wherein the first imaging device further comprises a synchronization circuit that synchronizes the first sensitivity control signal with the variation over time in the intensity of the light.

According to the configuration of Item 13, it is possible to execute imaging that increases the sensitivity at a timing delayed by a specific time from the emission of light from the illuminator.

[Item 14]

The imaging system according to Item 12 or 13, wherein the first imaging device comprises a plurality of imaging cells including the first image cell, each of the plurality of imaging cells having a variable sensitivity.

According to the configuration of Item 14, a two-dimensional or a one-dimensional image related to a specific component may be acquired.

[Item 15]

The imaging system according to Item 14, wherein the first sensitivity control line supplies the first sensitivity control signal in common to the plurality of imaging cells.

According to the configuration of Item 15, it is possible to impart a common modulation to the sensitivity of multiple imaging cells while also synchronizing the imaging cells.

[Item 16]

The imaging system according to items 1 or 12, comprising a plurality of illuminators including the first illuminator, and a plurality of imaging devices including the first imaging device, wherein each of the plurality of illuminators irradiates a subject with light whose intensity varies over time, each of the plurality of imaging devices comprises a plurality of imaging cells each having a variable sensitivity, and a plurality of sensitivity control lines each electrically connected to one or more of the plurality of imaging cells, each of the plurality of imaging cells comprises a photoelectron conversion area that receives light from the subject to generate a signal charge, and a signal detection circuit that detects the signal charge, and each of the plurality of imaging cells receives a sensitivity control signal from one of the plurality of sensitivity control lines during an exposure period from a reset of the imaging cell until a readout of the signal charge accumulated in the imaging cell by exposure.

[Item 17]

An imaging device, comprising:

a first imaging cell having a variable sensitivity; and a first sensitivity control line electrically connected to the first imaging cell, wherein the first imaging cell comprises a photoelectron conversion area that generates a signal charge by incidence of light, and a signal detection circuit that detects the signal charge, and during an exposure period from a reset of the first imaging cell until a readout of the signal charge accumulated in the first imaging cell by exposure, the first sensitivity control line supplies to the first imaging cell a first sensitivity control signal having a waveform expressed by a first function that takes only positive values by adding a first constant to one basis from among bases of a system of functions constituting an orthogonal system.

According to the configuration of Item 17, information corresponding to a specific component may be extracted from among the variation over time in the brightness of a subject.

[Item 18]

The imaging device according to Item 17, wherein the signal detection circuit includes an amplifier connected to the first sensitivity control line, and a gain of the amplifier during the exposure period indicates a variation expressed by the first function.

According to the configuration of Item 18, it is possible to use the first sensitivity control signal to impart modulation to the first sensitivity of the first imaging cell.

[Item 19]

The imaging device according to Item 17, wherein the signal detection circuit includes a signal detection transistor, a charge accumulation region connected to an input of the signal detection transistor, a charge-draining region, and a toggle circuit connected to the first sensitivity control line, and the toggle circuit, on a basis of the first sensitivity control signal, connects the photoelectron conversion area to the charge accumulation region during a part of the exposure period, and connects the photoelectron conversion area to the charge-draining region during a remaining part of the exposure period.

According to the configuration of Item 19, it is possible to use the first sensitivity control signal to impart modulation to the sensitivity of the first imaging cell.

[Item 20]

The imaging device according to Item 17, wherein the photoelectron conversion area includes an avalanche diode including an electrode connected to the first sensitivity control line.

According to the configuration of Item 20, it is possible to use the first sensitivity control signal to impart modulation to the sensitivity of the first imaging cell.

[Item 21]

The imaging device according to any of Items 17 to 19, wherein the photoelectron conversion area includes a first electrode, a translucent second electrode connected to the first sensitivity control line, and a photoelectric conversion layer disposed between the first electrode and the second electrode.

According to the configuration of Item 21, the sensitivity may be modulated comparatively easily by the first sensitivity control signal.

[Item 22]

The imaging device according to any of Items 17 to 21, further comprising a plurality of imaging cells including the first imaging cell, each of the plurality of imaging cells having a variable sensitivity.

According to the configuration of Item 22, a two-dimensional or a one-dimensional image related to a specific component may be acquired.

[Item 23]

The imaging device according to Item 22, wherein
the first sensitivity control line supplies the first sensitivity control signal in common to the plurality of imaging cells.

According to the configuration of Item 23, it is possible to impart a common modulation to the sensitivity of multiple imaging cells while also synchronizing the imaging cells.

[Item 24]

The imaging device according to any of Item 22 or 23, further comprising a plurality of sensitivity control lines including the first sensitivity control line, wherein
each of the plurality of sensitivity control lines is electrically connected to one or more of the plurality of imaging cells,
each of the plurality of imaging cells comprises a photoelectron conversion area that generates a signal charge by incidence of light, and a signal detection circuit that detects the signal charge, and
each of the plurality of imaging cells receives a sensitivity control signal from one of the plurality of sensitivity control lines during an exposure period from a reset of the imaging cell until a readout of the signal charge accumulated in the imaging cell by exposure.

[Item 25]

A photodetection method, comprising:
(a) pointing an imaging face of an imaging device including one or more imaging cells at a subject whose brightness varies over time; and
(b) executing, after a reset of the one or more imaging cells, an exposure while varying a first sensitivity in at least a subset of the one or more imaging cells, wherein
in (b), a waveform indicating the variation of the first sensitivity is a waveform expressed by a first function that takes only positive values by adding a first constant to one basis from among bases of a system of functions constituting an orthogonal system.

According to the configuration of Item 25, information corresponding to a specific component may be extracted from among the variation over time in the brightness of a subject.

[Item 26]

The photodetection method according to Item 25, wherein
(a) includes
(a1) irradiating the subject with light whose intensity varies over time.

According to the configuration of Item 26, a desired brightness variation may be produced in the subject.

[Item 27]

The photodetection method according to Item 26, wherein
(b) includes
(b1) synchronizing the variation of the first sensitivity with the variation over time in the intensity of the light.

According to the configuration of Item 27, an image with comparatively high lightness may be acquired.

[Item 28]

The photodetection method according to any of Items 25 to 27, further comprising:
(c) executing, after a reset of the one or more imaging cells, an exposure while varying a second sensitivity in another subset of the one or more imaging cells, wherein
the first function is a periodic function, and
a phase and/or a period of a waveform indicating the variation of the second sensitivity are different from a phase and/or a period of the waveform indicating the variation of the first sensitivity.

According to the configuration of Item 28, an image signal for cancelling out excess offset in lightness may be acquired.

[Item 29]

The photodetection method according to any of Items 25 to 27, further comprising:
(c) executing, after a reset of the one or more imaging cells, an exposure locked to a second sensitivity in another subset of the one or more imaging cells.

According to the configuration of Item 29, an image signal for cancelling out excess offset in lightness may be acquired.

[Item 30]

The photodetection method according to Item 28 or 29, wherein
(c) is executed after (b).

[Item 31]

The photodetection method according to Item 28 or 29, wherein
(b) and (c) are executed at the same time.

According to the configuration of Item 31, an image signal for cancelling out excess offset in lightness may be acquired more rapidly.

[Item 32]

The photodetection method according to any of Items 28 to 31, further comprising:
(d) forming an image on a basis of a difference between an image signal acquired in (b) and an image signal acquired in (c).

According to the configuration of Item 32, an image may be formed in which excess offset in lightness is cancelled out.

[Item 33]

A photodetection method, comprising:
(a) pointing an imaging face of an imaging device including one or more imaging cells at a subject whose brightness varies over time; and
(b) executing, after a reset of the one or more imaging cells, an exposure while varying a first sensitivity in at least a subset of the one or more imaging cells, wherein
in (b), a waveform indicating the variation of the first sensitivity has a pulse shape.

According to the configuration of Item 33, it is possible to vary the sensitivity of the one or more imaging cells in a pulsed manner.

[Item 34]

The photodetection method according to Item 33, wherein
(a) includes
(a1) irradiating the subject with light whose intensity varies in a pulsed manner.

[Item 35]

The photodetection method according to Item 34, wherein
(b) includes
(b1) synchronizing the variation of the first sensitivity with the variation over time in the intensity of the light.

According to the configuration of Item 35, it is possible to execute imaging that increases the sensitivity at a timing delayed by a specific time from the emission of light from an illuminator.

[Item 36]

An imaging device, comprising:
one or more first imaging cells, each including a first photoelectron conversion area;
a first signal line;
one or more second imaging cells, each including a second photoelectron conversion area; and
a second signal line, wherein
the first photoelectron conversion area includes
a first electrode,
a translucent second electrode electrically connected to the first signal line, and
a first photoelectric conversion layer disposed between the first electrode and the second electrode,
the second photoelectron conversion area includes
a third electrode,
a translucent fourth electrode electrically connected to the second signal line, and
a second photoelectric conversion layer disposed between the third electrode and the fourth electrode,
during a first exposure period from a reset of the one or more first imaging cells until a readout of the signal charge accumulated in the one or more first imaging cells by exposure, the first signal line supplies to the one or more first imaging cells a first signal having a waveform expressed by a function that takes only positive values by adding a constant to one basis from among bases of a system of functions constituting an orthogonal system, and
during a second exposure period from a reset of the one or more second imaging cells until a readout of the signal charge accumulated in the one or more second imaging cells by exposure, the second signal line supplies to the one or more second imaging cells a second signal having a waveform indicating a different variation over time than the first signal.

According to the configuration of Item 36, sensitivity controls signals having different waveforms may be applied independently to the first imaging cells and the second imaging cells.

[Item 37]

The imaging device according to Item 36, further comprising:
a first signal source that supplies the first signal to the first signal line; and
a second signal source that supplies the second signal to the second signal line.

[Item 38]

The imaging device according to Item 36, further comprising:
a signal source connected to the first signal line; and
a phase shifter connected between the second signal line and the signal source.

According to the configuration of Item 38, the number of signal sources may be reduced.

[Item 39]

The imaging device according to any of Items 36 to 38, wherein
the first signal exhibits periodic variation during the first exposure period,
the second signal exhibits periodic variation during the second exposure period, and
a period and/or a phase of the waveform of the first signal are different from a period and/or a phase of the waveform of the second signal.

According to the configuration of Item 39, an image signal for offset cancellation may be obtained.

[Item 40]

The imaging device according to Item 37, wherein
the second signal source is a direct-current signal source.

According to the configuration of Item 40, an image signal for offset cancellation may be obtained.

[Item 41]

The imaging device according to any of Items 36 to 40, wherein
the first photoelectric conversion layer and the second photoelectric conversion layer are a single continuous layer.

According to the configuration of Item 41, increased complexity of the manufacturing process may be avoided.

[Item 42]

The imaging device according to any of Items 36 to 41, wherein
the one or more first imaging cells are a plurality of first imaging cells, and
the one or more second imaging cells are a plurality of second imaging cells.

According to the configuration of Item 42, a two-dimensional or a one-dimensional image related to a specific component may be acquired.

[Item 43]

The imaging device according to Item 42, wherein
the first signal line supplies the first signal in common to the plurality of first imaging cells, and
the second signal line supplies the second signal in common to the plurality of second imaging cells.

According to the configuration of Item 42, it is possible to impart a common modulation to each of the sensitivity of the plurality of first imaging cells and the sensitivity of the plurality of second imaging cells, while also respectively synchronizing the plurality of first imaging cells with each other and the plurality of second imaging cells with each other.

Hereinafter, exemplary embodiments of the present disclosure will be described in detail and with reference to the drawings. Note that the exemplary embodiments described hereinafter all illustrate general or specific examples. Features such as numerical values, shapes, materials, structural elements, arrangements and connection states of structural elements, steps, and the ordering of steps indicated in the following exemplary embodiments are merely examples, and are not intended to limit the present disclosure. The various modes described in this specification may also be combined with each other in non-contradictory ways. In addition, among the structural elements in the following exemplary embodiments, structural elements that are not described in the independent claim indicating the broadest concept are described as arbitrary or optional structural elements. In the following description, structural elements having substantially the same functions will be denoted by shared reference signs, and the description of such structural elements may be reduced or omitted.

First Embodiment

FIG. 1 schematically illustrates an exemplary configuration of an imaging device according to a first embodiment of the present disclosure. The imaging device 100 illustrated in FIG. 1 includes one or more imaging cells 10. Herein, a configuration in which the imaging device 100 includes multiple imaging cells 10 is illustrated as an example. The number of imaging cells 10 is not limited to a specific number. For example, if there is one imaging cell 10, the imaging device 100 may be used as a photodetection element, whereas if there are multiple imaging cells 10, and these imaging cells 10 are arrayed one-dimensionally or two-dimensionally, the imaging device 100 may be used as an image sensor. As discussed later, each imaging cell 10 has a configuration with variable sensitivity.

In this example, the imaging cells 10 are disposed in a matrix of m rows and n columns (where m and n are integers equal to or greater than 2), thereby forming an imaging region. The imaging cells 10 are arrayed two-dimensionally on a semiconductor substrate, for example. Herein, the center of each imaging cell 10 is positioned on a lattice point of a square lattice. Obviously, the arrangement of the imaging cells 10 is not limited to the example illustrated in the drawings, and the multiple imaging cells 10 may also be arranged so that the respective centers are positioned on the lattice points of a lattice such as a triangular lattice or a hexagonal lattice, for example.

The imaging device 100 includes a pixel array including the multiple imaging cells 10, and peripheral circuits for driving these imaging cells 10. In the configuration illustrated as an example in FIG. 1, the peripheral circuits of the imaging device 100 include a row scan circuit 90, a voltage supply circuit 92, a column circuit 94, a signal processing circuit 96, an output circuit 98, and a control circuit 99. The respective elements constituting the peripheral circuits may be disposed on the semiconductor substrate on which the pixel array PA is formed, or a portion thereof may be disposed on another substrate.

As illustrated schematically in FIG. 1, the voltage supply circuit 92 and the imaging cells 10 are electrically connected via a sensitivity control line 82. Note that in FIG. 1, a single sensitivity control line 82 is drawn. However, there may be two or more sensitivity control lines 82. For example, a number of sensitivity control lines 82 equal to the number of imaging cells 10 may be provided in correspondence with the imaging cells 10, or a single sensitivity control line 82 may be connected to and shared among all of the imaging cells 10.

The voltage supply circuit 92 is a signal generation circuit configured to be able to supply at least two voltage levels, and generates a sensitivity control signal having a desired waveform. A known signal source may be used as the voltage supply circuit 92. The voltage supply circuit 92 is not limited to a specific power source circuit, and may be a circuit that generates a certain voltage, or a circuit that converts a voltage supplied from another power source to a certain voltage. As illustrated schematically in FIG. 1, the operation of the voltage supply circuit 92 may be controlled by a control signal supplied from the control circuit 99.

During image capture, the voltage supply circuit 92 applies a sensitivity control signal having a certain waveform to the imaging cells 10 via the sensitivity control line 82. Both analog signals and digital signals may be used as the sensitivity control signal. On the basis of a sensitivity control signal supplied via the sensitivity control line 82, the sensitivity in the imaging cells 10 is controlled electrically. In a typical embodiment of the present disclosure, image capture is executed while varying the sensitivity for at least a subset of the imaging cells 10 in an exposure period, which is defined as the term from reset to signal charge readout. By executing image capture while modulating the sensitivity using a sensitivity control signal with a waveform having a relationship to a specific component in the variation over time in the brightness of the subject, information corresponding to the specific component may be extracted from among the variation over time in the brightness of the subject. For example, in the case of illuminating a subject with a first light whose intensity varies at a first frequency and a second light whose intensity varies at a second frequency, it is possible to obtain a subject picture corresponding to the state of being illuminated by only one of the lights. A specific example of the configuration of the imaging cells 10 and the basic principle of the extraction of a specific component by sensitivity modulation will be discussed later.

The row scan circuit 90 is connected to address control lines 84 and reset control lines 86 which are provided in correspondence the rows of the multiple imaging cells 10. Each address control line 84 is connected to a corresponding row of imaging cells 10. Each reset control line 86 is also connected to a corresponding row of imaging cells 10. The row scan circuit 90, by applying a certain voltage to the address control line 84, is able to select the imaging cells 10 in units of rows, and perform readout of the signal voltage. The row scan circuit 90 may also be called a vertical scan circuit. Also, the row scan circuit 90, by applying a certain voltage to the reset control line 86, is able to execute a reset operation on the selected imaging cells 10.

The column circuit 94 is connected to output signal lines 88 provided in correspondence with the columns of the multiple imaging cells 10. Imaging cells 10 belonging to the same column are connected in common to one corresponding output signal line 88 from among multiple output signal lines 88. The output signals from the imaging cells 10 selected in units of rows by the row scan circuit 90 are read out to the column circuit 94 via the output signal lines 88. The column circuit 94 conducts processing such as noise suppression signal processing as typified by correlated double sampling, and analog-to-digital conversion (AD conversion) on the output signals read out from the imaging cells 10.

The signal processing circuit 96 performs various processing on an image signal acquired from the imaging cells 10. As described in detail later, in a typical embodiment of the present disclosure, a first and a second image capture are executed while changing the waveform of the sensitivity control signal, and the difference between the image data acquired by these captures is computed. Additionally, in an embodiment of the present disclosure, the distance from the imaging face to the subject may be calculated on the basis of the difference between the image data in some cases. Such calculation processing may be executed by the signal processing circuit 96. The output of the signal processing circuit 96 is read out to equipment external to the imaging device 100 via the output circuit 98.

The control circuit 99 receives information such as command data and a clock provided by equipment external to the imaging device 100, for example, and controls the imaging device 100 overall. The control circuit 99 typically includes a timing generator, and supplies driving signals to components such as the row scan circuit 90 and the column circuit 94. Typically, the control circuit 99 supplies the voltage supply circuit 92 with a driving signal corresponding to the waveform of the sensitivity control signal to be generated, so that the waveform of the sensitivity control signal becomes a desired waveform. A control signal having a waveform corresponding to the waveform of the sensitivity control signal to be generated may also be given to the control circuit 99 or the voltage supply circuit 92 from external equipment. The above calculation processing, such as the computation of the distance from the imaging face to the subject, may be executed by the control circuit 99.

Figure 2:
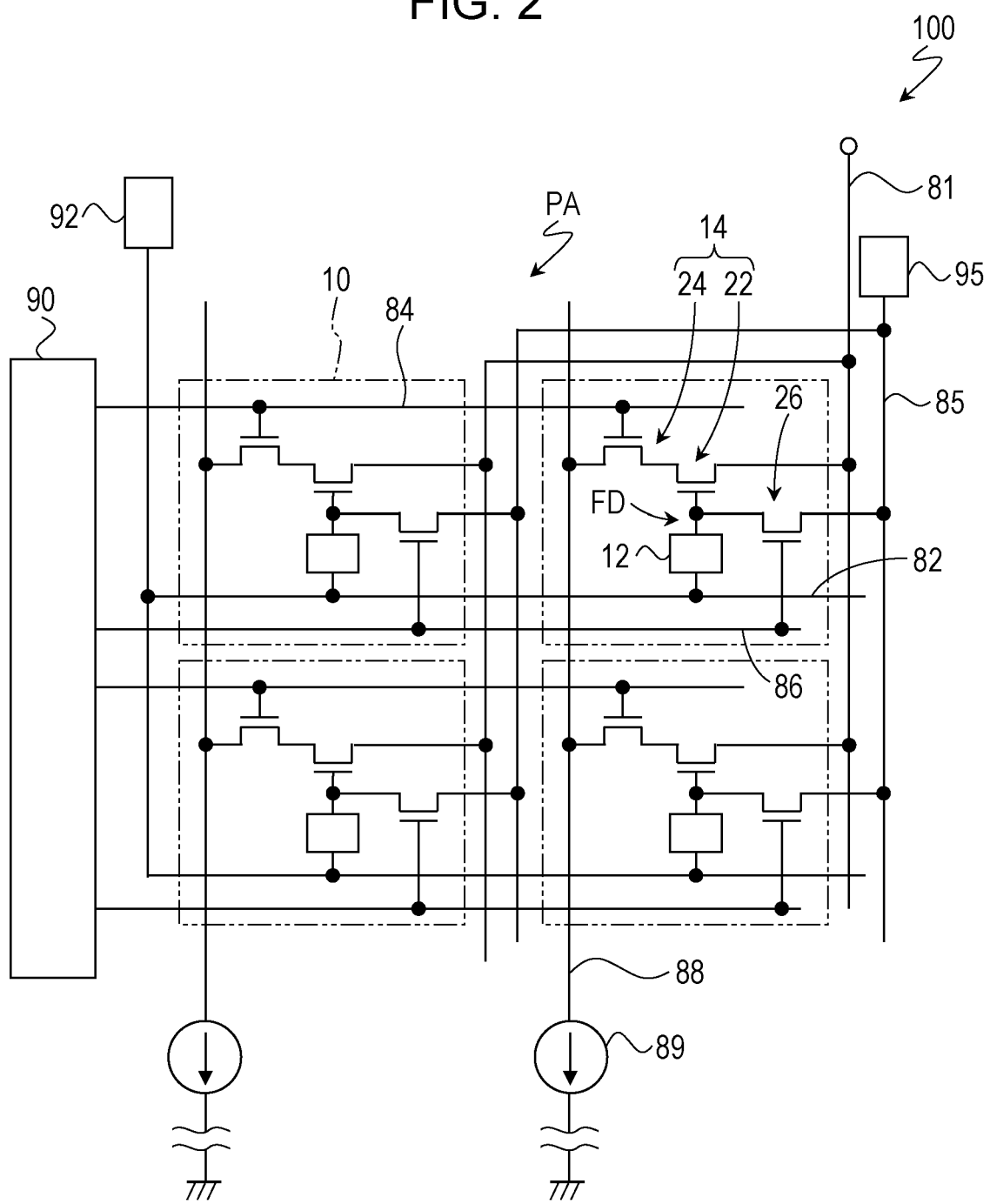
FIG. 2 is a schematic diagram illustrating an exemplary circuit configuration of an imaging cell.

FIG. 2 illustrates an exemplary circuit configuration of the imaging cells 10. To keep the drawing from becoming excessively complex, herein, four of the multiple imaging cells 10 disposed in a matrix array have been extracted for illustration. As illustrated schematically in FIG. 2, each imaging cell 10 basically includes a photoelectric conversion unit 12 and a signal detection circuit 14.

The photoelectric conversion unit 12 receives incident light and generates a signal charge corresponding to the illuminance. The polarity of the signal charge may be either positive or negative. Herein, a laminated imaging device is given as an example of the imaging device 100. In other words, herein, the photoelectric conversion unit 12 includes as part of itself a photoelectric conversion layer formed from an organic material, or an inorganic material such as amorphous silicon. The photoelectric conversion layer is disposed on top of an inter-layer insulating layer that covers a semiconductor substrate, for example. Obviously, it is also possible to use a photodiode as the photoelectric conversion unit 12.

As illustrated in the drawing, if a laminated structure is applied, the sensitivity control line 82 discussed earlier is electrically connected to the photoelectric conversion unit 12. In this example, the sensitivity control line 82 is connected in common to the photoelectron conversion areas 12 of the four imaging cells 10 illustrated in FIG. 2. Consequently, during the operation of the imaging device 100, a common sensitivity control signal is applied to these four imaging cells 10.

Each imaging cell 10 includes a signal detection circuit 14 that detects the signal charge generated by the photoelectric conversion unit 12. Herein, the signal detection circuit 14 includes a signal detection transistor 22 and an address transistor 24. Typically, the signal detection transistor 22 and the address transistor 24 are field-effect transistors (FETs) formed on a semiconductor substrate. Hereinafter, unless specifically noted otherwise, an example of using n-channel MOSFETs as the transistors will be described.

As illustrated in the drawing, the gate, that is, the input of the signal detection transistor 22, is electrically connected to the photoelectric conversion unit 12. The signal charge generated by the photoelectric conversion unit 12 is accumulated temporarily in a node between the photoelectric conversion unit 12 and the signal detection transistor 22. Hereinafter, the node between the photoelectric conversion unit 12 and the signal detection transistor 22 is designated the "charge accumulation node FD". The charge accumulation node FD constitutes part of the charge accumulation region that accumulates signal charge. The source of the signal detection transistor 22 is connected to the output signal line 88 via the address transistor 24. The address control line 84 is connected to the gate of the address transistor 24. The address transistor 24 is controlled on and off by the row scan circuit 90 via the address control line 84.

The output signal line 88 includes, on one end, a constant current source 89 made up of the column circuit 94 discussed earlier (see FIG. 1) and the like. The drain of the signal detection transistor 22 is connected to a power source line (source follower power source) 81, and a source follower circuit is formed by the signal detection transistor 22 and the constant current source 89. During operation of the imaging device 100, the signal detection transistor 22 receives the supply of a power source voltage VDD at the drain, and thereby amplifies and outputs the voltage applied to the gate, or in other words, the voltage of the charge accumulation node FD. The signal amplified by the signal detection transistor 22 is selectively read out as the signal voltage via the output signal line 88.

In the configuration illustrated as an example in FIG. 2, each of the imaging cells 10 includes a reset transistor 26, in which one of the source and drain is connected to a reset voltage line 85. A reset voltage source 95 is connected to the reset voltage line 85. During operation of the imaging device 100, the reset voltage source 95 applies a certain reset voltage Vr to the reset voltage line 85. It is sufficient for the reset voltage source 95 to have a configuration enabling the supply of a certain reset voltage Vr to the reset voltage line 85 during operation of the imaging device 100, and similarly to the voltage supply circuit 92 discussed earlier, the reset voltage source 95 is not limited to a specific power source circuit. It is also possible to use the power source voltage VDD of the signal detection circuit 14 as the reset voltage Vr. In this case, a voltage supply circuit that supplies the power source voltage to each imaging cell 10 (not illustrated in FIG. 1) and the reset voltage source 95 may be the same.

The other of the source and drain of the reset transistor 26 is connected to the charge accumulation node FD, while the reset control line 86 is connected to the gate of the reset transistor 26. In other words, in this example, the reset transistor 26 is controlled on and off by the row scan circuit 90. By switching on the reset transistor 26, a certain reset voltage Vr is applied to the charge accumulation node FD, and the electric potential of the charge accumulation node FD is reset. In other words, switching on the reset transistor 26 resets the imaging cell 10.

During imaging, first, switching on the reset transistor 26 resets the imaging cell 10. After the reset transistor 26 switches off, the accumulation of signal charge in the charge accumulation node FD is started. The photoelectric conversion unit 12 receives the incidence of light and generates a signal charge (exposure). The generated signal charge is accumulated in a charge accumulation region that includes the charge accumulation node FD as part of itself. Additionally, at a desired timing, the address transistor 24 is switched on, and an image signal corresponding to the amount of signal charge accumulated in the charge accumulation region is read out. In this specification, when focusing on an imaging cell, the term from the reset of the imaging cell until the readout of a signal, which is generated by exposure and which corresponds to the total amount of signal charge accumulated in the charge accumulation region, is designated the "exposure period". In the imaging device 100 having the circuit configuration illustrated as an example in FIG. 2, when focusing on an imaging cell 10, the exposure period of the imaging cell 10 corresponds to the term from the time point at which the reset transistor 26 of the imaging cell 10 is switched from on to off, until the time point at which the address transistor 24 is switched on. Note that the term of the accumulation of signal charge in the charge accumulation region is not required to occur over the entire exposure period. For example, an operation in which signal charge is accumulated in the charge accumulation region over a partial term within the exposure period may also be executed. In other words, in an embodiment of the present disclosure, the exposure period and the signal charge accumulation term are not necessarily the same.

(Exemplary Device Structure of Imaging Cell 10)

Figure 3:
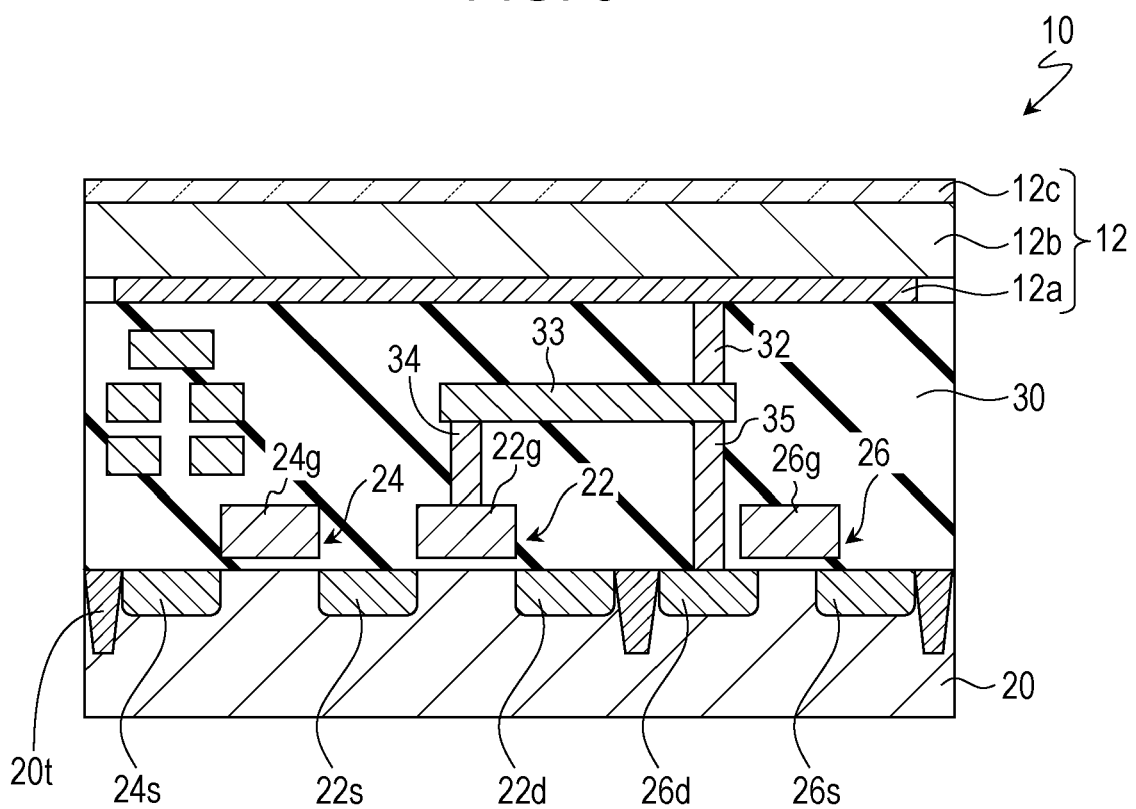
FIG. 3 is a cross-section diagram illustrating an exemplary device structure of an imaging cell.

FIG. 3 schematically illustrates an exemplary device structure of an imaging cell 10. In the configuration illustrated as an example in FIG. 3, the signal detection transistor 22, the address transistor 24, and the reset transistor 26 discussed above are formed on a semiconductor substrate 20. The semiconductor substrate 20 is not limited to being a substrate that is a semiconductor in entirety. The semiconductor substrate 20 may also be a substrate such as an insulating substrate provided with a semiconductor layer on the surface of the side on which the imaging region is formed. Herein, an example of using a p-type silicon (Si) substrate as the semiconductor substrate 20 is described.

The semiconductor substrate 20 includes impurity regions (herein, n-type regions) 24s, 22s, 22d, 26d, and 26s, as well as an isolation region 20t for electrically isolating imaging cells 10 from each other. Herein, the isolation region 20t is provided between the impurity region 22d and the impurity region 26d. The isolation region 20t is formed by conducting ion implantation of acceptors under certain implantation conditions, for example.

Typically, the impurity regions 24s, 22s, 22d, 26d, and 26s are diffusion layers formed inside the semiconductor substrate 20. As illustrated schematically in FIG. 3, the signal detection transistor 22 includes the impurity regions 22s and 22d, and a gate electrode 22g (typically a polysilicon electrode). The impurity regions 22s and 22d respectively function as the source region and the drain region of the signal detection transistor 22, for example. The channel region of the signal detection transistor 22 is formed between the impurity regions 22s and 22d.

Similarly, the address transistor 24 includes impurity regions 24s and 22s, and a gate electrode 24g (typically a polysilicon electrode) connected to the address control line 84 (see FIG. 2). In this example, the signal detection transistor 22 and the address transistor 24 are electrically connected to each other by sharing the impurity region 22s. The impurity region 24s functions as the source region of the address transistor 24, for example. The impurity region 24s has a connection to the output signal line 88 (see FIG. 2), which is not illustrated in FIG. 3.

The reset transistor 26 includes impurity regions 26d and 26s, and a gate electrode 26g (typically a polysilicon electrode) connected to the reset control line 86 (see FIG. 2). The impurity region 26s functions as the source region of the reset transistor 26, for example. The impurity region 26s has a connection to the reset voltage line 85 (see FIG. 2), which is not illustrated in FIG. 3.

On the semiconductor substrate 20, an inter-layer insulating layer 30 (typically a silicon dioxide layer) is disposed covering the signal detection transistor 22, the address transistor 24, and the reset transistor 26. In this example, the photoelectric conversion unit 12 is disposed on top of the inter-layer insulating layer 30. The photoelectric conversion unit 12 includes a pixel electrode 12a, a transparent electrode 12c, and a photoelectric conversion layer 12b disposed between the two. The pixel electrode 12a is provided for each imaging cell 10, and by being spatially separated from the pixel electrodes 12a of other adjacent imaging cells 10, is electrically separated from the pixel electrodes 12a of the other imaging cells 10. Meanwhile, the transparent electrode 12c and the photoelectric conversion layer 12b may be formed spanning multiple imaging cells 10.

Typically, the transparent electrode 12c is formed from a transparent conducting material. Typical examples of the material constituting the transparent electrode 12c are transparent conducting oxides (TCOs) such as ITO, IZO, AZO, FTO, $SnO_2$, $TiO_2$, and $ZnO_2$. The transparent electrode 12c is disposed on the side on which light is incident on the photoelectric conversion layer 12b. Consequently, light passing through the transparent electrode 12c is incident on the photoelectric conversion layer 12b. On top of the transparent electrode 12c, a protective film, color filter, or the like may be disposed. Note that the light detected by the imaging device 100 is not limited to light inside the wavelength range of visible light (for example, from 380 nm to 780 nm). The terms "transparent" and "translucent" in this specification mean that at least part of the light in the wavelength range to be detected is transmitted, and it is not necessary to transmit light over the entire wavelength range of visible light. In this specification, the entire electromagnetic spectrum, including infrared rays and ultraviolet rays, are designated "light" for the sake of convenience.

The transparent electrode 12c has a connection to the sensitivity control line 82 discussed earlier (see FIG. 2). By forming the transparent electrode 12c in the form of a continuous single electrode across multiple imaging cells 10, a sensitivity control signal having a desired waveform may be applied collectively to multiple imaging cells 10 via the sensitivity control line 82.

Typically, the photoelectric conversion layer 12b is formed from an organic material having semiconducting properties, and receives incident light to produce a pair of positive and negative charges (for example, a hole-electron pair). Typically, the photoelectric conversion layer 12b is formed spanning multiple imaging cells 10. In other words, the photoelectric conversion layer 12b may be a continuous single layer in multiple imaging cells 10. Obviously, the photoelectric conversion layer 12b may also be provided separately for individual imaging cells 10.

The pixel electrode 12a is formed from a material such as a metal like aluminum or copper, metal nitride, or polysilicon that has been given electrical conductivity by being doped with impurities. By controlling the potential of the transparent electrode 12c with respect to the potential of the pixel electrode 12a, one of either the positive or negative charge produced in the photoelectric conversion layer 12b by photoelectric conversion may be collected by the pixel electrode 12a. For example, in the case of using positive charge (typically holes) as the signal charge, it is sufficient to use a sensitivity control signal to raise the potential of the transparent electrode 12c higher than the pixel electrode 12a. Consequently, it is possible to selectively collect positive charge with the pixel electrode 12a. Hereinafter, a case of utilizing positive charge as the signal charge will be given as an example. Obviously, it is also possible to utilize negative charge (for example, electrons) as the signal charge.

As illustrated schematically in FIG. 3, the pixel electrode 12a is connected to the gate electrode 22g of the signal detection transistor 22 via a plug 32, a line 33, and a contact plug 34. In other words, the gate of the signal detection transistor 22 has an electrical connection to the pixel electrode 12a. The plug 32 and the line 33 are formed from a metal such as copper, for example. The plug 32, the line 33, and the contact plug 34 constitute at least part of the charge accumulation node FD (see FIG. 2) between the signal detection transistor 22 and the photoelectric conversion unit 12. Additionally, the pixel electrode 12a is also connected to the impurity region 26d via the plug 32, the line 33, and a contact plug 35. In the configuration illustrated as an example in FIG. 3, the gate electrode 22g of the signal detection transistor 22, the plug 32, the line 33, the contact plugs 34 and 35, as well as the impurity region 26d which is either the source region or the drain region of the reset transistor 26, function as at least part of the charge accumulation region that accumulates signal charge collected by the pixel electrode 12a.

The pixel array PA in the imaging device 100 may be fabricated using typical semiconductor fabrication processes. Particularly, in the case of using a silicon substrate as the semiconductor substrate 20, the imaging device 100 may be fabricated by utilizing various types of silicon semiconductor processes.

The adoption of a laminated structure simplifies application to a photoelectric conversion unit 12 having a structure in which the photoelectric conversion layer 12b is interposed between two electrodes (herein, the transparent electrode 12c and the pixel electrode 12a) (hereinafter, for the sake of explanation, this structure is called the "sandwich structure"). In an inorganic semiconductor photodiode using single-crystal silicon, positive and negative charges inside the photodiode which are generated by photoelectric conversion respectively move to the cathode and anode, even without applying a bias voltage between the anode and cathode. In contrast, in a photoelectron conversion area having a sandwich structure as illustrated in FIG. 3, in a state in which a bias voltage is not applied to the photoelectric conversion layer, the positive and negative charges generated by photoelectric conversion do not move much inside the photoelectric conversion layer. Consequently, a high proportion is lost due to recombination before the charges reach the anode or cathode. As the bias voltage increases, the proportion of charges reaching the anode or cathode, or in other words, the proportion of the number of signal charges per unit time accumulated in the charge accumulation region versus the number of photons absorbed per unit time in the photoelectric conversion layer (hereinafter also called the "external quantum efficiency") increases.

Figure 4:
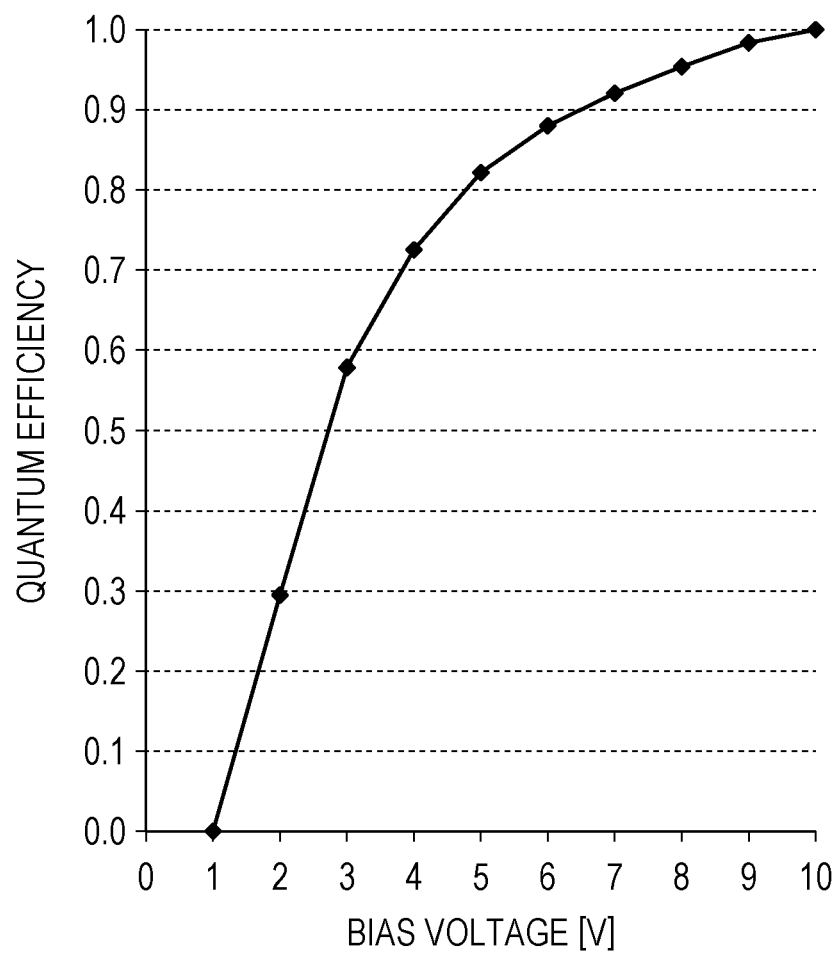
FIG. 4 is a graph illustrating an example of variation in external quantum efficiency with respect to variation in a bias voltage applied to a photoelectric conversion layer.

FIG. 4 illustrates an example of variation in external quantum efficiency with respect to variation in a bias voltage applied to the photoelectric conversion layer. In FIG. 4, the horizontal axis represents the magnitude of the bias voltage applied to the other electrode when taking as a reference the potential of one of the two electrodes sandwiching the photoelectric conversion layer. The vertical axis represents the external quantum efficiency normalized by taking a bias voltage of 10 V as a reference. FIG. 4 demonstrates that the external quantum efficiency in a photoelectron conversion area having a sandwich structure varies depending on the bias voltage applied. This means that the external quantum efficiency (which may also be called the sensitivity) of the photoelectron conversion area is electrically controllable by an applied voltage from outside the photoelectron conversion area.

In the example illustrated in FIG. 4, the quantum efficiency is a single-valued continuous function with respect to the bias voltage. Consequently, in the configurable range of the quantum efficiency, an inverse function exists, and a function of bias voltage that yields a desired quantum efficiency may be computed.

This function of quantum efficiency that yields a dependency on the bias voltage is a value determined by factors such as the structure and material of the photoelectron conversion area, and basically is determined when fabricating the photoelectron conversion area. For this reason, if the function of quantum efficiency that yields a dependency on the bias voltage is investigated in advance, a function of bias voltage that yields a desired quantum efficiency may be computed. If this function is known, it is possible to determine how the bias voltage should vary over time in the case of causing the quantum efficiency to vary over time in a desired way.

If the sensitivity control signal is the bias voltage itself, it is sufficient to treat the variation over time in the bias voltage computed according to the above procedure as the sensitivity control signal.

Additionally, even if the sensitivity control signal is not the bias voltage itself, if the value of the quantum efficiency with respect to the sensitivity control signal is similarly confirmed in advance, the desired variation over time in the quantum efficiency may be obtained.

In the example illustrated in FIG. 4, in the range of bias voltage from 1 V to 3 V, the quantum efficiency is a first-order function with respect to the bias voltage. For this reason, the inverse function is also a first-order function. In this case, if the range of the bias voltage is limited from 1 V to 3 V and varied in the form of a sine wave plus a constant, the quantum efficiency also becomes the form of a sine wave plus a constant. Thus, the sensitivity control signal becomes simple.

In the example illustrated in FIG. 4, when using bias voltages including the range past 3 V, the quantum efficiency is not a first-order function with respect to the bias voltage. For this reason, to make the quantum efficiency in the form of a sine wave plus a constant, the bias voltage must be varied in a non-linear form which is not a simple sine wave plus a constant. However, it is clear that the desired variation over time in the bias voltage may be computed according to the above procedure, and such control is possible.

In a photoelectron conversion area such as an inorganic semiconductor photodiode, the external quantum efficiency depends on the material and structure constituting the transducer, and thus varying the external quantum efficiency after the fabrication of the transducer is difficult. In contrast, according to a structure as described with reference to FIG. 3, it is easy to electrically connect one of either the anode or the cathode to the charge accumulation region to use for the accumulation of signal charge, while also applying a bias voltage to the other. For example, by connecting the sensitivity control line 82 to the transparent electrode 12c and applying the sensitivity control signal as a bias voltage to the transparent electrode 12c, the sensitivity of the imaging cell 10 may be electrically modulated by the sensitivity control signal. According to investigation by the inventor, the external quantum efficiency rapidly changes to follow changes in the bias voltage. For this reason, by using a sensitivity control signal having a waveform expressed by a specific function, the sensitivity of the imaging cell 10 may be varied over time comparatively easily in accordance with the waveform of the function.

In particular, by electrically connecting the transparent electrode 12c across multiple imaging cells 10, a common sensitivity control signal may be applied collectively to the transparent electrodes 12c of multiple imaging cells 10. In other words, a common modulation may be imparted to the sensitivity of the multiple imaging cells 10, while also synchronizing these multiple imaging cells 10. A configuration enabling synchronized modulation of the sensitivity in multiple imaging cells 10 in this way is particularly effective in devices such as an imaging device that includes multiple imaging cells 10, or alternatively, an imaging device having a configuration in which multiple imaging cells 10 are integrated with other circuits (for example, peripheral circuits). Note that, as discussed later, such modulation of sensitivity is also possible in a configuration using a photoelectron conversion area such as an inorganic semiconductor photodiode as the photoelectric conversion unit 12. Another example of a configuration enabling the proportion of the number of signal charges per unit time accumulated in the charge accumulation region versus the number of photons absorbed per unit time in the photoelectric conversion layer to be varied during the exposure period will be discussed later.

(Extraction of Specific Frequency Component)

Next, the principle of extracting a specific component from the illuminance variation during the exposure period will be described. To ease understanding, in the following, first, a method of extracting a component having an amplitude that varies at a specific frequency from the illuminance variation during the exposure period will be described as a specific example.

Figure 5:
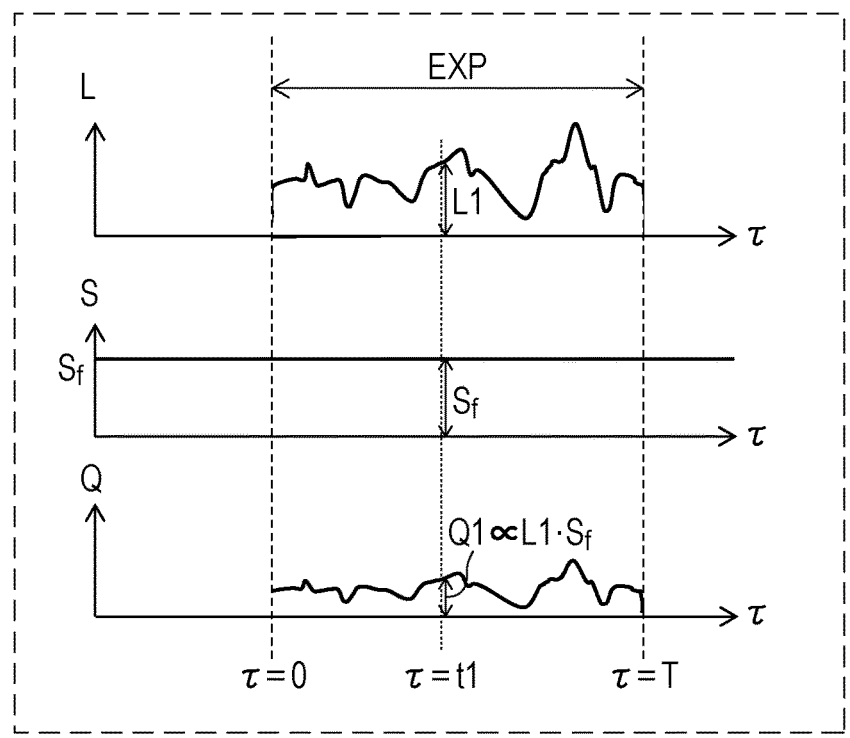
FIG. 5 is a schematic diagram for explaining a total amount of signal charge accumulated in a charge accumulation region during an exposure period in an image sensor of a comparative example.

FIG. 5 is a schematic diagram for explaining the total amount of signal charge accumulated in the charge accumulation region during the exposure period in an image sensor of a comparative example. In FIG. 5, the uppermost graph illustrates an example of variation over time in the illuminance L with respect to the photoelectron conversion area of an imaging cell, while the middle graph illustrates the sensitivity S in the imaging cell. The lowermost graph illustrates the variation over time in the signal charge amount Q accumulated in the charge accumulation region. The horizontal axis in each of the graphs illustrated in FIG. 5 represents the time $\tau$, while the double-headed arrow EXP in FIG. 5 schematically indicates the exposure period. In this example, the start and end of the exposure period correspond to the times $\tau=0$ and $\tau=T$, respectively.

First, consider the uppermost graph in FIG. 5. Generally, the illuminance L with respect to the imaging cell has a timewise variance in the exposure period. In other words, the number of photons incident on the photoelectron conversion area of the imaging cell during the exposure period is not constant over the exposure period, but generally varies over time. For this reason, the graph of $L(\tau)$ expressing the variation over time in the illuminance L with respect to the photoelectron conversion area generally has an irregular waveform, as illustrated schematically at the top of FIG. 5.

Consider an instant $\tau=t1$ inside the exposure period. At time t1, an amount of signal charge corresponding to the product of the number of photons incident on the photoelectron conversion area at time t1 and the sensitivity of the imaging cell at time t1 is accumulated in the charge accumulation region. As discussed above, in an imaging device of a comparative example, the sensitivity S during the exposure period is kept constant. In this example, since the sensitivity of the imaging cell is kept constant at a certain value $S_f$, at time t1, an amount of signal charge Q1 that is ultimately proportional to the product of the illuminance L1 at time t1 and the sensitivity $S_f$ is accumulated in the charge accumulation region. At this point, since the sensitivity S during the exposure period is constant, the signal charge amount $Q(\tau)$ accumulated in the charge accumulation region expresses variation corresponding to the variation over time in the illuminance $L(\tau)$ with respect to the imaging cell, as illustrated schematically at the bottom of FIG. 5.

After the end of the exposure period, the image signal read out from the imaging cell is a signal corresponding to the total amount of signal charge accumulated in the charge accumulation region over the entire exposure period. Typically, for the image signal, a voltage whose magnitude corresponds to the total amount of signal charge accumulated in the charge accumulation region is read out as the image signal. The total amount of the signal charge $Q_t$ accumulated in the charge accumulation region in the exposure period is expressed as the integral from time $\tau=0$ to $\tau=T$ of the product of the sensitivity $S(\tau)$ and the illuminance $L(\tau)$ at each time during the exposure period, as indicated in Formula 1 below.

$$Q_t = C\int_0^T L(\tau)S(\tau)d\tau \qquad (1)$$

In Formula 1, C is a proportional constant determined by factors such as the lens configuration in the imaging optical system, the aperture, the reflectance of the subject, and the magnification factor when imaging. The sensitivity $S(\tau)$ corresponds to the proportion of the number of signal charges per unit time accumulated in the charge accumulation region versus the number of photons incident per unit time on the photoelectron conversion area. Herein, since $S(\tau)=S_f$ holds constant, the total amount of signal charge $Q_t$ accumulated in the charge accumulation region in the exposure period is expressed as in Formula 2 below.

$$Q_t = CS_f\int_0^T L(\tau)d\tau \qquad (2)$$

Herein, assume that the illuminance $L(\tau)$ with respect to the photoelectron conversion area is expressible by a superposition of light whose amplitude oscillates at a frequency of $\omega_m$. In other words, assume that the illuminance $L(\tau)$ is expandable as in Formula 3 below.

$$L(\tau) = \sum_m L_m(\sin(\omega_m \tau + \theta_m) + 1) \qquad (3)$$

In Formula 3, $\omega_m = m(2\pi/T)$ (where m is an integer equal to or greater than 1), and $\theta_m$ represents the phase. Formula 3 is equivalent to decomposing the variation over time in the illuminance $L(\tau)$ into each frequency $\omega_m$. It should be noted that the expansion indicated in Formula 3 is not an expansion for each frequency of light incident on the photoelectron conversion area (which may also be referred to as wavelength), but instead an expansion for each frequency in the intensity of the light incident on the photoelectron conversion area. Note that in Formula 3, adding 1 to the sine function is performed so that each term in the sum does not become negative since $L(\tau) \geq 0$ at each instant.

By substituting the above Formula (2) into Formula (3), Formula 4 below is obtained.

$$Q_t = CS_f \sum_m L_m \cdot T \qquad (4)$$

Formula 4 indicates that as the exposure period becomes longer, the total amount of signal charge $Q_t$ accumulated in the charge accumulation region increases monotonically. As Formula 4 demonstrates, the total amount of signal charge $Q_t$ does not include information related to the variation over time in the illuminance L. In other words, the imaging of the comparative example is unable to obtain information about the variation over time during the exposure period.

In contrast, according to at least one embodiment of the present disclosure, as described in detail hereinafter, it is possible to extract a specific frequency component from among the variation over time in the illuminance L during the exposure period, for example.

Figure 6:
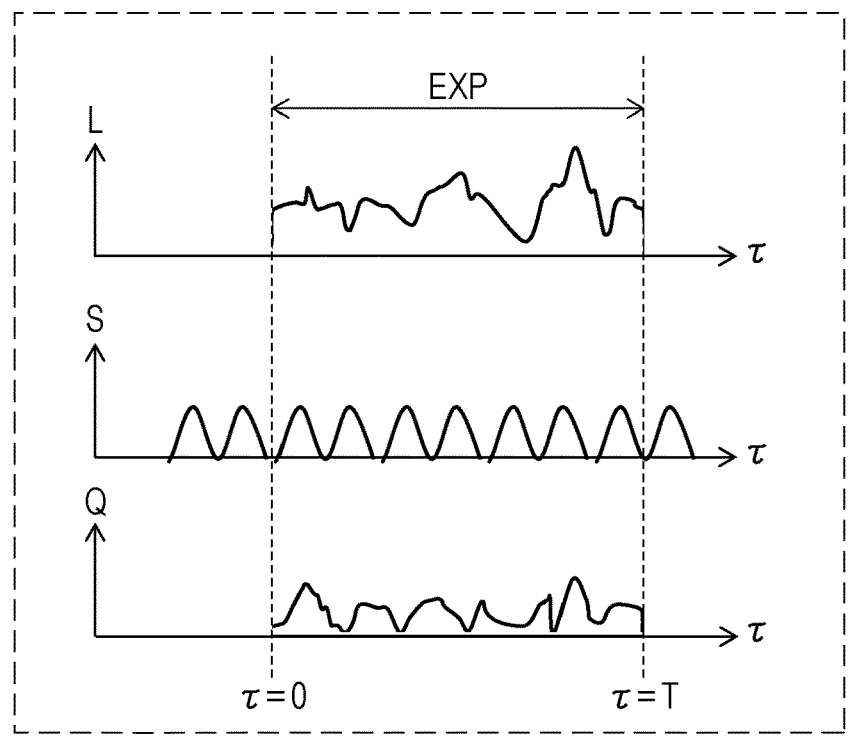
FIG. 6 is a schematic diagram for explaining an extraction of a specific frequency component from variation over time in illuminance L during an exposure period.

FIG. 6 is a schematic diagram for explaining the extraction of a specific frequency component from the variation over time in the illuminance L during the exposure period. In FIG. 6, the uppermost graph illustrates an example of variation over time in the amount of light incident on the photoelectric conversion unit 12, while the middle graph illustrates an example of sensitivity modulation in the imaging cell 10. The lowermost graph schematically illustrates the variation over time in the signal charge accumulated in the charge accumulation region of the imaging cell 10.

As discussed above, in the imaging device 100, it is possible to use a sensitivity control signal applied to the sensitivity control line 82 to control the sensitivity of each imaging cell 10 during the exposure period. Consequently, for example, by applying to the sensitivity control line 82 a periodically varying voltage as the sensitivity control signal, it is possible to vary the sensitivity of each imaging cell 10 on a desired period. For example, by applying to the sensitivity control line 82 a voltage signal that oscillates at a frequency $\omega_j$, it is possible to periodically vary the sensitivity S in the imaging cell 10, as indicated in Formula 5 below.

$$S(\tau) = S_0 \sin(\omega_s \tau + \theta) + S_g \quad (5)$$

In Formula 5, the first term $S_0$ represents the amplitude of the sensitivity, while the second term $S_g$ is a constant term added so the sensitivity does not become negative (to satisfy the condition $S(\tau) \geq 0$). By applying Formula 5 and Formula 3 above to Formula 1, the following Formula 6 is obtained as a formula expressing the total amount of signal charge $Q_t$ accumulated in the charge accumulation region in the exposure period.

$$Q_t = \qquad (6)$$
$$C\int_0^T \sum_m \Big[ -\frac{1}{2} S_0 L_m \cos\theta_m \cos\theta (\cos(\omega_m + \omega_s)\tau - \cos(\omega_m - \omega_s)\tau) + \frac{1}{2}$$
$$S_0 L_m \cos\theta \sin\theta_m (\sin(\omega_s + \omega_m)\tau + \sin(\omega_s - \omega_m)\tau) +$$
$$\frac{1}{2} S_0 L_m \sin\theta \cos\theta_m (\sin(\omega_m + \omega_s)\tau + \sin(\omega_m - \omega_s)\tau) +$$
$$\frac{1}{2} S_0 L_m \sin\theta \sin\theta_m (\cos(\omega_m + \omega_s)\tau + \cos(\omega_m - \omega_s)\tau) +$$
$$L_m S_g \cos\theta_m \sin\omega_m \tau + L_m S_g \sin\theta_m \cos\omega_m \tau +$$
$$L_m S_0 \cos\theta \sin\omega_s \tau + L_m S_0 \sin\theta \cos\omega_s \tau + L_m S_g \Big] d\tau$$

In Formula 6, regarding each term proportional to $\cos(\omega_m + \omega_s)\tau$, $\sin(\omega_m + \omega_s)\tau$, $\cos\omega_m\tau$, $\sin\omega_m\tau$, $\cos\omega_s\tau$, and $\sin\omega_s\tau$, even if the integral is taken, the result is a sine function or a cosine function, and even if T (that is, the length of the exposure period) increases, the result only oscillates in a fixed range, and does not increase. This applies similarly to terms in which $\omega_m \neq \omega_s$ from among the terms proportional to $\cos(\omega_m - \omega_s)$ and the terms proportional to $\sin(\omega_m - \omega_s)$, and the result simply oscillates in a fixed range even if the exposure period is increased. In contrast, among the terms proportional to $\cos(\omega_m - \omega_s)$, the integral value for $\tau$ of the terms in which $\omega_m = \omega_s$ (that is, m=s) and the terms proportional to $L_m S_g$ increase monotonically with respect to increases in the exposure period. Consequently, if the exposure period is sufficiently long, the effects of the terms proportional to T become dominant, and ultimately, the following Formula 7 is obtained as a formula expressing the total amount of signal charge $Q_t$.

$$Q_t \sim \frac{CL_s S_0}{2} \cos(\theta_s - \theta) \cdot T + CS_g \sum_m L_m \cdot T \quad (7)$$

As illustrated in Formula 7, the first term in the expression of $Q_t$ includes an amplitude $L_s$ corresponding to the frequency $\omega_s$. In other words, from among the components constituting $L(\tau)$ indicating the variation in the illuminance during the exposure period, information about the component having an amplitude that varies at a specific frequency (herein, $\omega_s$) is obtained. In other words, by periodically varying the sensitivity S of the imaging cell 10 at a specific frequency, it is possible to accumulate in the charge accumulation region an amount of signal charge corresponding to the specific frequency among the variations in the brightness of the subject.

(Offset Cancellation)

The second term in Formula 7 indicates that an offset is produced as a result of the illuminance L and the sensitivity S not taking a negative value. This offset may be cancelled by subtracting the image signal corresponding to the signal charge amount indicated in the second term from the image signal corresponding to the signal charge amount indicated in Formula 7.

For example, a first shot may be taken while varying the sensitivity S during the exposure period, a second shot is taken by changing the phase of the sensitivity S to be different from the first shot, and the difference between the image signal obtained by the first shot and the image signal obtained by the second shot may be acquired. As Formula 7 demonstrates, in this example, the signal charge amount $Q_t$ takes a maximum value $Q_{tM}$ when the phase $\theta_s$ of the sth amplitude component of the illuminance $L(\tau)$ is equal to the phase $\theta$ of the sensitivity $S(\tau)$, and takes a minimum value $Q_{tm}$ when the difference between the phases $\theta_s$ and $\theta$ is $\pi$ (or $-\pi$). The maximum value $Q_{tM}$ and the minimum value $Q_{tm}$ are expressed by the following Formulas 8 and 9, respectively.

$$Q_{tM} \sim \frac{CL_s S_0}{2} T + CS_g \sum_m L_m \cdot T \quad (8)$$

$$Q_{tm} \sim -\frac{CL_s S_0}{2} T + CS_g \sum_m L_m \cdot T \quad (9)$$

By computing the difference between the maximum value $Q_{tM}$ and the minimum value $Q_{tm}$, the offset term $CS_g \Sigma L_m \cdot T$ may be cancelled out. Note that in the cancellation of the offset term, it is not required to use the maximum value $Q_{tM}$ and the minimum value $Q_{tm}$, and if sensitivities $S(\tau)$ with different phases are used, the offset term may be cancelled out in a similar manner.

FIGS. 7 to 10 illustrate examples of images obtained by imaging a subject that includes periodic variations in brightness while periodically varying the sensitivity of the imaging cells 10. Herein, a periodic variation in the brightness of the subject is obtained by illuminating the subject with light emitted from an LED whose driving voltage is made to vary according to a sine function, and the sensitivity of the imaging cells 10 is made to vary on a period of 3 kHz by causing the bias voltage applied to the transparent electrode 12c (that is, the sensitivity control signal) vary according to a sine function on a period of 3 kHz. In all cases, the exposure period for each shot is taken to be approximately 20 milliseconds (ms).

Figure 7:
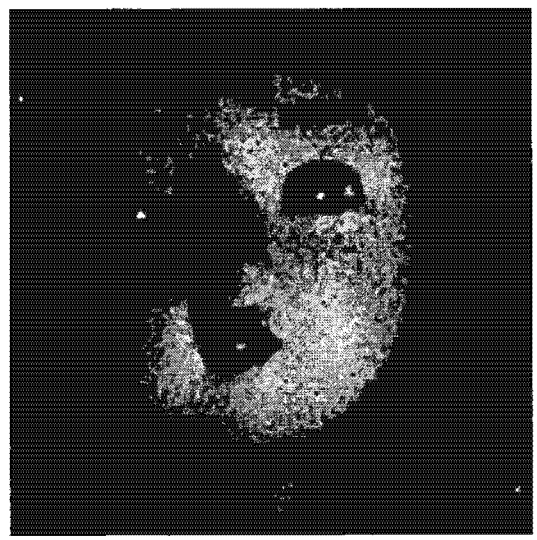
FIG. 7 is a diagram illustrating an example of an image obtained when (1) the period of variation in the brightness of a subject matches the period of variation in the sensitivity of imaging cells, and in addition, (2) the phase of the periodic variation in the brightness of the subject is aligned with the phase of the periodic variation in the sensitivity of the imaging cells.
Figure 8:
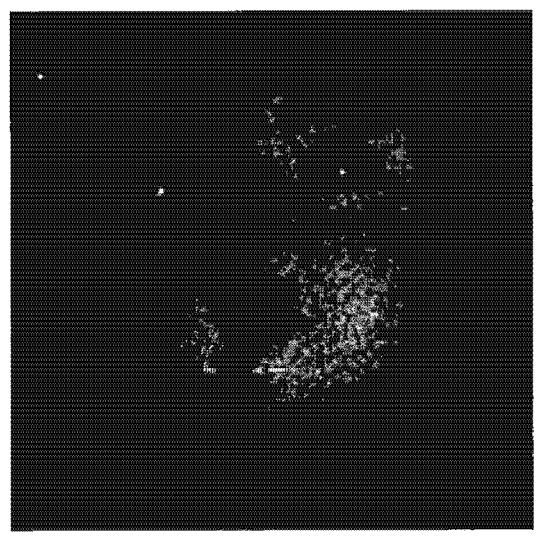
FIG. 8 is a diagram illustrating an example of an image obtained when (1) the period of variation in the brightness of a subject matches the period of variation in the sensitivity of imaging cells, and in addition, (2) the phase of the periodic variation in the brightness of the subject is misaligned with the phase of the periodic variation in the sensitivity of the imaging cells by a half cycle.

The images illustrated in FIGS. 7 and 8 are images when the driving voltage supplied to the LED is varied on a period of 3 kHz. In other words, the images are obtained by imaging a subject whose brightness varies on a period of 3 kHz, using imaging cells 10 whose sensitivity varies on a period of 3 kHz. FIG. 7 illustrates an image when the phase of the periodic variation in the driving voltage of the LED is aligned with the phase of the periodic variation in the bias voltage applied to the transparent electrode 12c. FIG. 7 demonstrates that when the phase of the periodic variation in the illumination from the LED, or in other words the phase of the periodic variation in the brightness of the subject, is aligned with the phase of the periodic variation in the sensitivity of the imaging cells 10, a clear image is obtained.

FIG. 8 illustrates an image when the phase of the periodic variation in the driving voltage of the LED is given a difference of a half cycle from the phase of the periodic variation in the bias voltage applied to the transparent electrode. As illustrated in FIG. 8, when a phase difference of $\pi$ exists between the periodic variation in the driving voltage of the LED and the periodic variation in the bias voltage applied to the transparent electrode 12c, an image of lower lightness overall is obtained.

In this way, when the period of illumination by the LED, or in other words the period of variation in the brightness of the subject, matches the period of variation in the sensitivity of the imaging cells 10, a clear change appears in the lightness of the obtained image, depending on the phase difference between the periodic variation of the brightness of the subject and the periodic variation in the sensitivity of the imaging cells 10. Ideally, when the phase difference is $\pi$, the lightness of the image should become 0. However, as FIG. 8 demonstrates, even if the phase difference is $\pi$, a picture of the subject, although indistinct, may be confirmed. This is the effect of the offset discussed earlier.

This offset is also included in the image obtained when the phase of the periodic variation in the driving voltage of the LED is aligned with the phase of the periodic variation in the bias voltage applied to the transparent electrode 12c (see FIG. 7). Consequently, if the image signal corresponding to the image illustrated in FIG. 8 is subtracted from the image signal corresponding to the image illustrated in FIG. 7, this offset may be cancelled out. In other words, the excess offset in the lightness may be cancelled out by the following procedure, for example.

First, the imaging face of the imaging device 100 is pointed at the subject. In other words, the surface on the transparent electrode 12c side of the photoelectric conversion layer 12b of the imaging cells 10 is pointed at the subject. After resetting the imaging cells 10, in the exposure period, a first shot is executed while varying the sensitivity of the imaging cells 10 by applying, to the imaging cells 10 via the sensitivity control line 82, a sensitivity control signal having a waveform expressed by a function that takes only positive values, and a first image signal is acquired thereby. The function expressing the waveform of the sensitivity control signal may be a periodic function, for example. In this case, the sensitivity of the imaging cells 10 varies periodically. Note that the reset of the imaging cells 10 may also be executed before the imaging face of the imaging device 100 is pointed at the subject.

Additionally, a second shot is executed while varying the sensitivity of the imaging cells 10 by applying, to the imaging cells 10 via the sensitivity control line 82, a sensitivity control signal having a different waveform from the waveform in the first shot, and a second image signal is acquired. The function expressing the waveform of the sensitivity control signal used in the second shot may be, for example, a timewise shift of the function expressing the waveform of the sensitivity control signal used in the first shot. If the function expressing the waveform of the sensitivity control signal used in the first shot is a periodic function, the function expressing the waveform of the sensitivity control signal used in the second shot is a function obtained by altering the phase of the function expressing the waveform of the sensitivity control signal used in the first shot. As discussed later, the phase difference between these functions is not limited to $\pi$.

By computing the difference between the first image signal and the second image signal, and forming an image on the basis of this difference, an image is obtained in which the excess offset in lightness has been cancelled out. The second shot is executed after the first shot, for example. In other words, after the first shot, the imaging cells 10 may be reset again, and after that, the second shot may be executed. As discussed later, the first shot and the second shot may also be executed at the same time.

Figure 11:
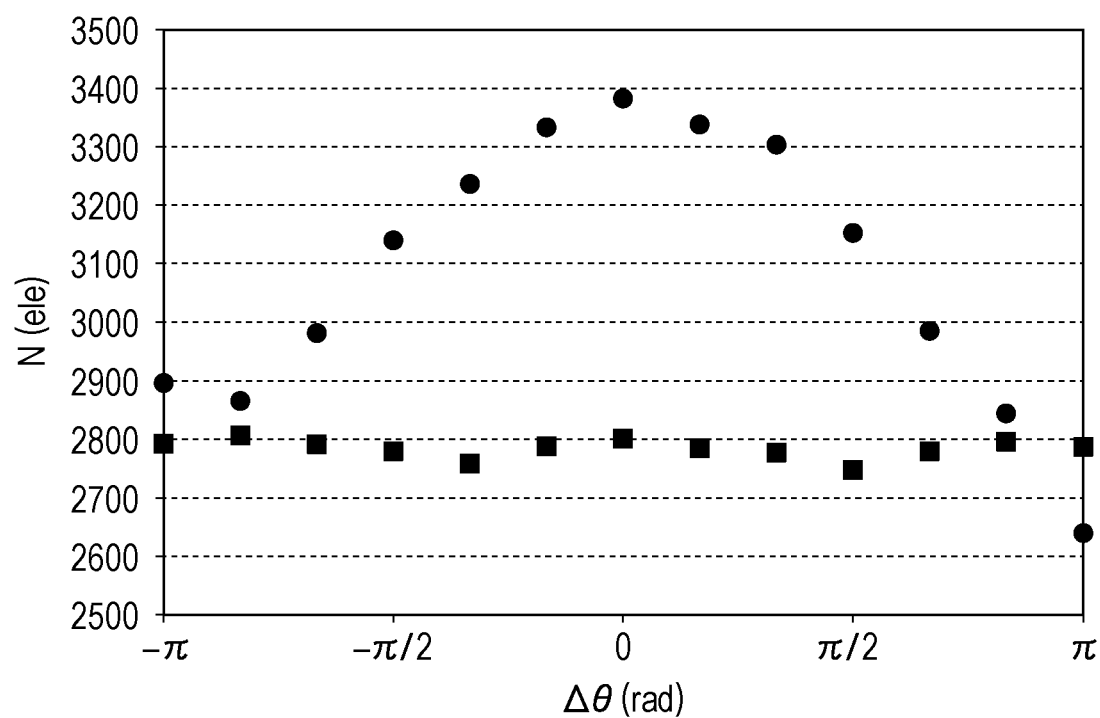
FIG. 11 is a graph illustrating an example of a relationship between a phase difference Δθ between the periodic variation in the brightness of a subject and the periodic variation in the sensitivity of an imaging cell, and an average charge count N accumulated in a charge accumulation region.

The description will refer now to FIG. 11. FIG. 11 illustrates an example of a relationship between the phase difference $\Delta\theta$ between the periodic variation in the brightness of the subject and the periodic variation in the sensitivity of the imaging cell 10, and an average charge count N accumulated in the charge accumulation region. In FIG. 11, the black circle plots indicate the measurement results when the period of variation in the brightness of the subject matches the period of variation in the sensitivity of the imaging cell 10, and corresponds to the shots described with reference to FIGS. 7 and 8. The example described with reference to FIG. 7 is an image when the phase of the periodic variation in the driving voltage of the LED is aligned with the phase of the periodic variation in the bias voltage applied to the transparent electrode 12c, and thus corresponds to the plot where $\Delta\theta=0$. Meanwhile, the example described with reference to FIG. 8 is an image when a difference of a half cycle is imposed between the phase of the periodic variation in the driving voltage of the LED and the phase of the periodic variation in the bias voltage applied to the transparent electrode, and thus corresponds to the plot where $\Delta\theta=-\pi$ or $\alpha\theta=\pi$.

FIG. 11 demonstrates that when the period of the variation in the brightness of the subject matches the period of the variation in the sensitivity of the imaging cell 10, the average charge count N exhibits a strong dependency with respect to the phase difference $\Delta\theta$. At this point, the level of the image signal is always higher than a certain level corresponding to the offset, and in this example, the highest signal level is obtained when $\Delta\theta=0$. The number of shots to take with an altered phase difference $\Delta\theta$ is not limited to two, and three or more shots may also be taken. For example, three or more shots with an altered phase difference M may be taken, the phase difference $\Delta\theta_M$ at which the average charge count N becomes a maximum and the phase difference $\Delta\theta_m$ at which the average charge count N becomes a minimum may be computed by regression analysis or the like, and an image with the offset cancelled out may be formed on the basis of image signals corresponding to the phase differences $\Delta\theta_M$ and $\Delta\theta_m$.

From the perspective of obtaining an image with high lightness, it is beneficial to synchronize the variation in the sensitivity of the first shot with the period of the variation in the brightness of the subject. However, the phase of the periodic variation in the brightness of the subject and the phase of the periodic variation in the sensitivity of the imaging cells 10 are not necessarily required to be aligned. If a signal level significantly higher than the level corresponding to the offset is obtained, it is possible to form an image on the basis of that signal level. In other words, if the variation in the sensitivity of the first shot is synchronized with the period of the variation in the brightness of the subject, the second shot may be omitted.

Figure 12:
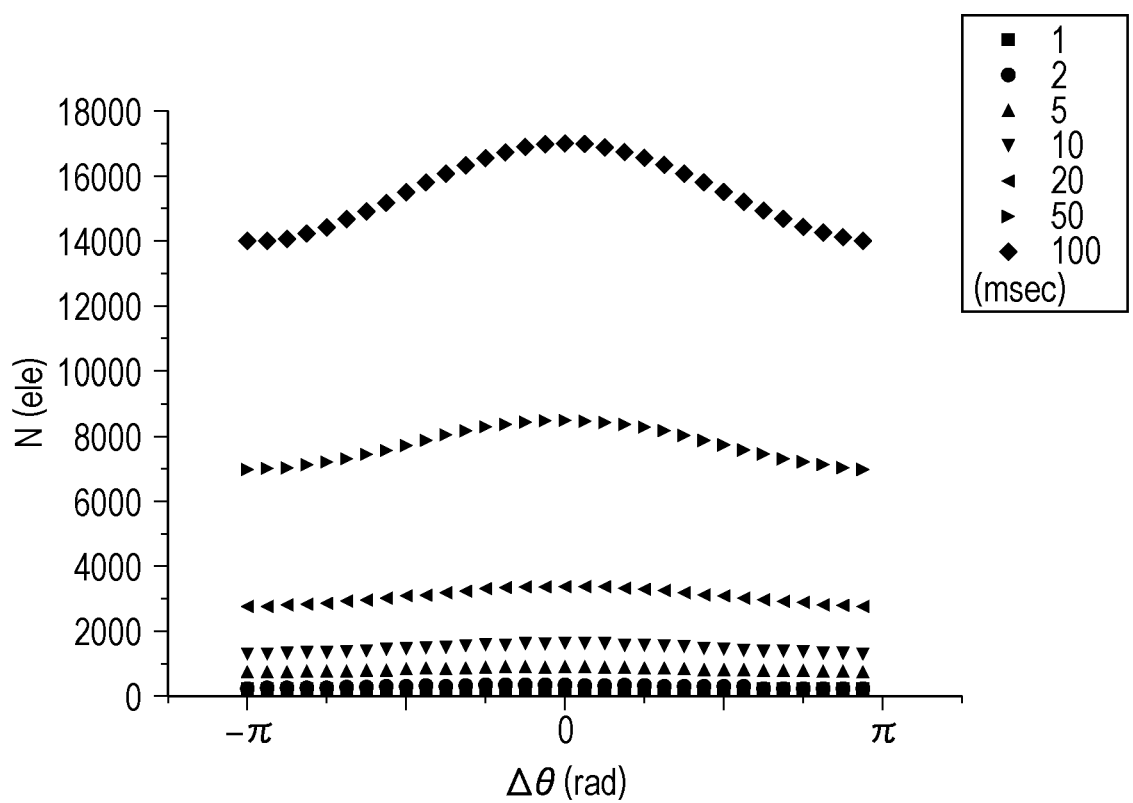
FIG. 12 is a graph illustrating a typical example of a relationship between a dependence of an average charge count N with respect to a phase difference Δθ, and the length of an exposure period T.

FIG. 12 illustrates a typical example of the relationship between the dependence of the average charge count N with respect to the phase difference M, and the length of the exposure period T. The plots in FIG. 12 indicate the relationship between the average charge count N and the phase difference Δθ for an exposure period T of 1 ms, 2 ms, 5 ms, 10 ms, 20 ms, 50 ms, and 100 ms, respectively. FIG. 12 demonstrates that as the exposure period T becomes longer, the dependency of the average charge count N with respect to the phase difference Δθ is exhibited more strongly. This is because as the exposure period becomes longer, more cycles of the waveform expressing the variation in sensitivity and the wave expressing the variation in illuminance become included in the exposure period, and the effects of the terms proportional to T in the formula expressing the total amount of signal charge $Q_t$ become greater. As FIG. 12 demonstrates, from the perspective of obtaining a signal level that is significantly higher than the level corresponding to the offset, a long exposure period is effective. For example, by adopting a sufficiently long exposure period, the second shot may be omitted. However, by taking the first and second shots while altering the phase, if a sufficiently high signal level is not obtained in the first shot, it is possible to distinguish between whether the image is dark because the phase difference Δθ is close to π by coincidence, or because the illuminance with respect to the imaging cells 10 is low.

According to an imaging device according to an embodiment of the present disclosure, the phase of the sensitivity modulation (θ; see Formula 5) is easily modifiable electrically, and thus the phase difference Δθ may be adjusted easily. The adjustment of the phase difference Δθ may also be executed prior to imaging as part of calibration.

Figure 9:
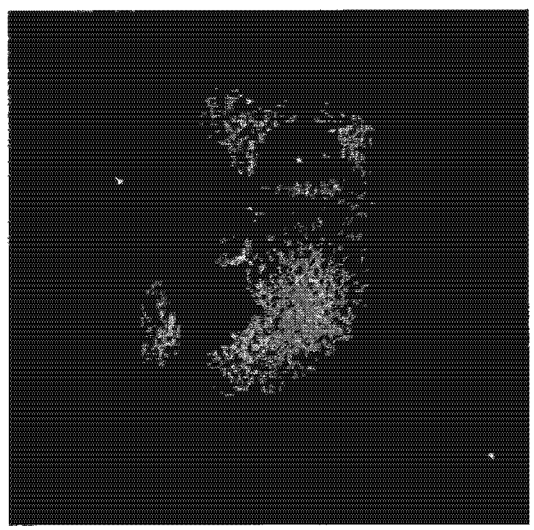
FIG. 9 is a diagram illustrating an example of an image obtained when (1) the period of variation in the brightness of a subject is different from the period of variation in the sensitivity of imaging cells, and in addition, (2) the phase of the periodic variation in the brightness of the subject is aligned with the phase of the periodic variation in the sensitivity of the imaging cells.
Figure 10:
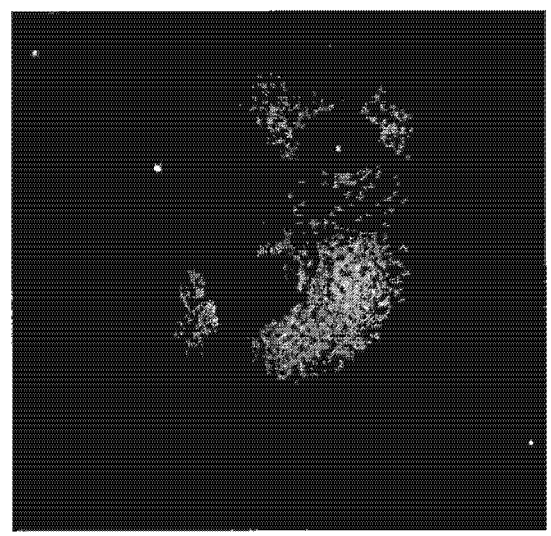
FIG. 10 is a diagram illustrating an example of an image obtained when (1) the period of variation in the brightness of a subject is different from the period of variation in the sensitivity of imaging cells, and in addition, (2) the phase of the periodic variation in the brightness of the subject is misaligned with the phase of the periodic variation in the sensitivity of the imaging cells by a half cycle.

FIGS. 9 and 10 will now be referenced. The images illustrated in FIGS. 9 and 10 are images when the driving voltage supplied to the LED is varied on a period of 2 kHz. In other words, FIGS. 9 and 10 are examples of images obtained when the period of the variation in the brightness of the subject does not match the period of the variation in the sensitivity of the imaging cells 10. FIG. 9 is an image when the phase of the periodic variation in the driving voltage of the LED is aligned with the phase of the periodic variation in the bias voltage applied to the transparent electrode 12c (θΔ=0), while FIG. 10 is an image when the phase of the periodic variation in the driving voltage of the LED is given a difference of a half cycle from the phase of the periodic variation in the bias voltage applied to the transparent electrode 12c (Δθ=−π or αθ=π). In either case, lightness corresponding to the offset is exhibited. FIGS. 9 and 10 demonstrate that when the period of the variation in the brightness of the subject does not match the period of the variation in the sensitivity of the imaging cells 10, an image of low lightness overall is obtained, irrespectively of the phase difference between these periodic variations.

FIG. 11 will now be referenced again. In FIG. 11, the black square plots indicate the measurement results when a discrepancy exists between the period of variation in the brightness of the subject and the period of variation in the sensitivity of the imaging cell 10, and corresponds to the shots described with reference to FIGS. 9 and 10. When the period of the variation in the brightness of the subject does not match the period of the variation in the sensitivity of the imaging cell 10, the average charge count N changes very little, even if the phase difference Δθ is changed. In other words, when the period of the variation in the brightness of the subject does not match the period of the variation in the sensitivity of the imaging cell 10, the dependency of the average charge count N with respect to the phase difference Δθ is weak. The reason why the change in the average charge count N does not become completely constant with respect to the change in the phase difference Δθ is estimated to be because of effects such as the non-linearity of the output with respect to the LED driving voltage, and the non-linearity of the external quantum efficiency of the photoelectric conversion unit 12 with respect to the bias voltage on the transparent electrode 12c.

In FIG. 11, the black circle plots indicate higher values than around N=2800 (ele) where the black square plots are clustered, thereby demonstrating that the offset discussed above may also be cancelled out by subtracting an image signal acquired while varying the sensitivity of the imaging cell 10 on a different period than the period of the variation in the brightness of the subject. In other words, if the function expressing the waveform of the sensitivity control signal used in the first shot is a periodic function, a function obtained by altering the period of the function expressing the waveform of the sensitivity control signal used in the first shot may be used as the function expressing the waveform of the sensitivity control signal used in the second shot.

Alternatively, a first shot may be taken while varying the sensitivity S, and a second shot may be taken while keeping the sensitivity S fixed. In other words, in the second shot, a signal having a waveform expressed by a constant function may be used as the sensitivity control signal supplied to the imaging cells 10 via the sensitivity control line 82. As a comparison of Formula 4 and the second term of Formula 7 above demonstrates, if the second shot is executed using a sensitivity $S_f$ of the same magnitude as $S_g$ in the first shot, from the second shot there is obtained an image signal corresponding to the amount of offset in the first shot, or in other words, an image signal for cancelling out the excess offset in lightness. Consequently, by acquiring the difference between the image signal obtained by the first shot and the image signal obtained by the second shot, the effects of such an offset may be removed.

Note that when considering to lock the phase difference Δθ, multiple peaks are exhibited in a graph of the average charge count N whose horizontal axis is the difference Δω between the frequency of the variation in the brightness of the subject and the frequency of the variation in the sensitivity of the imaging cells 10. For this reason, even if the offset is not cancelled out, it is still possible to search for a frequency of sensitivity modulation at which the graph of the average charge count N reaches a local maximum. The global maximum peak from among the multiple peaks is the peak at which Δω=0, and this peak becomes steeper as the exposure period becomes longer. Consequently, in the case of wanting to selectively acquire information about a specific frequency component while reducing the effects of other frequency components, it is possible to reduce the effects of the offset by lengthening the exposure period.

The first shot and the second shot discussed above are executed consecutively in time, for example. It is not necessary to execute the first shot and the second shot back-to-back, and a third shot may also be executed between the first shot and the second shot, for example. The first shot and the second shot may also be executed at the same time. If the first shot and the second shot are executed at the same time, the image signal for cancelling out the excess offset in lightness may be acquired more rapidly. For example, a subset of the imaging cells 10 in the imaging region may be used to acquire a first image signal, while in parallel with the acquisition of the first image signal, another subset of the imaging cells 10 may be used to acquire a second image signal.

Figure 13:
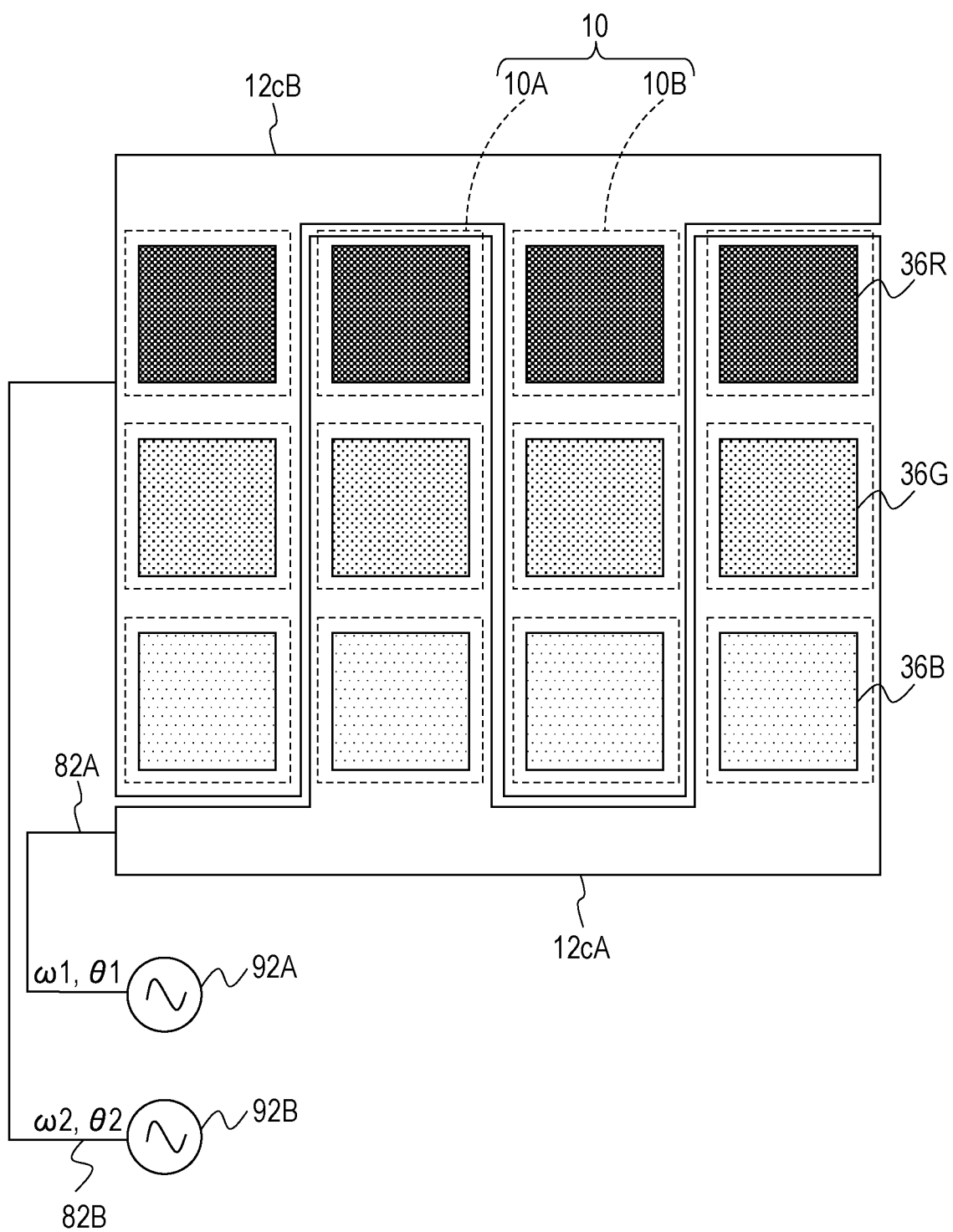
FIG. 13 is a schematic plan view illustrating an example of a configuration enabling the application of different sensitivity control signals among multiple imaging cells.

FIG. 13 illustrates an example of a configuration enabling the application of different sensitivity control signals among multiple imaging cells 10. FIG. 13 illustrates an extraction of 12 imaging cells 10 from among the multiple imaging cells 10 constituting the imaging region. Herein, the 12 imaging cells 10 are arranged in a 3-row by 4-column matrix.

In the configuration illustrated as an example in FIG. 13, the imaging region includes one or more imaging cells 10A including a transparent electrode 12cA, and one or more imaging cells 10B including a transparent electrode 12cB. In this example, the transparent electrode 12cA and the transparent electrode 12cB are comb-shaped, while the imaging cells 10A and the imaging cells 10B are disposed on the even-numbered columns and the odd-numbered columns of the matrix, respectively. As illustrated schematically in FIG. 13, a sensitivity control line 82A connected to a voltage supply circuit 92A and a sensitivity control line 82B connected to the voltage supply circuit 92B are connected to the transparent electrode 12cA and the transparent electrode 12cB, respectively. Consequently, sensitivity control signals having different waveforms may be applied independently to the imaging cells 10A and the imaging cells 10B.

The voltage supply circuit 92A is a signal source that generates a first sensitivity control signal expressing periodic variation, for example. During the exposure period of the imaging cells 10A, the sensitivity control line 82A applies the first sensitivity control signal expressing periodic variation and supplied from the voltage supply circuit 92A to the transparent electrode 12cA. The voltage supply circuit 92B is a signal source that generates a second sensitivity control signal having a waveform expressing variation over time that is different from the first sensitivity control signal. The second sensitivity control signal may be a signal expressing periodic variation, similarly to the first sensitivity control signal. In this case, the sensitivity control line 82B applies the second sensitivity control signal expressing periodic variation and supplied from the voltage supply circuit 92B to the transparent electrode 12cB. Provided that ω1 and θ1 are the frequency and phase of the first sensitivity control signal, respectively, while ω2 and θ2 are the frequency and phase of the first sensitivity control signal, respectively, ω1≠ω2 or θ1≠θ2. For example, the second sensitivity control signal has a waveform which is a time-shift of the waveform of the first sensitivity control signal.

According to the configuration illustrated as an example in FIG. 13, since the sensitivity control line 82A connected to the voltage supply circuit 92A and the sensitivity control line 82B connected to the voltage supply circuit 92B are independent of each other, mutually different sensitivity control signals may be applied in parallel to the imaging cells 10A and the imaging cells 10B. In other words, in a common exposure period, mutually different sensitivity modulation may be applied to the imaging cells 10A and the imaging cells 10B.

In the configuration illustrated as an example in FIG. 13, a color filter array is disposed facing the transparent electrodes (transparent electrode 12cA or transparent electrode 12cB) of the multiple imaging cells 10. Herein, a color filter 36R that transmits light in the red wavelength region is disposed on the first row of the multiple imaging cells 10, while a color filter 36G that transmits light in the green wavelength region is disposed on the second row. A color filter 36B that transmits light in the blue wavelength region is disposed on the third row. In other words, in this example, imaging cells 10A and imaging cells 10B having a common color filter that transmits the same wavelength region are adjacent to each other in the direction in which the rows of the multiple imaging cells 10 extend (row direction).

Figure 14:
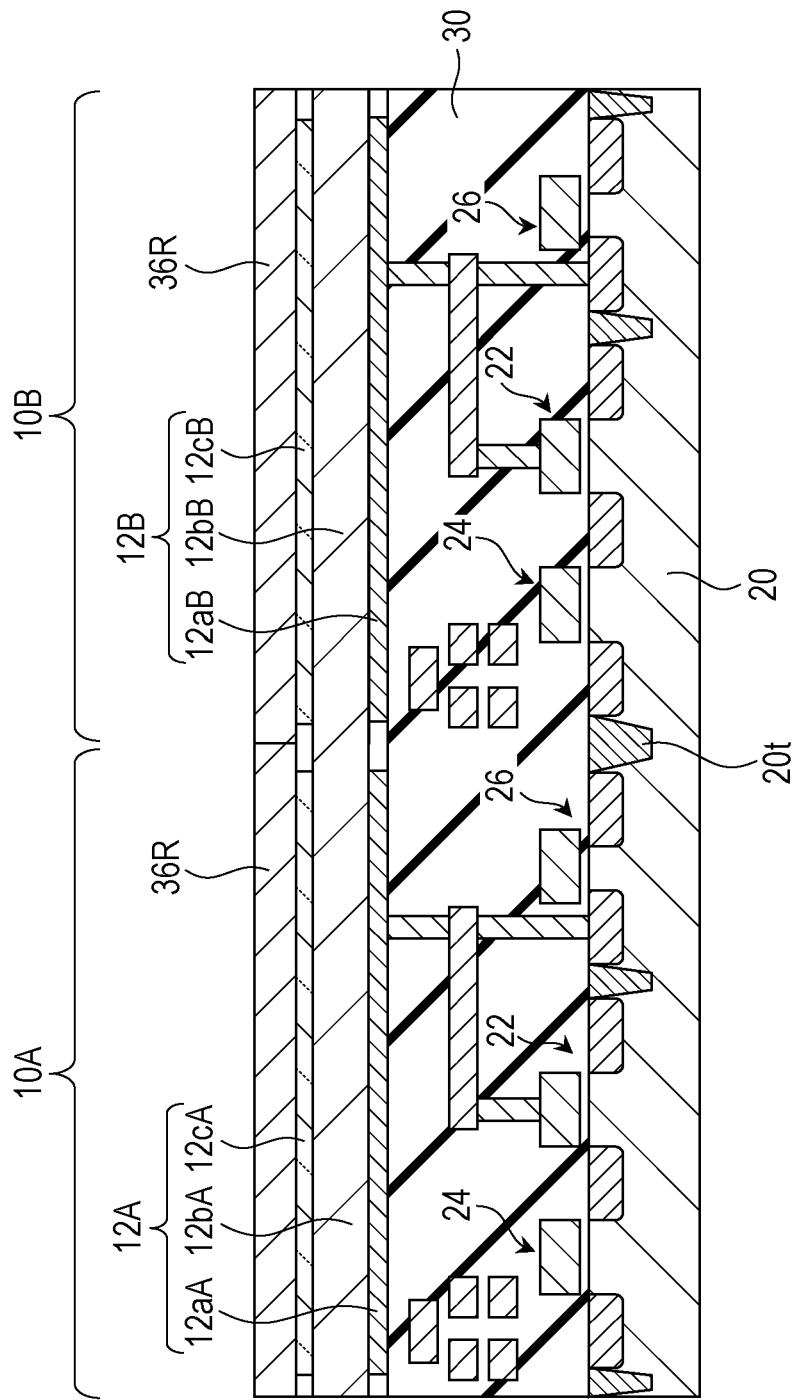
FIG. 14 is a schematic cross-section view illustrating a part of the multiple imaging cells illustrated in FIG. 13.

FIG. 14 illustrates a schematic cross-section of part of the multiple imaging cells 10 illustrated in FIG. 13. FIG. 14 illustrates an extraction of a pair of an imaging cell 10A and an imaging cell 10B including the color filter 36R from among the pairs of the imaging cells 10A and the imaging cells 10B adjacent to each other in the row direction. Typically, a black mask (a grid-shaped light-shielding layer) is disposed between adjacent color filters. However, if the transmitted wavelength region is the same, the black mask between the color filters may be omitted, as illustrated in FIG. 14.

In the configuration illustrated as an example in FIG. 14, the imaging cell 10A includes a photoelectric conversion unit 12A including a pixel electrode 12aA, a photoelectric conversion layer 12bA, and a transparent electrode 12cA. Similarly, the imaging cell 10B includes a photoelectric conversion unit 12B including a pixel electrode 12aB, a photoelectric conversion layer 12bB, and a transparent electrode 12cB. Herein, the transparent electrode 12cA having a connection to the sensitivity control line 82A and the transparent electrode 12cB having a connection to the sensitivity control line 82B are spatially separated, and thereby are electrically separated. Note that in this example, the photoelectric conversion layer 12bA of the photoelectric conversion unit 12A and the photoelectric conversion layer 12bB of the photoelectric conversion unit 12B are a single continuous layer. By forming the photoelectric conversion layer in the form of a single continuous layer across the imaging cell 10A and the imaging cell 10B, increased complexity in the fabrication process may be avoided.

As illustrated schematically in FIG. 14, each of the pixel electrode 12aA of the imaging cell 10A and the pixel electrode 12aB of the imaging cell 10B is electrically connected to the gate of a corresponding signal detection transistor 22. In other words, the imaging cells 10 constituting the imaging region may be referred to as a unit structure, in which each includes the signal detection transistor 22. Typically, the imaging region has a repeating structure of multiple imaging cells 10.

In the acquisition of an image, one of either the image signal obtained by the imaging cells 10A or the image signal obtained by the imaging cells 10B is used as a signal for offset cancellation. For example, after executing a reset on the imaging cells 10A and the imaging cells 10B, a first sensitivity control signal is used to execute the accumulation of signal charge in the imaging cells 10A while varying the sensitivity over time (first shot). In parallel with the accumulation of signal charge in the imaging cells 10A, a second sensitivity control signal with a different waveform than the first sensitivity control signal is used to execute the accumulation of signal charge in the imaging cells 10B while varying the sensitivity over time (second shot). By computing the difference between the outputs of the imaging cells 10A and the imaging cells 10B, there is obtained an image signal from which the effects of the offset have been removed. In other words, compared to the case of executing the first shot and the second shot consecutively in time, the image signal for removing the offset may be obtained in less time.

In this way, in a subset of the imaging cells (herein, the imaging cells 10A) of the pixel array PA, exposure may be performed while varying a first sensitivity, whereas in other imaging cells (herein, the imaging cells 10B), exposure may be performed on the basis of a sensitivity modulation different from the modulation of the first sensitivity. For example, by electrically connecting the transparent electrode 12cA between multiple imaging cells 10A, a common first sensitivity control signal may be used to collectively modulate the sensitivity of these imaging cells 10A. The imaging cells 10A with a shared sensitivity modulation in the exposure period all extract information related to a specific component from among the variation over time in the brightness of the subject. In other words, on the basis of the output signal from the imaging cells 10A, a two-dimensional (or one-dimensional) image related to the specific component may be constructed.

In the configuration illustrated in FIGS. 13 and 14, the outputs from a pair of the imaging cell 10A and the imaging cell 10B adjacent in the row direction are used to decide the brightness value of a certain pixel in the ultimately obtained image. Consequently, the number of pixels in the row direction of the ultimately obtained image is one-half the number of imaging cells 10 disposed in the row direction in the imaging region. The color filter arrangement and the shape of the photosensitive region of each imaging cell are not limited to the example illustrated in FIG. 13, and may be configured arbitrarily.

Figure 15:
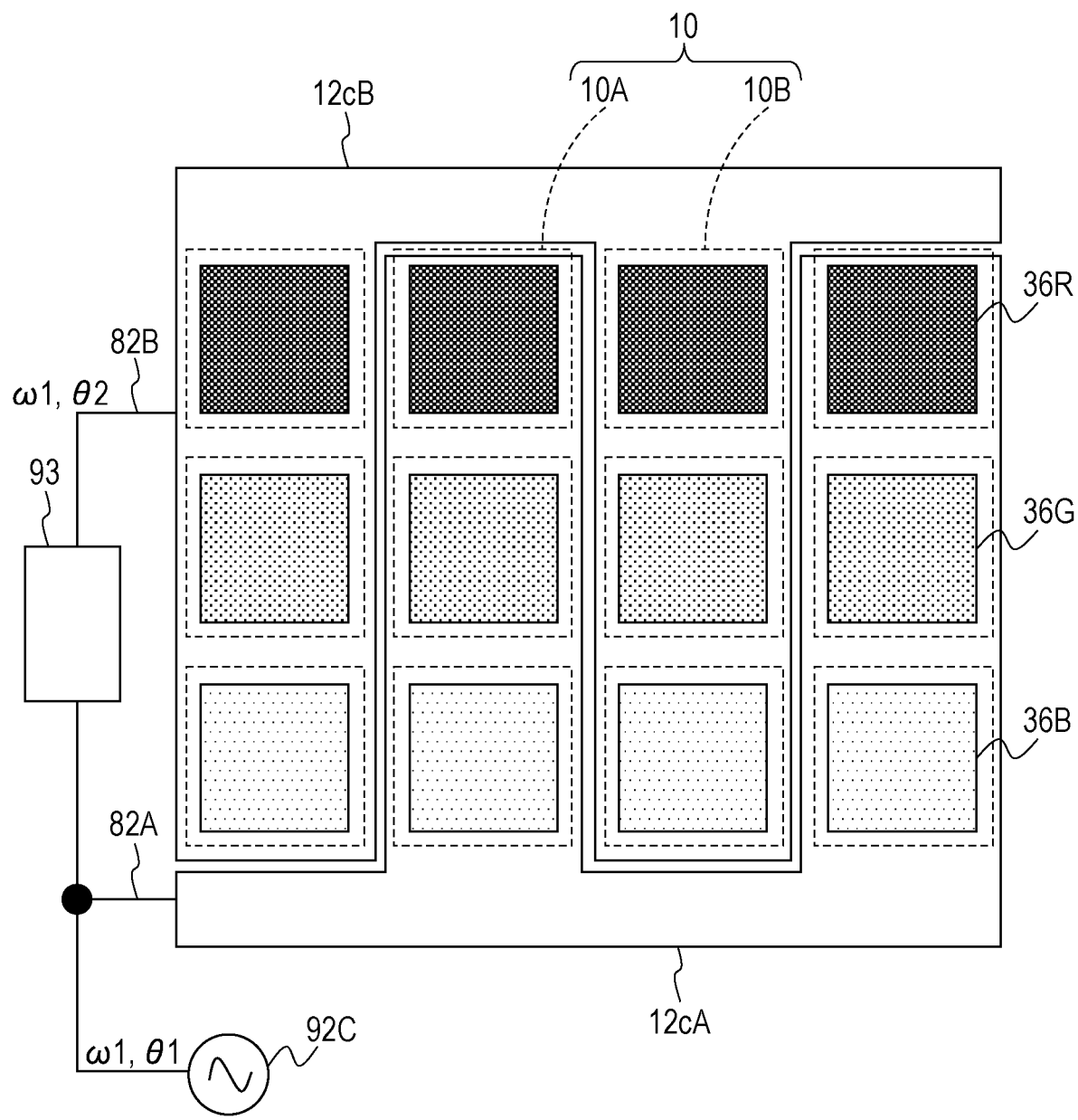
FIG. 15 is a schematic plan view illustrating another example of a configuration enabling the application of different sensitivity control signals among multiple imaging cells.
Figure 16:
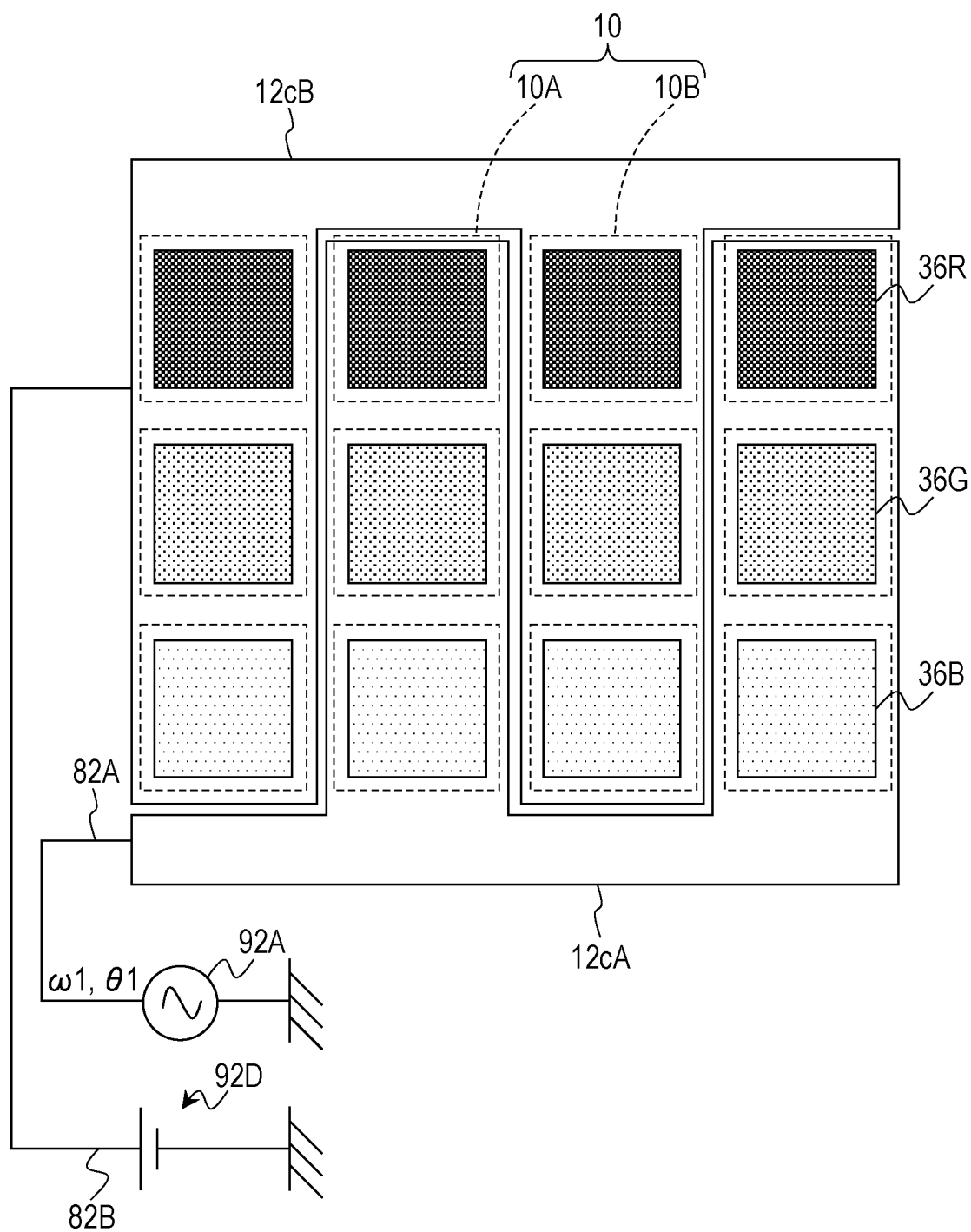
FIG. 16 is a schematic plan view illustrating yet another example of a configuration enabling the application of different sensitivity control signals among multiple imaging cells.

FIGS. 15 and 16 illustrate another example of a configuration enabling the application of different sensitivity control signals among multiple imaging cells 10. A common voltage supply circuit 92C may be used as a signal source, and a phase shifter may be connected between the voltage supply circuit 92C and the sensitivity control line 82A, or between the voltage supply circuit 92C and the sensitivity control line 82B. In the example illustrated in FIG. 15, a phase shifter 93 is connected between the voltage supply circuit 92C and the sensitivity control line 82B. The phase shifter 93 shifts the phase of the signal supplied from the voltage supply circuit 92C. According to such a configuration, the number of signal sources may be reduced.

As illustrated in FIG. 16, one of the voltage supply circuit 92A and the voltage supply circuit 92B may be replaced with a direct-current signal source 92D. Such a configuration similarly enables the acquisition of an image signal for offset cancellation. In this way, a configuration that groups the multiple imaging cells 10 by each electrically separated transparent electrode may be adopted.

(Generalization)

In the above example, the illuminance $L(\tau)$ is assumed to be expressible by a superposition of light whose amplitude varies at a frequency of $\omega_m$. Strictly, the light incident on the photoelectric conversion unit 12 is not limited to being a superposition of light whose amplitude varies at a frequency of $\omega_m$. However, as discussed later, by radiating light towards the subject, it is possible to actively produce brightness variations in the subject, and if the subject is irradiated with light whose intensity varies periodically onto the subject, for example, periodic variations in the light reflecting off the subject surface may be produced. In other words, variations in illuminance as expressed by a periodic function of the period T may be expressed.

If the illuminance $L(\tau)$ in the exposure period is expressed by a periodic function, $L(\tau)$ may be expanded into a Fourier series. Namely, over a closed term [0, T], $L(\tau)$ may be expanded by the system of functions $\{1, \cos \omega_1\tau, \sin \omega_1\tau, \cos \omega_2\tau, \sin \omega_2\tau, \ldots, \cos \omega_m\tau, \sin \omega_m\tau, \ldots\}$. At this point, if a function that takes only positive values by adding a constant to a sine function or a cosine function of an arbitrary frequency is selected as the waveform of the sensitivity $S(\tau)$, the component of the illuminance $L(\tau)$ in which the amplitude oscillates at that frequency may be extracted. This means that even if variations over time occur in the brightness of the subject due to multiple factors, the brightness variations within the exposure time caused by one of the multiple factors may be selectively extracted.

For example, if the subject is illuminated by a first light source whose intensity varies sinusoidally at a frequency of 3 kHz, and a second light source whose intensity varies sinusoidally at a frequency of 2 kHz, the variation in the brightness of the subject includes a first component that varies at a frequency of 3 kHz, and a second component that varies at a frequency of 2 kHz. The frequency of the sensitivity control signal may be selected arbitrarily by the user of the imaging device 100. For example, if the signal level of the sensitivity control signal is made to vary sinusoidally at a frequency of 3 kHz, there is obtained an image similar to the image obtained when the subject is illuminated by just the first light source. If the frequency of the variations in the signal level of the sensitivity control signal is set to 2 kHz, there is obtained an image similar to the image obtained when the subject is illuminated by just the second light source. In other words, even if the subject is illuminated by multiple light sources disposed at spatially distance positions, for example, if the frequencies of the modulation in the intensity of the light radiated from each of the light sources are made to differ from each other, there is obtained an image similar to the image obtained when the subject is illuminated by just a specific light source. In this way, according to an embodiment of the present disclosure, even if the subject is illuminated by multiple light sources, the respective frequency components in the variation of brightness over time may be separated and extracted. This is an advantageous effect which is not obtained by simply shortening the exposure period.

The extraction of a component in which the amplitude oscillates at a specific frequency from the variation in illuminance over time corresponds to the calculation of the Fourier coefficients in a Fourier series. In the integrand of Formula 6, the terms in which $\omega_m = \omega_s$ from among the terms proportional to $\cos(\omega_m - \omega_s)\tau$ increase monotonically with respect to increases in the exposure time. In contrast, for the terms in which $\omega_m \neq \omega_s$ from among the term proportional to $\cos(\omega_m - \omega_s)$ and the terms proportional to $\sin(\omega_m - \omega_s)$, the result simply oscillates in a fixed range even if the exposure time is increased. This is a manifestation of one aspect of the orthogonality of a trigonometric function. From this aspect, it is conceivable that a similar result would be obtained by using an orthogonal function instead of a trigonometric function. In other words, a signal having a waveform expressed by a function that takes only positive values by adding a constant to one of the bases of a system of functions constituting an orthogonal system may be applied as the sensitivity control signal to supply to the imaging cells 10 in the exposure period. Note that "bases" in this specification refers to the respective elements in the system of functions constituting an orthogonal system. In this specification, an "orthogonal system" also includes a system of orthogonal polynomials.

In other words, the above argument may also be generalized to functions other than periodic functions. Particularly, it is known that if the closed term is suitably chosen, an arbitrary function is expandable by a system of functions $\{\psi_n(\tau)\}$ constituting a complete system (where n is an integer equal to or greater than 0). If the system of functions constitutes a complete system, mutually orthogonal bases may be chosen and a complete orthogonal system $\{\varphi_n(\tau)\}$ may be constructed by appropriate linear combination. In other words, a signal having a waveform expressed by a function that takes only positive values by adding a constant to one of the bases of a system of functions constituting a complete orthogonal system may be used as the sensitivity control signal. The system of functions $\{1, \cos \omega_1\tau, \sin \omega_1\tau, \cos \omega_2\tau, \sin \omega_2\tau, \ldots\}$ discussed earlier is one example of a complete orthogonal system.

As described with reference to FIGS. 5 and 6, the waveform of the illuminance $L(\tau)$ typically has an irregular shape. However, in the term [0, T], it is conceivable that the illuminance $L(\tau)$ may be expressed by some kind of complete orthogonal system. In other words, as indicated in Formula 10 below, $L(\tau)$ may be expanded by using the system of functions $\{\varphi_n(\tau)\}$. In Formula 10, $a_0, a_1, a_2, \ldots$ are the coefficients of expansion.

$$L(\tau) = a_0\phi_0 a_1\phi_1 + a_2\phi_2 + a_3\phi_3 + \ldots \quad (10)$$

If Formula 1 for the total amount of signal charge $Q_t$ is substituted into the expansion indicated in Formula 10, the following Formula 11 is obtained.

$$Q_t = C\int_0^T(a_0\phi_0 + a_1\phi_1 + a_2\phi_2 + a_3\phi_3 + \ldots)S(\tau)d\tau \quad (11)$$

At this point, consider the case of modulating the sensitivity of the imaging cells 10 in the exposure period by using a sensitivity control signal having a waveform similar to one of the bases of the complete orthogonal system $\{\varphi_n(\tau)\}$, such as $\varphi_s(\tau)$, for example. In other words, consider the case of using $\varphi_s(\tau)$ as the sensitivity $S(\tau)$ in Formula 11. Given that the right side of Formula 1 takes the form of the inner product $<L, S>$ of the functions $L(\tau)$ and $S(\tau)$, from the orthogonality of the respective bases, only the inner product of $\varphi_s(\tau)$ with itself remains, and ultimately the following Formula 12 is obtained.

$$\begin{aligned} Q_t &= C\int_0^T(a_0\phi_0 + a_1\phi_1 + a_2\phi_2 + a_3\phi_3 + \ldots)S(\tau)d\tau \\ &= C\int_0^T(a_0\phi_0 + a_1\phi_1 + a_2\phi_2 + a_3\phi_3 + \ldots + a_s\phi_s + \ldots)\phi_s d\tau \\ &= Ca_s \end{aligned} \quad (12)$$

In other words, the sth expansion coefficient $a_s$ may be extracted. This means that by using a basis of a system of functions constituting a complete orthogonal system as the sensitivity $S(\tau)$, information related to the component corresponding to that basis may be extracted from the variation in the illuminance $L(\tau)$ inside the exposure period. In other words, even if the variation over time in the brightness of the subject is not periodic, information related to a specific component may be extracted from the variation over time in the brightness of the subject.

However, in actuality, whereas the bases of the complete orthogonal system $\{\varphi_n(\tau)\}$ may take negative values in the closed term [0, T], the sensitivity $S(\tau)$ does not take negative values, and thus the bases of the complete orthogonal system $\{\varphi_n(\tau)\}$ may not be used directly as $S(\tau)$. For this reason, a function $\chi_n(\tau) = \varphi_n(\tau) + \chi_0$ is defined such that the condition $S(\tau) \geq 0$ is satisfied in the closed term [0, T], and this $\chi_n(\tau)$ is used as $S(\tau)$. Herein, $\chi_0$ is a suitable constant chosen so that $\chi_n(\tau) \geq 0$ in the closed term [0, T].

If the newly defined function $\chi_n(\tau)$ is applied to $S(\tau)$ of Formula 11, the following Formula 13 is obtained.

$$Q_t = Ca_s + Q_0 \quad (13)$$

In Formula 13 above, $Q_0$ is a constant calculated according to Formula 14 below, and corresponds to the offset discussed earlier.

$$Q_0 = C\chi_0\int_0^T L(\tau)d\tau \quad (14)$$

As already described, this offset may be cancelled out by subtracting an image signal obtained by a second shot in which the sensitivity $S(\tau)$ is kept constant over the exposure period, for example. Alternatively, if $S(\tau)$ is a periodic function, the phase or the period of $S(\tau)$ may be altered to acquire two different image signals, and the difference therebetween may be computed.

In this way, the function expressing the sensitivity control signal to supply to the imaging cells 10 in the exposure period is not limited to being a function that takes only positive values by adding a constant to a trigonometric function, and may be any function that takes only positive values by adding a constant to one of the bases of a system of functions constituting an orthogonal system. As discussed later, a system of Walsh functions or the like may also be used as the system of functions constituting an orthogonal system, for example. Particularly, if a complete orthogonal system is selected as the system of functions constituting an orthogonal system, information related to a specific component from among the components constituting the function $L(\tau)$ expressing the variation in illuminance over time may be extracted, irrespectively of whether or not $L(\tau)$ is a periodic function. If the function $L(\tau)$ is a periodic function, then as described using Formula 5, a function that takes only positive values by adding a constant to a sine function (or a cosine function) may be used, for example. In this case, information related to a component in which the amplitude varies at a specific frequency is extracted from among the components constituting $L(\tau)$ indicating the variation in the illuminance during the exposure period.

(Modification of Imaging Cell)

Figure 17:
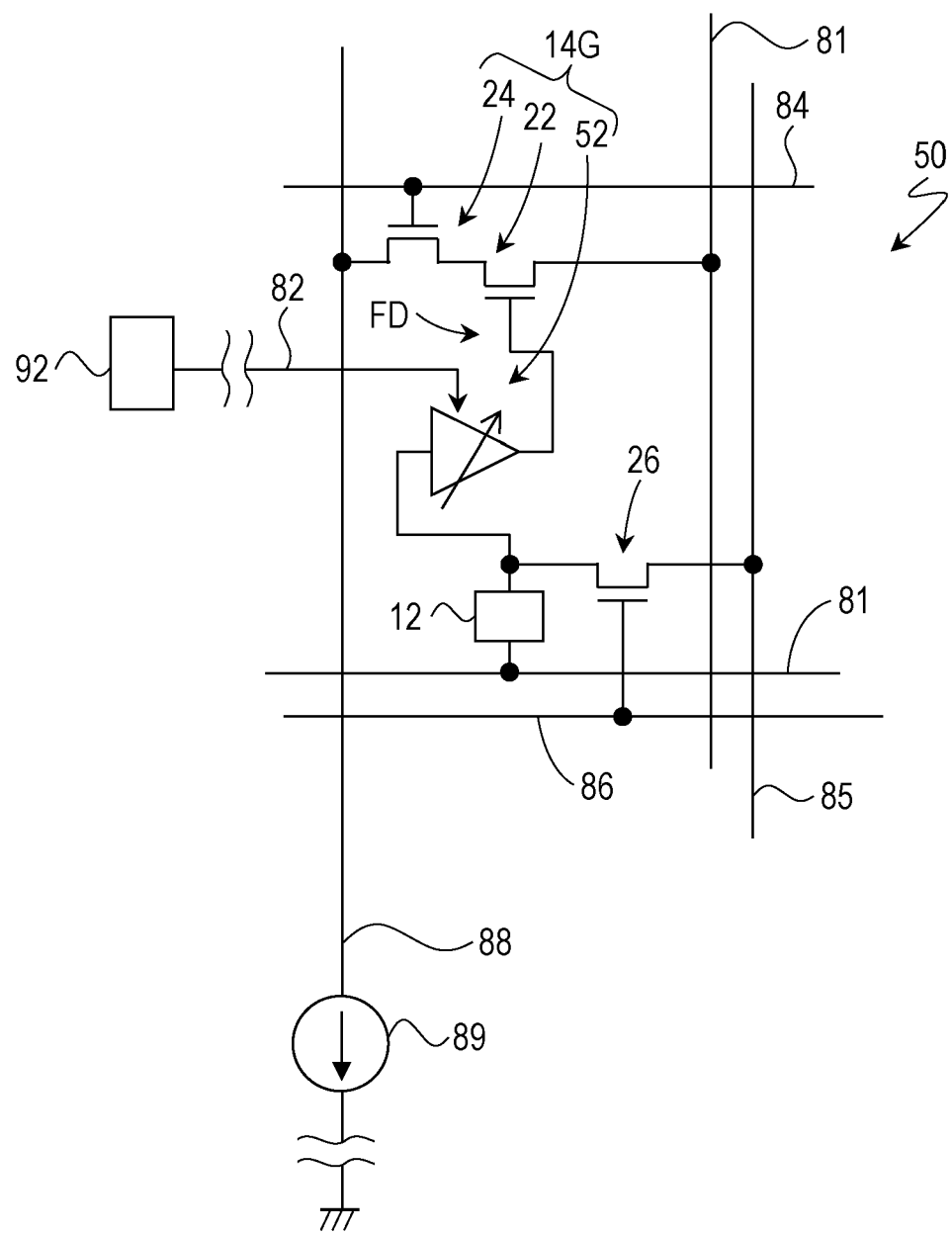
FIG. 17 is a diagram illustrating an example of the circuit configuration of an imaging cell with variable sensitivity.

The configuration that imparts modulation to the sensitivity of the imaging cells 10 is not limited to the example discussed above. FIG. 17 illustrates an example of the circuit configuration of an imaging cell with variable sensitivity. The imaging cell 50 illustrated in FIG. 17 includes a signal detection circuit 14G including an amplifier 52 connected to the sensitivity control line 82. In the configuration illustrated as an example in FIG. 17, the amplifier 52 is connected between the photoelectric conversion unit 12 and the input of the signal detection transistor 22. The amplifier 52 is a variable-gain amplifier, for example, and the sensitivity control line 82 is connected to the gain control terminal of the variable-gain amplifier. Note that in this example, a voltage line 81 is connected to the photoelectric conversion unit 12. The voltage line 81 is connected to the transparent electrode 12c (not illustrated in FIG. 17), and supplies a certain bias voltage to the transparent electrode 12c while the imaging device 100 is operating. This bias voltage is typically a fixed voltage.

According to such a configuration, the gain in the amplifier 52 may be varied over time in accordance with the waveform of the sensitivity control signal. In other words, it is possible to vary the sensitivity of the imaging cell 50 in the exposure period. The waveform of the variation in the gain of the amplifier 52 in the exposure period is expressed by a function that takes only positive values by adding a constant to one of the bases of a system of functions constituting an orthogonal system, for example.

Figure 18:
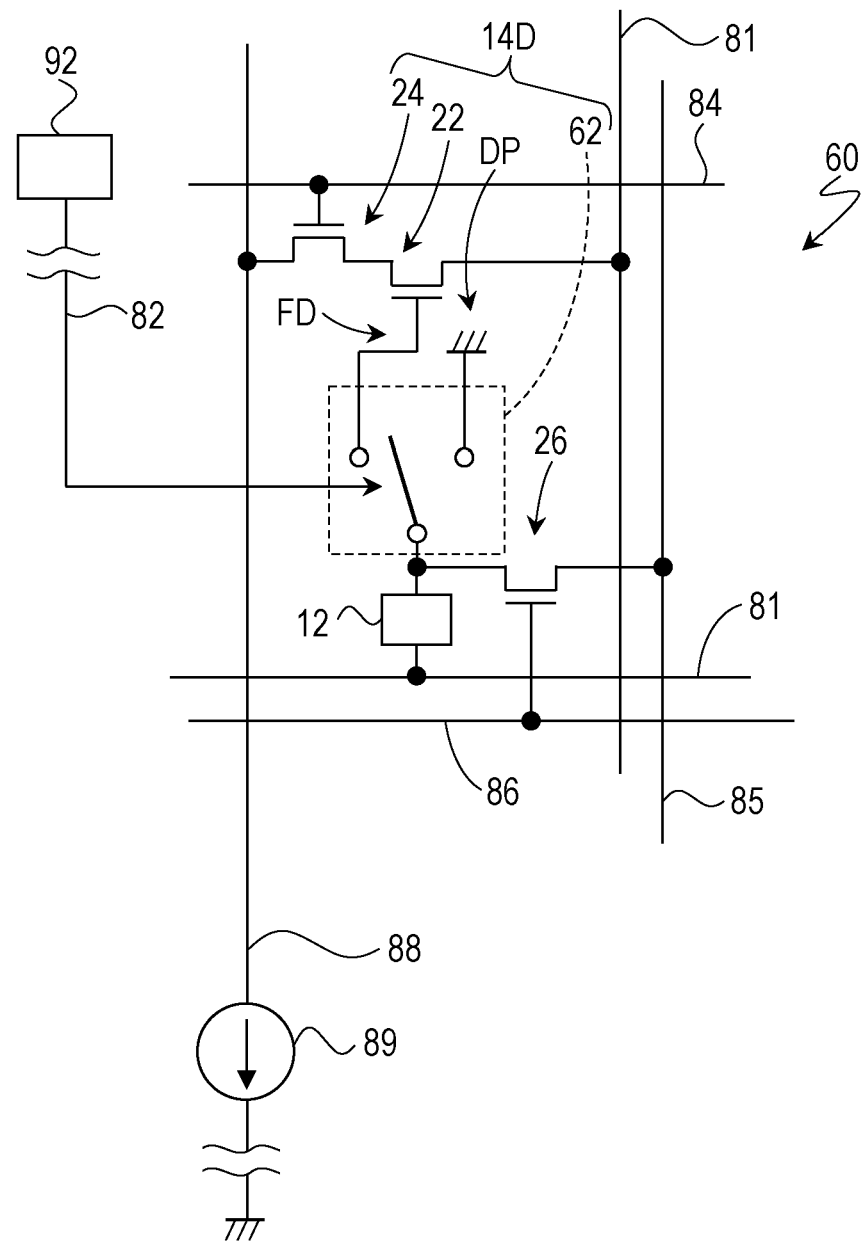
FIG. 18 is a diagram illustrating another example of the circuit configuration of an imaging cell with variable sensitivity.

FIG. 18 illustrates another example of the circuit configuration of an imaging cell with variable sensitivity. The imaging cell 60 illustrated in FIG. 18 includes a signal detection circuit 14D including a toggle circuit 62 connected to the sensitivity control line 82, and a charge-draining region DP. As illustrated in the drawing, the toggle circuit 62 is connected between the photoelectric conversion unit 12, and the charge accumulation node FD and charge-draining region DP. The toggle circuit 62 includes a switching element such as a field-effect transistor, for example, and on the basis of a sensitivity control signal applied to the sensitivity control line 82, toggles between connecting the photoelectric conversion unit 12 to either the charge accumulation node FD or the charge-draining region DP.

The charge-draining region DP is an impurity region formed in the semiconductor substrate 20, for example, the electric potential of which is typically the ground potential. When the photoelectric conversion unit 12 is connected to the charge-draining region DP, the signal charge generated by the photoelectric conversion unit 12 drains into the charge-draining region DP via the toggle circuit 62. Consequently, the sensitivity control signal may be used to connect the photoelectric conversion unit 12 to the charge accumulation node FD and accumulate signal charge in a part of the exposure period, and connect the photoelectric conversion unit 12 to the charge-draining region DP and drain the signal charge in the remaining part of the exposure period, for example. In the example configurations illustrated in FIGS. 17 and 18, a typical photodiode may also be used as the photoelectric conversion unit 12.

Figure 19:
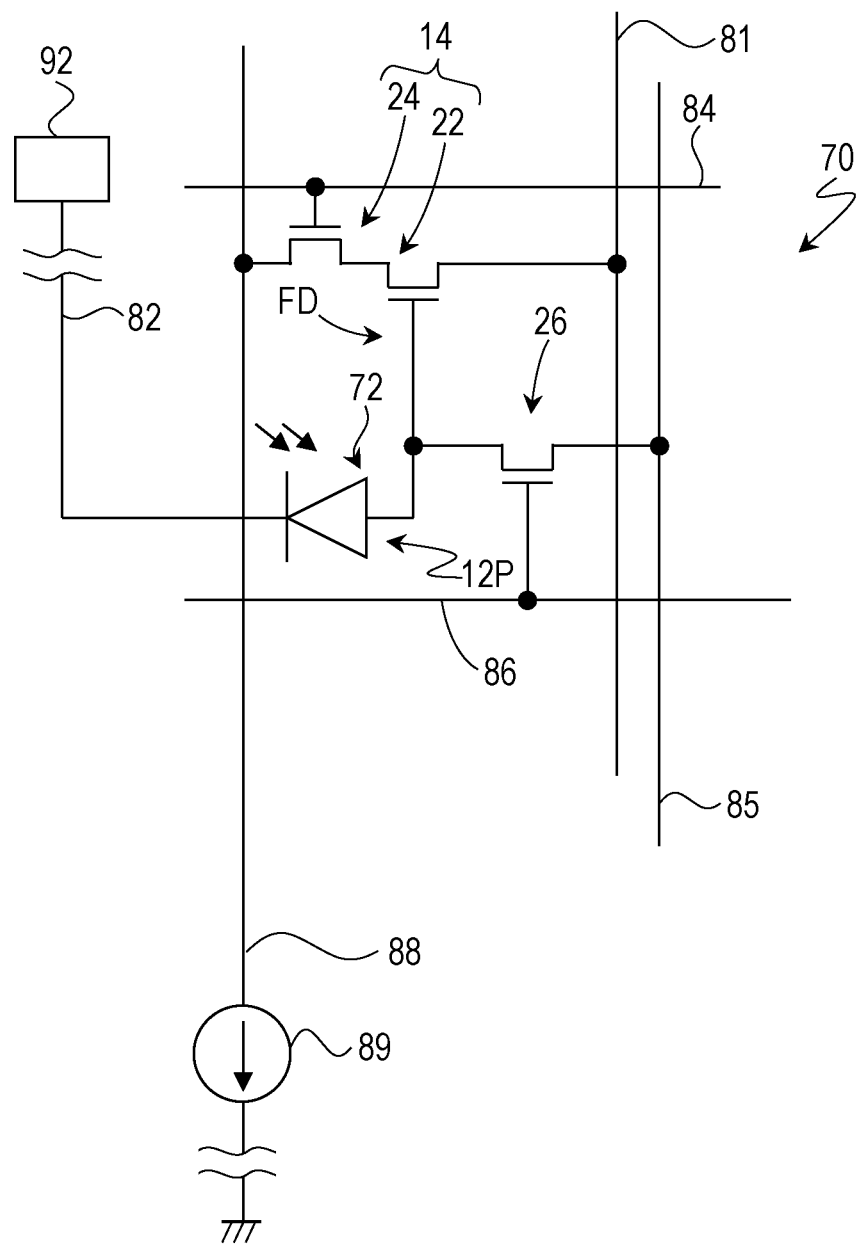
FIG. 19 is a diagram illustrating an example of a circuit in which an avalanche photodiode is applied to a photoelectric conversion unit.

Alternatively, an avalanche photodiode may also be used as the photoelectric conversion unit 12. FIG. 19 illustrates an example of a circuit in which an avalanche photodiode is applied to a photoelectron conversion area 12. The photoelectric conversion unit 12P of the imaging cell 70 illustrated in FIG. 19 includes an avalanche photodiode 72 including an electrode connected to the sensitivity control line 82.

The degree of avalanche multiplication in the avalanche photodiode 72 depends on the bias voltage applied to the avalanche photodiode 72. Consequently, by varying the bias voltage applied to the avalanche photodiode 72 via the sensitivity control line 82, it is possible to electrically control the sensitivity in the imaging cell 70.

According to the configurations described with reference to FIGS. 17 to 19, it is likewise possible to use the sensitivity control signal to impart modulation to the sensitivity of the imaging cell. In this way, the method and mechanism by which to vary the sensitivity of the imaging cell over time in the exposure period is not limited to a specific method and mechanism. However, in consideration of factors such as the effects of signal delay caused by the parasitic capacitance of the interconnects, from the perspective of collectively varying the sensitivity in multiple imaging cells, the photoelectric conversion unit 12 having a sandwich structure as described with reference to FIG. 3 is effective.

Second Embodiment

As described above, when the brightness of the subject varies in accordance with a certain rule, by varying the sensitivity of the imaging cells 10 in the exposure period in accordance with a rule related to that rule, it is possible to extract information related to a specific component from the variation over time in the brightness of the subject. For example, when the variation in the brightness of the subject includes a component that varies at a certain frequency, by matching the frequency of the modulation of the sensitivity of the imaging cells 10 to that frequency, there is obtained an image similar to when the subject is selectively irradiated with light whose intensity varies at that frequency.

Furthermore, as described hereinafter, by irradiating the subject with light using an illumination device, variation in the brightness of the subject may be produced actively. By constructing an imaging system using an illumination device, a variety of applications are possible.

(Spectral Imaging System)

For example, the imaging device 100 and an illumination device that emits light whose intensity varies over time may realize a spectral imaging system. To ease understanding of the advantageous points of an imaging system of the present disclosure, first, the configuration and operation of a Fourier transform infrared spectrophotometer of a comparative example will be described.

Figure 20:
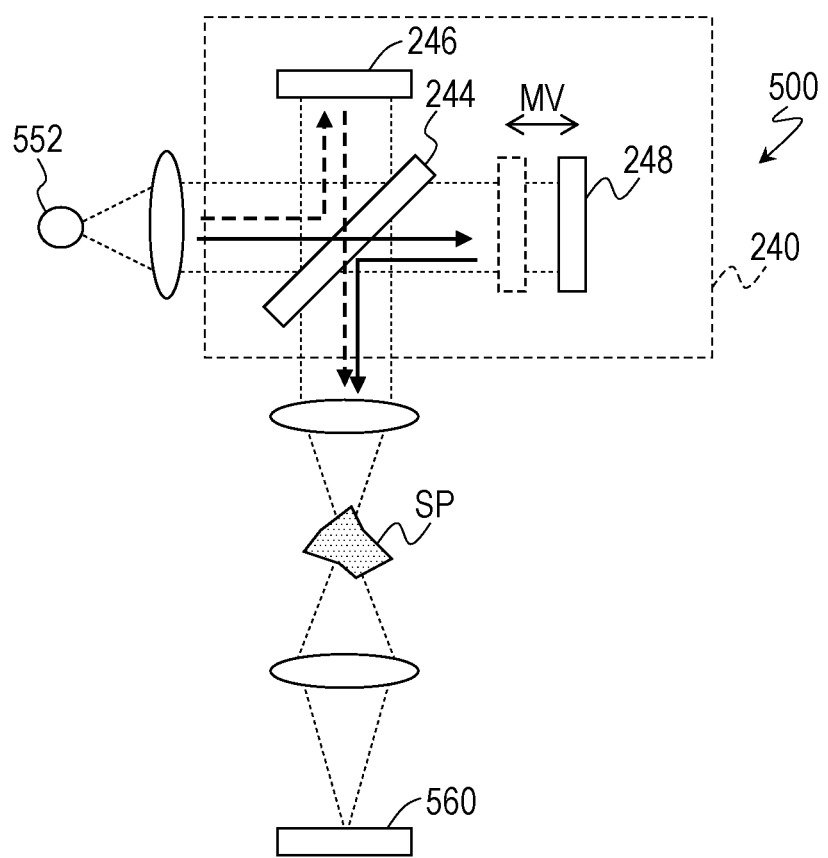
FIG. 20 is an outline diagram illustrating a configuration of a Fourier transform infrared spectrophotometer of a comparative example.

FIG. 20 illustrates an outline of a configuration of a Fourier transform infrared spectrophotometer of a comparative example. The infrared spectrophotometer 500 illustrated in FIG. 20 includes an interferometer as part of itself. Specifically, the infrared spectrophotometer 500 includes an infrared light source 552, a beam splitter 244, a fixed mirror 246, a moving mirror 248, and a detector 560. Part of the light emitted from the infrared light source 552 is reflected by the fixed mirror 246, while another part is reflected by the moving mirror 248. The light reflected by the fixed mirror 246 and the light reflected by the moving mirror 248 are combined by the beam splitter 244 to form interfering light. The interfering light is incident on a measurement target SP placed between the beam splitter 244 and the detector 560. Transmitted light from the measurement target SP is incident on the detector 560.

As indicated by the double-headed arrow MV in FIG. 20, by moving the moving mirror 248 left and right as illustrated in the diagram, it is possible to produce a periodically varying phase difference between the reflected light from the fixed mirror 246 and the reflected light from the moving mirror 248. By irradiating the measurement target SP with interfering light whose phase difference varies over time, and detecting the transmitted light with the detector 560, an interferogram is obtained. By performing a Fourier transform process on this interferogram with a computer, an infrared spectrum of the transmitted light with the wavenumber as the horizontal axis is obtained.

Figure 21:
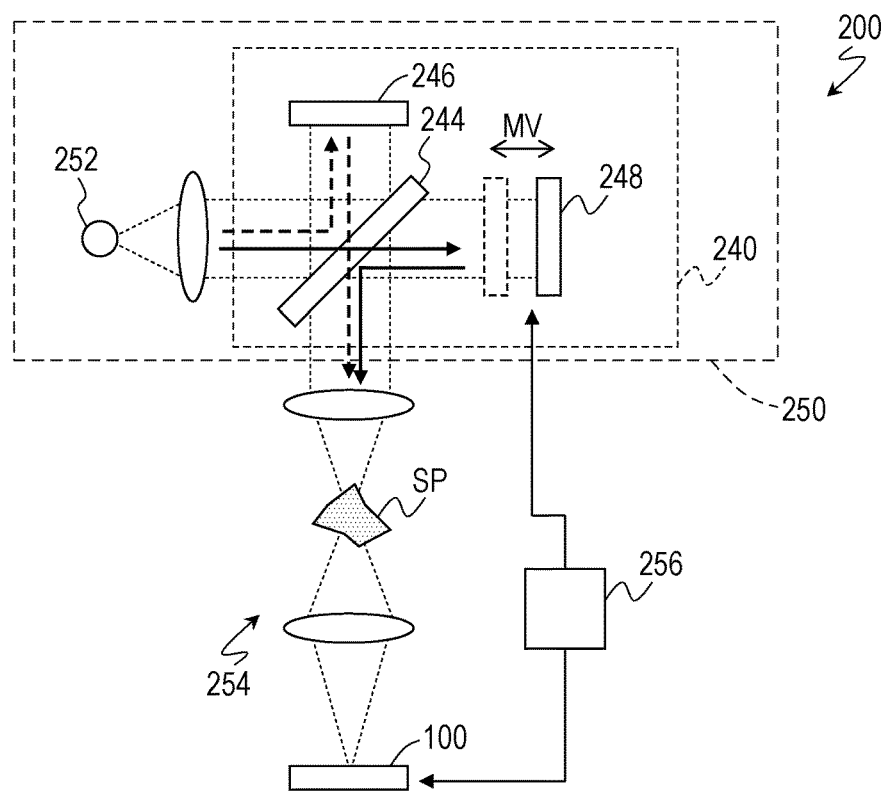
FIG. 21 is a schematic diagram illustrating an example of a spectral imaging system using an imaging system according to an embodiment of the present disclosure.

FIG. 21 schematically illustrates an example of a spectral imaging system using an imaging system according to an embodiment of the present disclosure. Schematically, the spectral imaging system 200 illustrated in FIG. 21 has a configuration in which the infrared light source 552 and the detector 560 of the infrared spectrophotometer illustrated in FIG. 20 have been replaced with a light source 252 and the imaging device 100 discussed earlier, respectively.

For the light source 252, a white light source may be used, for example. Interfering light is formed from the light emitted from the light source 252, similarly to the infrared spectrophotometer 500 discussed above. Herein, the position of the moving mirror 248 is moved sinusoidally. By varying the position of the moving mirror 248 sinusoidally, interfering light having a sinusoidal waveform of intensity may be formed. In other words, light whose intensity varies over time is incident on the measurement target SP. Consequently, in the configuration illustrated as an example in FIG. 21, the entirety of the light source 252 and the interferometer 240 may be treated as an illumination device 250 that radiates light whose intensity varies over time onto a subject (herein, the measurement target SP).

Figure 22:
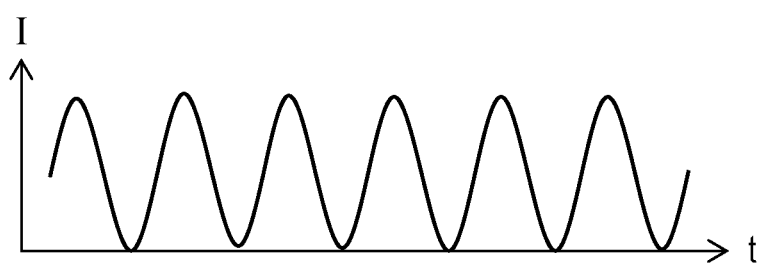
FIG. 22 is a graph illustrating a waveform of interfering light formed from light having a wavelength equal to two times the physical amplitude of a moving mirror.
Figure 23:
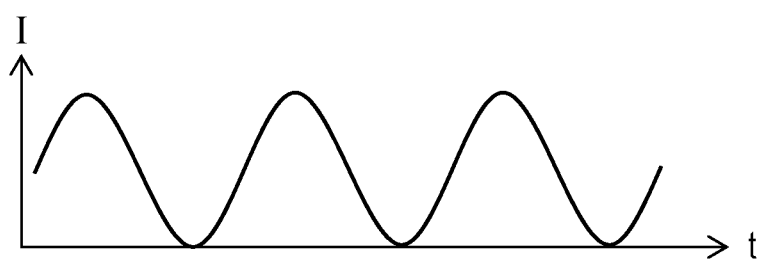
FIG. 23 is a graph illustrating a waveform of interfering light formed from light having a wavelength equal to four times the physical amplitude of a moving mirror.

Since the emitted light from the light source 252 includes light of various wavelengths, the interfering light is a superposition of light whose intensities vary at different frequencies. In other words, by the physical oscillation of the moving mirror 248, it is possible to impart modulation to the intensity at different frequencies for each wavelength. FIG. 22 illustrates a waveform of interfering light formed from light having a wavelength equal to two times the physical amplitude of the moving mirror 248. FIG. 23 illustrates a waveform of interfering light formed from light having a wavelength equal to four times the physical amplitude of the moving mirror 248. In both of the graphs illustrated in FIGS. 22 and 23, the horizontal axis represents the time t, while the vertical axis represents the intensity I of the interfering light. As FIGS. 22 and 23 demonstrate, in this example, the variation in the intensity of the light radiated from the illumination device 250 is periodic.

The interfering light formed by the interferometer 240 is incident on the measurement target SP. An optical system 254 placed between the measurement target SP and the imaging device 100 forms an image from the light transmitted through the measurement target SP onto the imaging face of the imaging device 100. The imaging device 100 detects the light from the measurement target SP. In other words, the photoelectric conversion unit 12 of the imaging device 100 receives the light from the measurement target SP (herein, transmitted light) to generate signal charge.

At this point, imaging is executed while sinusoidally varying the sensitivity of the imaging cells 10 in the imaging device 100. From the principle discussed earlier, by sinusoidally varying the sensitivity of the imaging cells 10, the component having the same frequency as the frequency of the sensitivity modulation is extracted from the transmitted light. In other words, an image signal corresponding to the same frequency component as the frequency of the sensitivity modulation may be acquired. If the frequency of the sensitivity modulation is modified, an image signal corresponding to the same frequency component as the modified frequency may be acquired. Herein, since the frequency of the variation in the intensity of the transmitted light and the wavelength of the transmitted light correspond in a 1:1 manner, by switching the frequency of the sensitivity modulation, an image signal related to the wavelength corresponding to the frequency may be acquired.

This means that, according to the spectral imaging system 200, by altering the wavelength of the sensitivity control signal supplied to the imaging cells 10, there is obtained data similar to the data obtained by a Fourier transform, but without performing calculations with a computer. According to the spectral imaging system 200, by using analog modulation, a result similar to executing a Fourier transform is output from each imaging cell 10 automatically. In other words, a calculation process performed by a computer is unnecessary, and data similar to the data obtained by a Fourier transform may be acquired in real time.

Moreover, according to the spectral imaging system 200, it is possible to collectively acquire, in multiple imaging cells 10, an image signal corresponding to the same frequency component as the frequency of the sensitivity modulation. In other words, a two-dimensional image may be acquired for each wavelength. The number of imaging cells 10 in the imaging device 100 may be set from several hundred thousand to several million or more. In this way, according to the spectral imaging system 200, by modifying the frequency of the sensitivity modulation, an image related to a specific wavelength may be obtained easily. In the spectral imaging system 200, since an image of the wavelength that one desires to measure is selectively obtained, it is not necessary to execute image capture for all kinds of wavelengths, and the time taken for analysis may be shortened. Even assuming that images are acquired for a number of wavelengths similar to the analysis performed using the infrared spectrophotometer 500 of the comparative example, the required number of images in the image data is at most a few hundred or so, and the time taken for analysis may be shortened compared to the comparative example. Note that in the acquisition of each image, it is sufficient to align the timings of the start and the end of signal charge accumulation among the imaging cells 10, such as by applying a global shutter.

According to the spectral imaging system 200, by using analog modulation, a result similar to executing a Fourier transform is output from each imaging cell 10 automatically, and thus the spectral imaging system 200 is effective in the analysis of samples compared to the infrared spectrophotometer 500 of the comparative example, which is able to measure only one point at a time, and which takes dozens of seconds to perform a single measurement. Also, a calculation process performed by a computer is unnecessary, and thus while the infrared spectrophotometer 500 of the comparative example requires enough memory to be able to hold the interferogram, the spectral imaging system 200 is able to use memory similar to that of a typical digital camera, and does not require a large amount of memory. Furthermore, unlike the infrared spectrophotometer 500 of the comparative example, video imaging is also possible.

As the above description clearly demonstrates, in the spectral imaging system 200, the sensitivity modulation of the imaging cells 10 may be controlled electrically after the fact, and thus image capture corresponding to the wavelength that one desires to measure is possible, without requiring a color filter or a spectroscope. Since a color filter is unnecessary, it is not necessary to lower the resolution even if one desires to measure more wavelengths. Also, it is not necessary to decide the properties of the color filter at the time of fabrication of the imaging device 100. In the spectral imaging system 200, since a spectroscope including components such as a diffraction grating and a prism is unnecessary, miniaturization is comparatively easy, and for example, realizing the spectral imaging system 200 in the form of an attachment that may be attached to a microscope is not impossible.

As illustrated as an example in FIG. 21, the spectral imaging system 200 may include a synchronization circuit 256 that synchronizes the intensity variations in the light emitted towards the subject with the sensitivity control signal supplied to each imaging cell 10 of the imaging device 100. For example, the synchronization circuit 256 synchronizes a driving signal supplied to the light source of the illumination device with the sensitivity control signal supplied to each imaging cell 10 of the imaging device 100. In this example, the synchronization circuit 256 synchronizes the sensitivity control signal to the variation over time in the light intensity by supplying a control signal to the driving mechanism of the moving mirror 248 and to the imaging device 100. As a result, it is possible to align the phase of the variation over time in the brightness of the subject with the phase of the variation over time in the sensitivity of the imaging cells 10. The synchronization circuit 256 may also be part of the imaging device 100 or the illumination device 250. A configuration may also be adopted in which the driving signal of the imaging cells 10 and the driving signal of the illumination device 250 (in this example, the driving signal with respect to the driving mechanism of the moving mirror 248) are shared in common between the imaging device 100 and the illumination device 250. A signal for synchronizing the driving signal of the imaging cells 10 and the driving signal of the illumination device 250 may also be generated by one of either the imaging device 100 or the illumination device 250, and supplied to the other.

Figure 24:
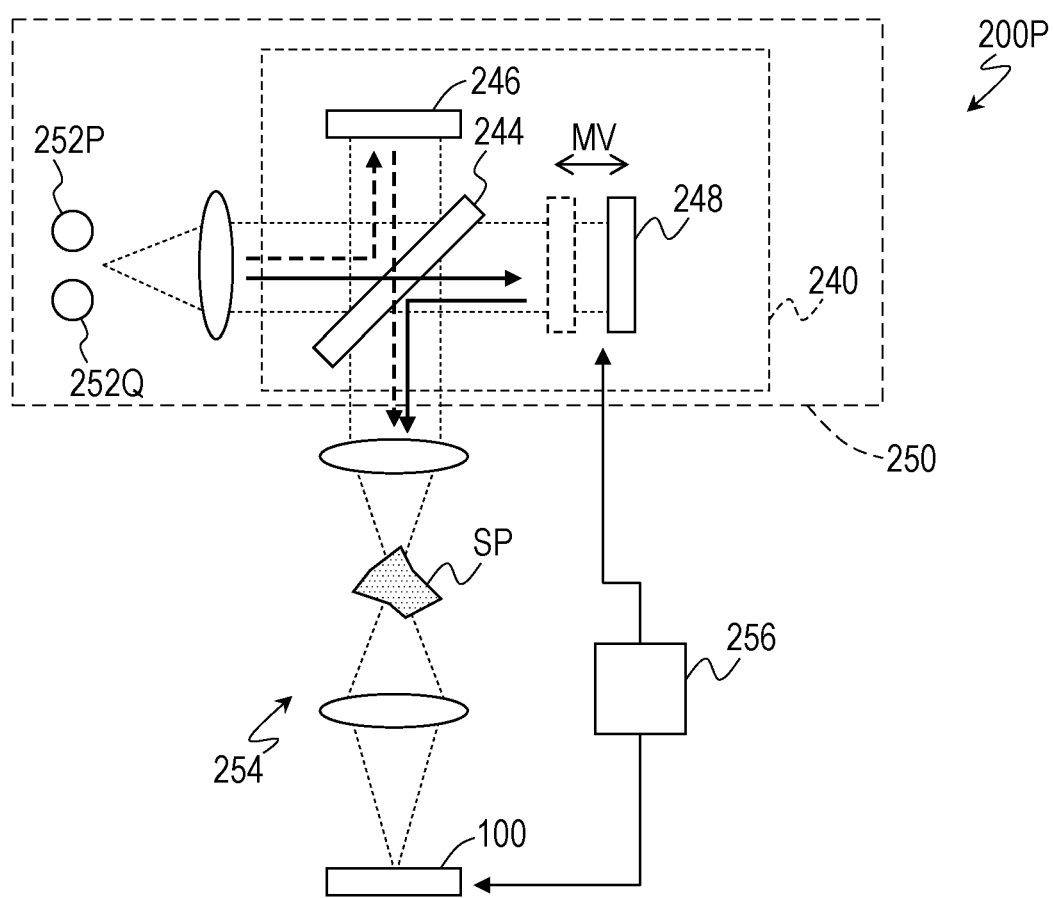
FIG. 24 is a diagram illustrating an example of the configuration of a spectral imaging system including an illumination device in which multiple monochromatic light sources are applied.

FIG. 21 illustrates a Michelson interferometer as an example of the interferometer 240, but an interferometer such as a Fabry-Perot interferometer or a Mach-Zehnder interferometer may also be used. Additionally, instead of the light source 252, multiple monochromatic light sources (such as light-emitting diodes (LEDs)) may be used. FIG. 24 illustrates an example of the configuration of a spectral imaging system 200P including an illumination device 250P applying multiple monochromatic light sources. The spectral imaging system 200P illustrated in FIG. 24 includes monochromatic light sources 252P and 252Q. For the light sources 252P and 252Q, it is sufficient to select light sources having mutually different wavelengths of emitted light. The number of light sources in the illumination device 250P may be modified as appropriate in accordance with the number of wavelengths that one desires to measure.

In this way, prior to imaging, the subject may be irradiated with light whose intensity varies over time. In the example described with reference to FIGS. 21 to 24, modulation at mutually different frequencies is imparted to the light having mutually different wavelengths. However, the configuration is not limited to this example, and modulation at mutually different frequencies may also be imparted to light having mutually different polarizations, for example. By imparting modulation at mutually different frequencies to light having mutually different polarizations, it is possible to construct an observation system capable of acquiring information related to the subject's reflection characteristics with respect to polarized light.

(Tumor Observation System)

Fluorescence diagnosis, which identifies the position of a tumor by utilizing fluorophore molecules that accumulate specifically in tumors, is a known technology. With fluorescence diagnosis, 5-am inolevulinic acid (5-ALA) is administered to a patient, and a site on which to operate is irradiated with excitation light. Since 5-aminolevulinic acid accumulates specifically in tumors, the shape and position of a tumor may be identified by using fluorescent light emitted from the 5-aminolevulinic acid as a marker. However, since this fluorescent light is not very strong, observation of the fluorescent light requires lowering the ambient illumination.

Figure 25:
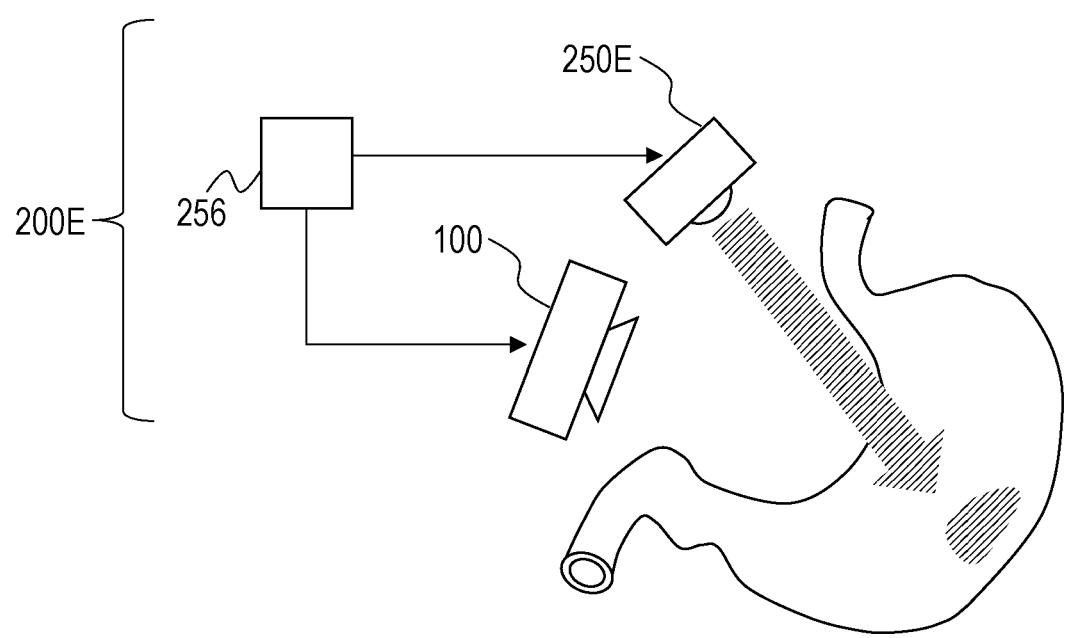
FIG. 25 is a diagram illustrating an example applying an imaging system according to an embodiment of the present disclosure to a tumor observation system.

FIG. 25 illustrates an example applying an imaging system according to an embodiment of the present disclosure to a tumor observation system. The tumor observation system 200E illustrated in FIG. 25 includes an illumination device 250E that radiates excitation light, and the imaging device 100 that detects fluorescent light emitted from a tumor. In this example, the tumor observation system 200E additionally includes the synchronization circuit 256.

The illumination device 250E irradiates a target site with excitation light whose intensity is modulated at a certain frequency. The radiation of the intensity-modulated excitation light causes fluorophore molecules accumulated in a tumor to emit fluorescent light whose intensity varies at a certain frequency in tune with the frequency of the intensity modulation of the excitation light. By capturing this fluorescent light while modulating the sensitivity of the imaging cells 10 in the imaging device 100 at the same frequency as the frequency of the intensity modulation of the excitation light, it is possible to obtain an image (still image or moving image) in which the fluorescent light of modulated intensity is selectively and strongly depicted.

In this example, the synchronization circuit 256 supplies the illumination device 250E and the imaging device 100 with a control signal that adjusts the phase of the modulation of the excitation light radiated from the illumination device 250E and the phase of the modulation of the sensitivity of the imaging cells 10. By adjusting the phase of the periodic variation in the sensitivity of the imaging cells 10, the site from which the fluorescent light is emitted may be emphasized further. Consequently, it is possible to identify the shape and position of a tumor without lowering the ambient illumination.

(Target Detection System)

Figure 26:
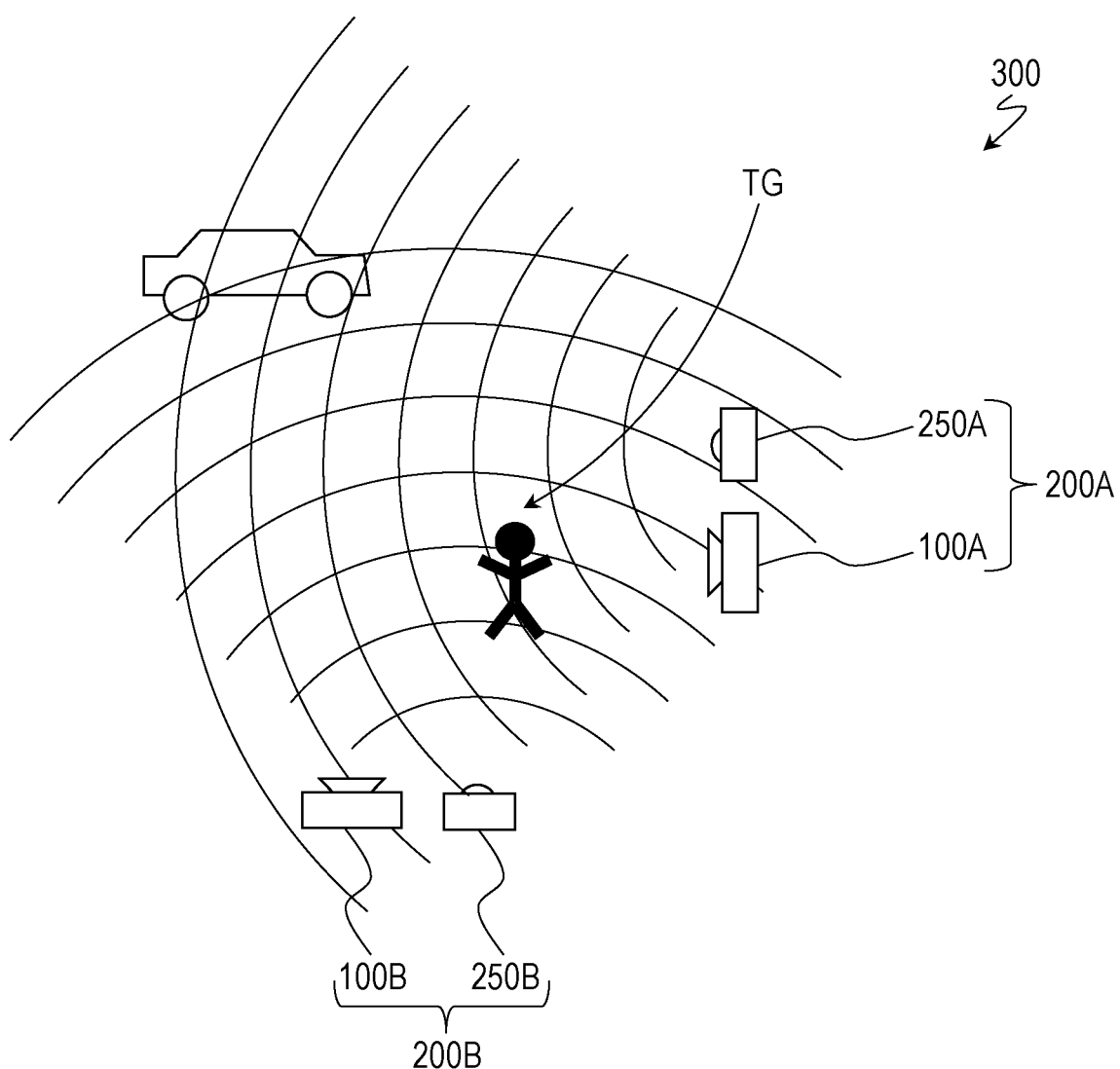
FIG. 26 is a diagram illustrating an example applying an imaging system according to an embodiment of the present disclosure to a target detection system.

FIG. 26 illustrates an example applying an imaging system according to an embodiment of the present disclosure to a target detection system. The imaging systems 200A and 200B illustrated in FIG. 26 include a pair of an illumination device 250A and an imaging device 100A, and a pair of an illumination device 250B and an imaging device 100B, respectively. For the imaging devices 100A and 100B, a configuration similar to the imaging device 100 discussed earlier may be applied. The imaging systems 200A and 200B may be target detection systems that may be installed onboard a vehicle such as a passenger car, for example. The imaging systems 200A and 200B may be fixed-point imaging systems at stationary positions.

The illumination device 250A of the imaging system 200A emits intensity-modulated light. The light emitted from the illumination device 250A is reflected by a target TG (an object such as an obstruction or another vehicle; herein, a pedestrian) in front of the illumination device 250A, for example. The intensity of the reflected light from the target TG expresses similar variation over time as the intensity of the light emitted from the illumination device 250A. When the illumination device 250A emits light of periodically varying intensity towards the target TG, for example, the intensity of the reflected light from the target TG expresses the same periodic variation as the emitted light from the illumination device 250A. However, a phase difference corresponding to the distance from the illumination device 250A to the target TG is produced between the light emitted from the illumination device 250A and the reflected light from the target TG.

The imaging device 100A of the imaging system 200A receives light reflected from the target TG. At this point, the sensitivity of each imaging cell 10 in the imaging device 100A is modulated by a first sensitivity control signal having a waveform similar to the waveform expressing the modulation of the intensity of the light emitted from the illumination device 250A. For the first sensitivity control signal, a signal having a waveform expressed by a first function that takes only positive values by adding a first constant to one of the bases of a system of functions constituting an orthogonal system may be used.

As discussed above, a phase discrepancy corresponding to the distance from the illumination device 250A to the target TG is produced between the emitted light from the illumination device 250A and the reflected light from the target TG. On the basis of the phase difference produced in the reflected light, the distance to the target TG may be calculated. Such a method of measuring distance is called the time-of-flight (TOF) method.

In the configuration illustrated as an example in FIG. 26, the imaging system 200B also executes operations similar to the imaging system 200A. However, in this case, a signal having a waveform expressed by a second function different from the first function is used as a second sensitivity control signal supplied to each imaging cell 10 in the imaging device 100B. The second function is a function that takes only positive values by adding a constant to another one of the bases of the system of functions discussed above. In other words, in this case, on the basis of the mutually different bases selected from the same system of orthogonal functions, a first sensitivity control signal having a waveform expressed by a first function and a second sensitivity control signal having a waveform expressed by a second function are generated.

As illustrated in FIG. 26, it is readily conceivable that multiple imaging systems (in this case, the imaging systems 200A and 200B used as target detection systems) may be used at the same time. At this point, the imaging device 100A of the imaging system 200A receives not only the light emitted from the illumination device 250A and reflected from the target TG, but also the light emitted from the illumination device 250B of the imaging system 200B and reflected from the target TG. As described hereinafter, by applying a first sensitivity control signal and a second sensitivity control signal generated on the basis of mutually different bases selected from the same system of orthogonal functions to the imaging systems 200A and 200B, respectively, cross talk between the imaging systems 200A and 200B may be avoided. From this perspective, the entirety of multiple imaging systems including the imaging systems 200A and 200B may also be treated as constituting a target detection system 300.

At this point, an example of utilizing a system of Walsh functions as the system of orthogonal functions for the modulation of the illuminating light and the sensitivity will be described. First, a system of Walsh functions will be described briefly. A Walsh function, which acts as the basis of a system of Walsh functions, is a periodic function decided by the values of elements in each row of a Walsh matrix. Provided that n is a natural number, a Walsh function of length $2^n$ is decided by the values of elements in each row of a Walsh matrix of the $2^n$th order. A Walsh matrix is a matrix obtained by rearranging rows in a Hadamard matrix on the basis of sequency related to zero crossings. A Hadamard matrix of $2^n$th order is given recursively by the following Formulas 15 and 16, while a Walsh matrix W(16) of 16th order is expressed in the form of the following Formula 17, for example.

number of zero crossings on the row above that row. For a Walsh function of length $2^n$, $2^n$ possibilities exit, of which one is a constant function. In this specification, the kth (where k is a natural number) Walsh function of length d with respect to time $\tau$ is designated $\omega_{d,k}(\alpha, \tau)$. Herein, a is a constant that expresses phase. In the following, $0 \leq \alpha \leq 1$ is taken to hold true, and the phase $\alpha$ is specified as a ratio with respect to the period.

Figure 27:
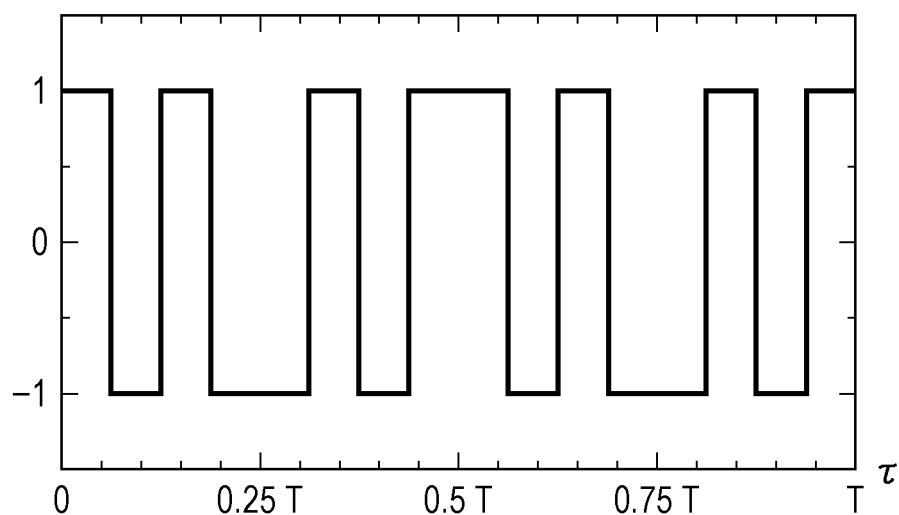
FIG. 27 is a graph of $W_{16,13}(0,\tau)$.
Figure 28:
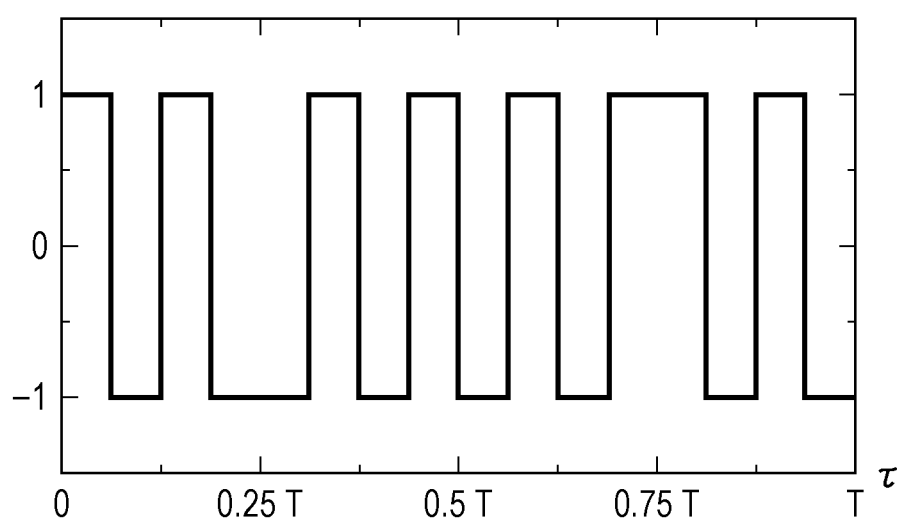
FIG. 28 is a graph of $W_{16,14}(0,\tau)$.

For example, $W_{16,13}(0, \tau)$ is determined by the arrangement of 1 and −1 {1, −1, 1, −1, −1, 1, −1, 1, 1, −1, 1, −1, −1, 1, −1, 1} on the 13th row of W(16) indicated in Formula 17. Similarly, $W_{16,14}(0, \tau)$ is determined by the arrangement of 1 and −1 {1, −1, 1, −1, −1, 1, −1, 1, −1, 1, −1, 1, 1, −1, 1, −1} on the 14th row of W(16) indicated in Formula 17. FIGS. 27 and 28 illustrate specific graphs of $W_{16,13}(0, \tau)$ and $W_{16,14}(0, \tau)$, respectively. In FIGS. 27 and 28, the horizontal axis represents the time and the period is taken to be T. As FIGS. 27 and 28 demonstrate, each Walsh function is a piecewise continuous function that takes a value of either 1 or −1 at each point. The integral value over one period of a non-constant Walsh function (that is, k≠1) is 0.

Figure 29:
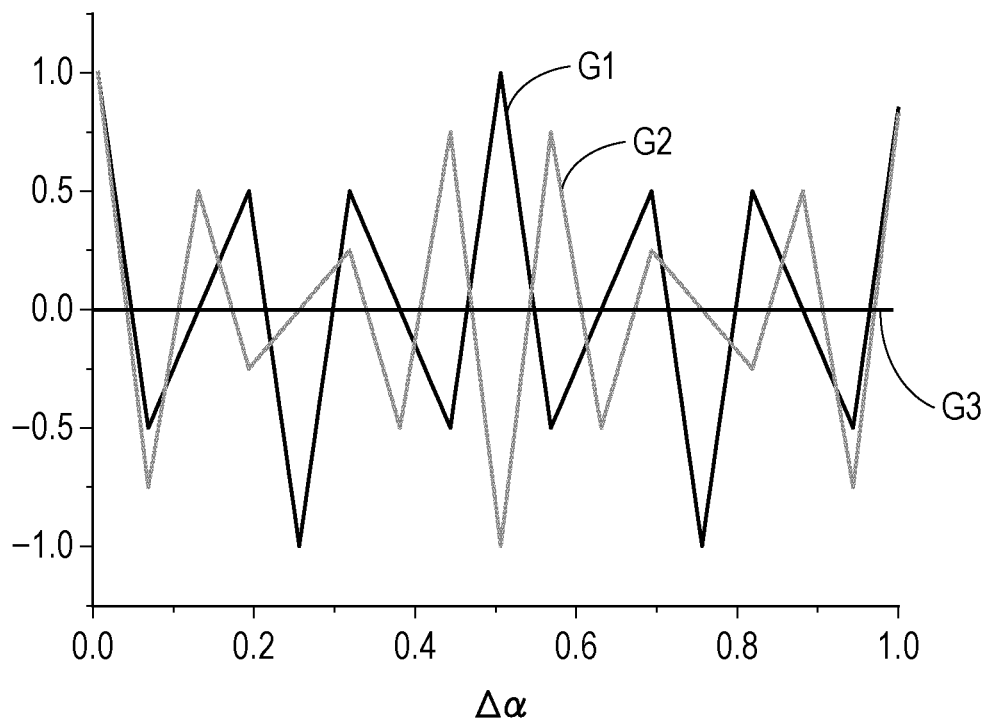
FIG. 29 is a diagram for explaining a dependence with respect to phase difference of the integral value over one period of the product of two Walsh functions of equal length.

FIG. 29 is a diagram for explaining a dependence with respect to phase difference of the integral value over one period (hereinafter designated the "one-period average") of the product of two Walsh functions of equal length. In FIG. 29, the horizontal axis represents the phase difference $\Delta\alpha$ of the two Walsh functions, while the vertical axis represents the one-period average of the product of the two Walsh functions. In FIG. 29, the graph G1 indicates the one-period average of the product between $W_{16,13}(\alpha_a, \tau)$ and $W_{16,13}(\alpha_b, \tau)$, while the graph G2 indicates the one-period average between $W_{16,14}(\alpha_a, \tau)$ and $W_{16,14}(\alpha_b, \tau)$. In other words, $\Delta\alpha = |\alpha_a - \alpha_b|$. In FIG. 29, the graph G3 indicates the one-period average of the product between $W_{16,13}(\alpha_a, \tau)$ and $W_{16,14}(\alpha_b, \tau)$.

The graphs G1 and G2 in FIG. 29 demonstrate that the one-period average of the product between the same Walsh $$H(2^1) = \begin{bmatrix} 1 & 1 \\ 1 & -1 \end{bmatrix} \tag{15}$$

$$H(2^{n+1}) = \begin{bmatrix} H(2^n) & H(2^n) \\ H(2^n) & -H(2^n) \end{bmatrix} \tag{16}$$

$$W(16) = \begin{bmatrix}
1 & 1 & 1 & 1 & 1 & 1 & 1 & 1 & 1 & 1 & 1 & 1 & 1 & 1 & 1 & 1 \\
1 & 1 & 1 & 1 & 1 & 1 & 1 & 1 & -1 & -1 & -1 & -1 & -1 & -1 & -1 & -1 \\
1 & 1 & 1 & 1 & -1 & -1 & -1 & -1 & -1 & -1 & -1 & -1 & 1 & 1 & 1 & 1 \\
1 & 1 & 1 & 1 & -1 & -1 & -1 & -1 & 1 & 1 & 1 & 1 & -1 & -1 & -1 & -1 \\
1 & 1 & -1 & -1 & -1 & -1 & 1 & 1 & 1 & 1 & -1 & -1 & -1 & -1 & 1 & 1 \\
1 & 1 & -1 & -1 & -1 & -1 & 1 & 1 & -1 & -1 & 1 & 1 & 1 & 1 & -1 & -1 \\
1 & 1 & -1 & -1 & 1 & 1 & -1 & -1 & -1 & -1 & 1 & 1 & -1 & -1 & 1 & 1 \\
1 & 1 & -1 & -1 & 1 & 1 & -1 & -1 & 1 & 1 & -1 & -1 & 1 & 1 & -1 & -1 \\
1 & -1 & -1 & 1 & 1 & -1 & -1 & 1 & 1 & -1 & -1 & 1 & 1 & -1 & -1 & 1 \\
1 & -1 & -1 & 1 & 1 & -1 & -1 & 1 & -1 & 1 & 1 & -1 & -1 & 1 & 1 & -1 \\
1 & -1 & -1 & 1 & -1 & 1 & 1 & -1 & -1 & 1 & 1 & -1 & 1 & -1 & -1 & 1 \\
1 & -1 & -1 & 1 & -1 & 1 & 1 & -1 & 1 & -1 & -1 & 1 & -1 & 1 & 1 & -1 \\
1 & -1 & 1 & -1 & -1 & 1 & -1 & 1 & 1 & -1 & 1 & -1 & -1 & 1 & -1 & 1 \\
1 & -1 & 1 & -1 & -1 & 1 & -1 & 1 & -1 & 1 & -1 & 1 & 1 & -1 & 1 & -1 \\
1 & -1 & 1 & -1 & 1 & -1 & 1 & -1 & -1 & 1 & -1 & 1 & -1 & 1 & -1 & 1 \\
1 & -1 & 1 & -1 & 1 & -1 & 1 & -1 & 1 & -1 & 1 & -1 & 1 & -1 & 1 & -1
\end{bmatrix} \tag{17}$$

As Formula 17 demonstrates, the arrangement of 1 and −1 in each row of W(16) is different for each row, and the number of zero crossings on any row is one more than the functions varies in accordance with the phase difference $\Delta\alpha$ irrespectively of which Walsh functions are multiplied together in the integrand function, and reaches a local maximum or a local minimum when $\Delta\alpha=0$, or in other words, when the Walsh functions are in-phase. On the other hand, the graph G3 demonstrates that the one-period average of the product between two different Walsh functions becomes 0, irrespectively of the phase difference $\Delta\alpha$.

The target detection system 300 illustrated in FIG. 26 utilizes such properties of Walsh functions. Namely, in the imaging systems 200A and 200B, non-constant Walsh functions of the same length which are also different from each other are applied to the modulation of the intensity of light radiated from the illumination device and the modulation of the sensitivity of the imaging cells in the imaging devices. For example, a signal having a waveform expressed by a first function that takes only positive values by adding a first constant to a first Walsh function is used as the driving signal supplied to the light source of the illumination device 250A of the imaging system 200A. Additionally, a signal having a waveform expressed by a second function that takes only positive values by adding a second constant to a second Walsh function is used as the driving signal supplied to the light source of the illumination device 250B of the imaging system 200B. The first Walsh function and the second Walsh function are mutually different, non-constant Walsh functions selected from a group of Walsh functions of the same length.

At this point, the intensity $I_1(\tau)$ of light emitted from the illumination device 250A of the imaging system 200A and the intensity $I_2(\tau)$ of light emitted from the illumination device 250B of the imaging system 200B are expressed by Formulas 18 and 19 below, respectively. In Formulas 18 and 19, $A_1$ and $A_2$ are positive constants, while $C_1$ and $C_2$ are constants greater than 1.

$$I_1(\tau)=A_1(W_{d,k1}(\alpha_1,\tau)+C_1) \qquad (18)$$

$$I_2(\tau)=A_2(W_{d,k2}(\alpha_2,\tau)+C_2) \qquad (19)$$

The brightness of the target TG received the light emitted from the illumination device 250A of the imaging system 200A and the light emitted from the illumination device 250B of the imaging system 200B varies over time. At this point, considering the imaging device 100A of the imaging system 200A, since the brightness of the target TG varies over time, the intensity of light reflected by the target TG and arriving at the imaging cells 10 of the imaging device 100A, or in other words, the illuminance $L(\tau)$ with respect to the imaging cells 10, also varies over time. This variation over time in the illuminance $L(\tau)$ includes a component $L_1(\tau)$ corresponding to the variation over time in the intensity of light emitted from the illumination device 250A, and a component $L_2(\tau)$ corresponding to the variation over time in the intensity of light emitted from the illumination device 250B. Consequently, the illuminance may be written as in Formula 20 below.

$$L(\tau)=B_1(W_{d,k1}(\beta_1,\tau)+C_1)+B_2(W_{d,k2}(\beta_2,\tau)+C_2) \qquad (20)$$

In Formula 20, $B_1$ is a constant determined by the relative positional relationship between the target TG and the imaging system 200A, as well as the reflectance of the target TG. $B_2$ is a constant determined by the relative positional relationship between the target TG, the illumination device 250B of the imaging system 200B, and the imaging device 100A of the imaging system 200A, as well as the reflectance of the target TG. The phase $\beta_1$ is determined in accordance with the distance between the imaging system 200A and the target TG. Provided that D is the distance between the imaging system 200A and the target TG, and c is the speed of light, $\beta_1=\alpha_1+(2D/c)$ holds true. If one assumes that the distance D is 0, then $\beta_1=\alpha_1$, and the phase of the modulation of light emitted from the illumination device 250A is in alignment with the phase of the component corresponding to the light emitted from the illumination device 250A from among the variations in illuminance detected by the imaging cells 10. Note that the phase $\beta_1$ expresses a periodic variation as the distance D increases. Hereinafter, to keep the description from becoming excessively complex, 2D<cT is assumed to hold true. Generality is not lost even with such an assumption.

Provided that $S_1(\tau)$ is the variation over time in the sensitivity of the imaging cells 10 in the imaging device 100A, the total amount of signal charge $Q_t$ accumulated in the charge accumulation region of the imaging device 100 in the exposure period may be written as in Formula 21 below. The length of the exposure period is set to be equal to a natural multiple of the period T of the Walsh functions. In Formula 21, F is a proportional constant.

$$Q_t=F\int_0^T(B_1(W_{d,k1}(\beta_1,\tau)+C_1)+B_2(W_{d,k2}(\beta_2,\tau)+C_2))\cdot S_1(\tau)d\tau \qquad (21)$$

At this point, by supplying a sensitivity control signal having a waveform expressed by a first function that takes only positive values by adding a first constant to a first Walsh function, the sensitivity of the imaging cells 10 in the imaging device 100A is modulated. In other words, the first function expressed by Formula 22 below is applied as $S_1(\tau)$.

$$S_1(\tau)=D_1(W_{d,k1}(\gamma_1,\tau)+E_1) \qquad (22)$$

In Formula 22, $D_1$ is a positive constant, $E_1$ is a constant greater than 1, and $\gamma_1$ expresses the phase. As Formula 22 and the earlier Formula 18 demonstrate, the same Walsh function as the Walsh function applied to the modulation of the light emitted from the illumination device 250A is applied to the modulation of the sensitivity of the imaging cells 10 in the imaging device 100A. Since the imaging system 200A includes the pair of the imaging device 100A and the illumination device 250A, applying the same Walsh function to the sensitivity modulation of the imaging cells 10 and the modulation of the emitted light from the illumination device 250A inside the imaging system 200A is easy. If necessary, the phase of the sensitivity modulation of the imaging cells 10 may be aligned with the phase of the modulation of the emitted light from the illumination device 250A by a synchronization circuit.

From the above Formulas 21 and 22, the following Formula 23 is obtained.

$$Q_t=D_1F\int_0^T B_1 W_{d,k1}(\beta_1,\tau)W_{d,k1}(\gamma_1,\tau)+B_2 W_{d,k2}(\beta_2,\tau) W_{d,k1}(\gamma_1,\tau)+B_1E_1 W_{d,k1}(\beta_1,\tau)+B_2E_1 W_{d,k2}(\beta_2,\tau)+(B_1C_1+B_2C_2)W_{d,k1}(\gamma_1,\tau)+E_1(B_1C_1+B_2C_2))d\tau \qquad (23)$$

In Formula 23, since the second term of the integrand function is the product of mutually different Walsh functions selected from a common system of Walsh functions, as described with reference to FIG. 29, the result of the integral over the term [0, T] (that is, the one-period average) is 0, irrespectively of the value of the phase difference $|\beta_2-\gamma_1|$. The third, fourth, and fifth terms in the integrand function only include one Walsh function (which is not a constant function), and thus the one-period average is 0. Note that when the exposure period and the Walsh function term do not match, all of the above increase monotonically as the exposure period increases. The sixth term of the integrand function, which does not include a Walsh function, increases monotonically as the exposure period increases.

On the other hand, the first term in the integrand function is the product of a Walsh function with itself. For this reason, as described with reference to FIG. 29, the one-period average which is the result of the integral varies in accordance with the difference between the phase $\beta_1$ of the component due to the intensity modulation of the light emitted from the illumination device 250A and the phase $\gamma_1$ of the sensitivity modulation of the imaging cells 10 from among the variation over time in the illuminance, and in addition, increases proportionally with the exposure period. For an exposure period of a certain length, the one-period average of the first term takes a local maximum value or a local minimum value when the phase $\beta_1$ and the phase $\gamma_1$ are aligned, for example.

Consequently, for example, if imaging is performed multiple times while altering the phase $\gamma_1$ of the sensitivity modulation of the imaging cells 10 to find the value of $\gamma_1$ at which the total amount of signal charge $Q_t$ accumulated in the charge accumulation region reaches a local maximum or local minimum, based on the relationship $\beta_1 = \alpha_1 + (2D/c)$, it is possible to compute the distance between the imaging system 200A and the target TG. Note that, as described with reference to FIG. 13, if multiple imaging cells 10 are divided into groups, and imaging is performed while altering the phase of the sensitivity modulation for each group, the phase at which the total amount of charge $Q_t$ accumulated in the charge accumulation region reaches a local maximum or local minimum may be computed quickly.

Likewise, in the imaging system 200B, it is possible to compute the distance between the imaging system 200B and the target TG according to a similar principle. In this way, by using mutually different Walsh functions of the same length among multiple target detection systems, the imaging device of each imaging system is able to selectively acquire information related to brightness variations produced in the target TG by the emitted light from the corresponding illumination device (in the case of the imaging device 100A, the illumination device 250A inside the same system), without being affected by emitted light from another imaging system. In other words, by using functions that take only positive values by adding a constant to mutually different bases selected from a certain system of orthogonal functions as the functions to use for modulation among multiple imaging systems, it is possible to prevent crosstalk among the multiple imaging systems, even when used at the same time.

In the target detection system 300 discussed above, the wavelength of the light irradiating the target TG may be the same or different among the multiple illumination devices. According to the target detection system 300 discussed above, it is also possible to use light having a wavelength in the visible range, and consequently, the range of wavelength selection is broad. According to an embodiment of the present disclosure, disposing the imaging cells 10 in the imaging devices (for example, the imaging devices 100A and 100B) in an array is also easy, and consequently, it is also possible to acquire a depth map while minimizing crosstalk.

The functions to use for modulation in the imaging systems 200A and 200B are not required to be fixed from the beginning. The modulation of the intensity of light arriving from the target TG may be detected, and the function applied to the modulation in the illumination device and the imaging device may be modified dynamically. For example, in the case of detecting that the intensity of light arriving from the target TG exhibits variation expressed by a certain basis of a certain system of orthogonal functions, the function applied to the modulation in the illumination device and the imaging device may be modified dynamically to another basis in that system of orthogonal functions.

It is easily understood that the target detection system 300 discussed above is extensible to a system that includes a greater number of imaging systems. As the number of imaging systems which may be used at the same time increases, it is sufficient to apply a system of Walsh functions of greater length. If mutually different Walsh functions other than a constant function are utilized in the modulation among different imaging systems, crosstalk among these imaging systems may be avoided, even in the case of irradiating the same target at the same time with intensity-modulated light from three or more illumination devices.

Note that if modulation using mutually different orthogonal functions is applied among mutually different imaging systems, communication enabling the acquisition of information may be conducted only by the imaging device to which is applied the intensity modulation that matches the modulation of the emitted light from the illumination device. For example, as discussed earlier, if modulation using mutually different orthogonal functions is applied among mutually different imaging systems, it is also possible to use light having a wavelength in the visible range, and thus visible-light communication is possible. The basis used for the intensity modulation of the illumination device may be shared in common between a sender and a receiver of information as a shared key. The receiver receives emitted light from the illumination device on the sender's side, or alternatively, light reflected by some kind of object, with an imaging device in which the sensitivity of the imaging cells is modulated by applying the basis acting as the shared key. With this imaging device, the receiver possessing the shared key is able to acquire the image intended by the sender. Conversely, a third party not possessing the shared key is unable to reconstruct the information transmitted from the illumination device on the sender's side. In other words, encrypted communication is possible. Furthermore, encrypted communication using visible light is possible.

(Phosphorescence Imaging)

The delta function is another example of a valid function for sensitivity modulation. As described hereinafter, by using a sensitivity control signal having a pulse waveform, it is possible to map the oxygen concentration inside living tissue, for example. Hereinafter, an example of using the imaging device 100 to image phosphorescence from a light-emitting probe incorporated into living tissue will be described.

Herein, an iridium complex (BTP) is used as the light-emitting probe. Formula c1 below illustrates the structure of BTP.

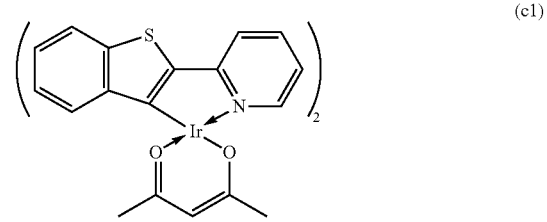

(c1)

The BTP incorporated into living tissue is irradiated with excitation light and emits phosphorescence. Phosphorescence has a long emission lifetime compared to fluorescence. Whereas fluorescence attenuates on the order of nanoseconds, phosphorescence attenuates on the order of microseconds to milliseconds. However, the emission intensity and emission lifetime of phosphorescence varies depending on the surrounding oxygen concentration of the molecules that emit phosphorescence.

Figure 30:
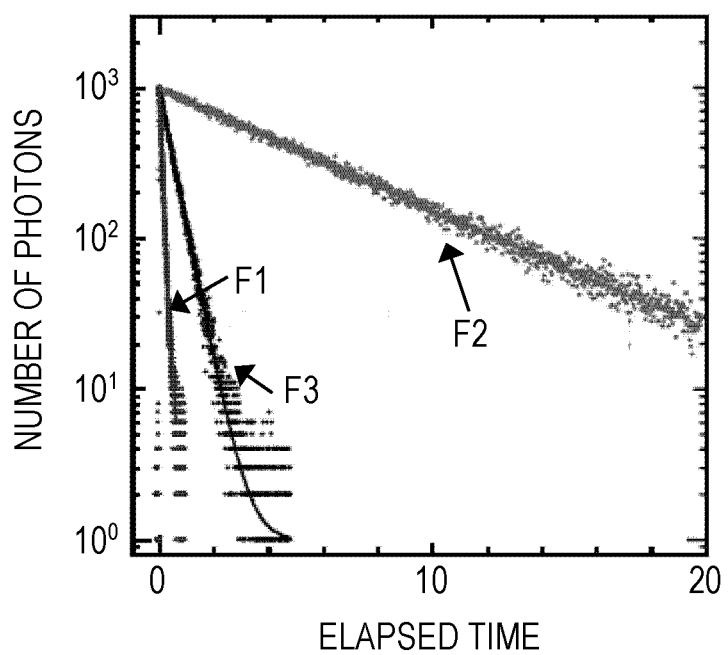
FIG. 30 is a graph illustrating an example of a relationship between a variation in intensity of phosphorescence and surrounding oxygen concentration.

FIG. 30 illustrates an example of a relationship between the variation in intensity of phosphorescence and the surrounding oxygen concentration. In FIG. 30, the horizontal axis represents the elapsed time since the radiation of excitation light, while the vertical axis represents, on a logarithmic scale, the number of photons detected per unit time. The graphs F1 and F2 illustrate examples of the intensity variation of phosphorescence when the surrounding oxygen concentration of BTP is 100% and 0%, respectively. Note that the graph F3 in FIG. 30 illustrates the intensity variation of phosphorescence under ventilation. In the example illustrated in FIG. 30, the emission lifetimes of phosphorescence when the surrounding oxygen concentration of BTP is 100% and 0% are approximately 95 (ns) and 5.3 (μs), respectively.

Figure 31:
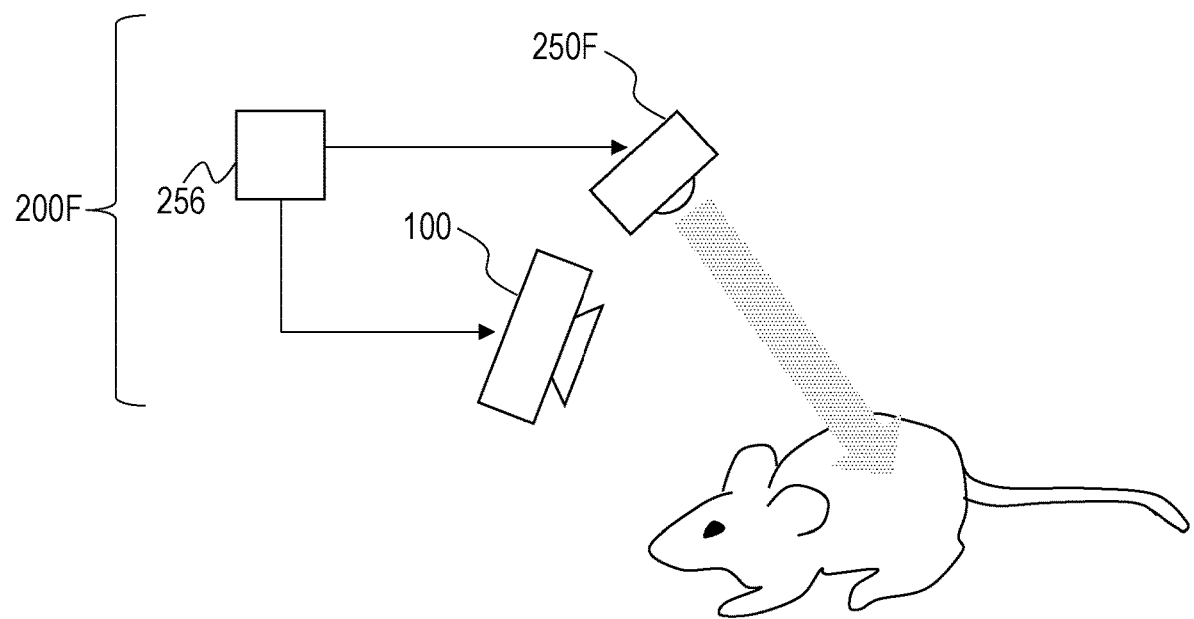
FIG. 31 is a schematic diagram illustrating an example applying an imaging system according to an embodiment of the present disclosure to a phosphorescence observation system.

FIG. 31 illustrates an example applying an imaging system according to an embodiment of the present disclosure to a phosphorescence observation system. The phosphorescence observation system 200F illustrated in FIG. 31 includes an illumination device 250F that radiates excitation light toward a subject, and the imaging device 100. In this example, the phosphorescence observation system 200F additionally includes the synchronization circuit 256. The illumination device 250F irradiates the subject with light whose intensity varies in a pulsed manner.

Figure 32:
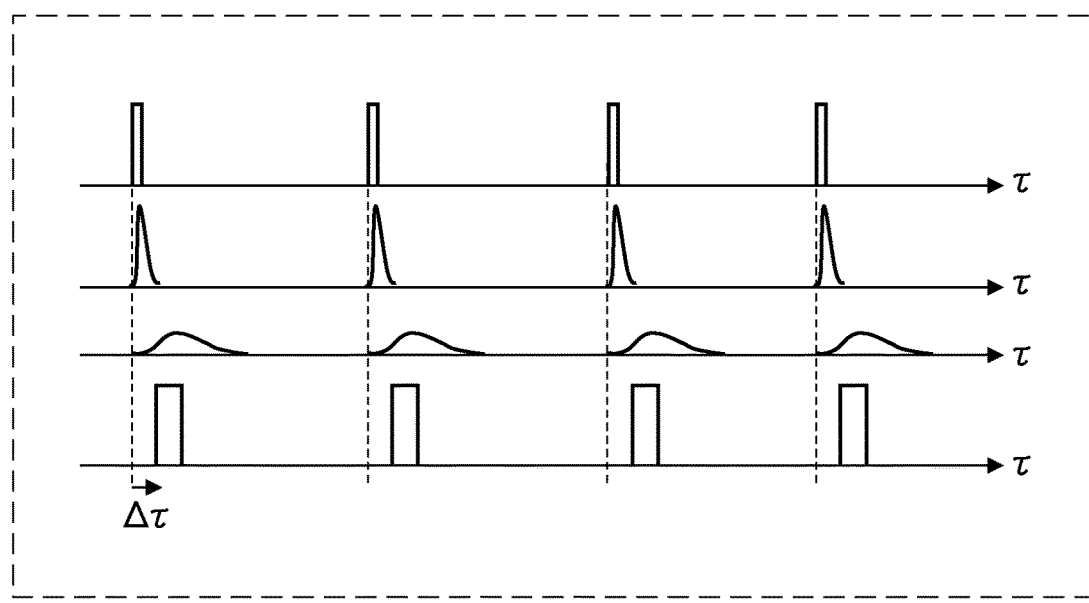
FIG. 32 is a diagram for explaining an operating example when an imaging system of the present disclosure is applied to the capture of phosphorescence emitted from BTP.

FIG. 32 is a diagram for explaining an operating example when an imaging system of the present disclosure is applied to the imaging of phosphorescence emitted from BTP. In FIG. 32, the first chart from the top illustrates a typical example of a driving pulse of a light source in the illumination device 250, while the second and third charts from the top schematically illustrate the intensity variation of fluorescence and phosphorescence, respectively, emitted from BTP inside living tissue due to the radiation of excitation light from the illumination device 250. Herein, the radiation time of the excitation light is less than a microsecond. The radiation of excitation light produces fluorescence and phosphorescence. As discussed above, whereas fluorescence attenuates on the order of nanoseconds, phosphorescence attenuates on the order of microseconds to milliseconds.

The bottom chart in FIG. 32 illustrates a typical example of the waveform of a sensitivity control signal supplied to the imaging cells 10 of the imaging device 100. Herein, the sensitivity control line 82 supplies to each imaging cell a sensitivity control signal having a pulse waveform corresponding to the waveform of the delta function. However, since achieving the waveform of the delta function in the sensitivity control signal is impossible in the strict sense, the waveform of the delta function is approximated by a sensitivity control signal with a square pulse having a waveform that goes to high level over a sufficiently short term (for example, approximately 100 ns (nanoseconds)) with respect to the exposure period. Since the sensitivity control signal has a pulse waveform corresponding to the waveform of the delta function, in this example, the waveform expressing the variation in the sensitivity of each imaging cell 10 also has a pulse shape.

As illustrated schematically in FIG. 32, in this example, the leading edge of the pulse waveform of the sensitivity control signal has a delay of Δτ with respect to the leading edge of the driving pulse of the light source. In other words, the sensitivity of the imaging cells 10 varies in a pulse shape, delayed by a certain constant time Δτ from the radiation of the excitation light. By varying the signal level of the sensitivity control signal to be sensitive at different timings from the emission of fluorescence, the phosphorescence may be captured selectively, and an image may be acquired in which the effects of fluorescence are moderated. The timing of the leading edge of the pulse waveform of the sensitivity control signal with respect to the leading edge in the driving pulse of the light source may be modified arbitrarily by the synchronization circuit 256. For example, by supplying a control signal from the synchronization circuit 256 to the illumination device 250F and the imaging device 100, the variation in the sensitivity of the imaging cells 10 and the variation in the intensity of the light radiated from the illumination device 250F (in this example, excitation light) may be synchronized. In this specification, "synchronization" is not limited to the alignment of the leading edges or the trailing edges of signals, and like this example, may also include adjusting the timings of the leading edges or the trailing edges among multiple signals.

As illustrated in FIG. 32, by repeating such an imaging cycle multiple times, signal charge is accumulated, and an image signal of sufficiently high level may be obtained. In other words, after resetting each of the imaging cells 10, the subject is irradiated with pulsed excitation light, and after delaying a desired amount of time from the radiation of the excitation light, the sensitivity of the imaging cells 10 is varied in a pulsed manner, and the accumulation of signal charge is executed. This cycle of excitation light radiation and signal charge accumulation is executed a desired number of times at terms. After that, the amount of signal charge ultimately accumulated in the charge accumulation region is read out. In this example, the exposure period includes multiple signal charge accumulation terms.

In a photoelectron conversion area having a sandwich structure, in a state in which a bias voltage is not applied to the photoelectric conversion layer, little to no movement of charge between the photoelectric conversion layer and the electrodes is produced. For this reason, in a state in which the signal level supplied from the sensitivity control line 82 is lowered, little to no movement of signal charge from the charge accumulation region to the photoelectric conversion unit 12 is produced. Consequently, it is possible to realize the accumulation of signal charge comparatively easily by applying a pulsed sensitivity control voltage multiple times at terms, as illustrated in FIG. 32. Note that in the imaging of each cycle, imaging is executed with a global shutter.

As illustrated in FIG. 30, the emission lifetime of phosphorescence is different depending on the surrounding oxygen concentration of the BTP. For this reason, by conducting imaging while altering the time Δτ from the radiation of excitation light until the leading edge of the sensitivity of the imaging cells 10, different images corresponding to the surrounding oxygen concentration of the BTP may be acquired. In other words, information related to the oxygen concentration inside the living tissue may be obtained. In this way, according to an embodiment of the present disclosure, non-invasive measurement of oxygen concentration is possible. Mapping related to oxygen concentration is also useful in specifying the location of cancer. The oxygen concentration in cancer tissue is lower than the oxygen concentration in normal tissue. Consequently, by acquiring a mapping image related to oxygen concentration, and specifying a site with peculiarly low oxygen concentration, it is possible to specify the location of cancer tissue. Note that the above-described imaging, in which a sensitivity control signal having a waveform shaped like the delta function is used to increase the sensitivity at a timing delayed by a specific time from the emission of light from an illumination device, is also applicable to fluorescence lifetime imaging microscopy (FLIM). The spectrum of the fluorescence may be different depending on the surrounding pH. Consequently, for example, the mapping of pH inside living tissue is possible. The above-described imaging that increases the sensitivity at a timing delayed by a specific time from the emission of light from an illumination device is also applicable to rangefinding that utilizes the time-of-flight method. In this way, according to an embodiment of the present disclosure, mapping related to oxygen concentration, pH mapping, and the like may be realized. In particular, by applying a photoelectron conversion area having a sandwich structure to the photoelectric conversion unit 12, mapping related to oxygen concentration, pH, or the like becomes possible with a comparatively simple configuration.

As described above, according to an embodiment of the present disclosure, it is possible to extract information related to a specific component from the variation over time in the brightness of a subject. By actively producing a variation over time in the brightness of the subject by using an illumination device, useful information about the subject, such as the distance to the subject, may be acquired. Particularly, a wide array of applications becomes possible by synchronizing the modulation of the sensitivity of the imaging cells 10 with the modulation of the emitted light from the illumination device.

In this way, according to an embodiment of the present disclosure, information related to the brightness of a subject that varies over time during the exposure period may be obtained. Note that in each of the foregoing aspects, an example is described in which each of the signal detection transistor 22, the address transistor 24, and the reset transistor 26 is an n-channel MOSFET. However, the transistors in an embodiment of the present disclosure are not limited to n-channel MOSFETs, and may also be p-channel MOSFETs. Also, it is not necessary for these transistors to be n-channel MOSFETs or p-channel MOSFETs uniformly. Besides FETs, bipolar transistors may also be used as the transistors.

An imaging device of the present disclosure is broadly applicable to devices such as analysis devices and imaging devices in fields such as the physical and chemical sciences and medical science. In addition, an imaging device of the present disclosure may also be used in a security camera, a camera used onboard a vehicle, and the like. For example, an onboard camera for a vehicle may be utilized as an input for a control device in order for the vehicle to run safely. Alternatively, an onboard camera may be utilized to assist an operator in driving the vehicle safely.

What is claimed is:

1. An imaging system, comprising:
a first illuminator that irradiates a subject with light whose intensity varies over time;
a second illuminator that irradiates the subject with light whose intensity varies over time; and
a first imaging device that comprises a first imaging cell having a variable sensitivity, and a first sensitivity control line electrically connected to the first imaging cell, and
a second imaging device that comprises a second imaging cell having a variable sensitivity, and a second sensitivity control line electrically connected to the second imaging cell, wherein
the first imaging cell comprises a photoelectron conversion area that receives light from the subject to generate a signal charge, and a signal detection circuit that detects the signal charge,
during an exposure period from a reset of the first imaging cell until a readout of the signal charge accumulated in the first imaging cell by exposure, the first sensitivity control line supplies to the first imaging cell a first sensitivity control signal having a waveform expressed by a first function,
the second imaging cell comprises a photoelectron conversion area that receives light from the subject to generate a signal charge, and a signal detection circuit that detects the signal charge, and
during an exposure period from a reset of the second imaging cell until a readout of the signal charge accumulated in the second imaging cell by exposure, the second sensitivity control line supplies to the second imaging cell a second sensitivity control signal having a waveform expressed by a second function.

2. The imaging system according to claim 1, wherein the first illuminator periodically varies the intensity of the light.

3. The imaging system according to claim 1, wherein the first imaging device further comprises a synchronization circuit that synchronizes the first sensitivity control signal with the variation over time in the intensity of the light.

4. The imaging system according to claim 1, wherein the first imaging device further comprises a third imaging cell having a variable sensitivity, and a third sensitivity control line electrically connected to the third imaging cell,
the third imaging cell comprises a photoelectron conversion area that receives light from the subject to generate a signal charge, and a signal detection circuit that detects the signal charge, and
during an exposure period from a reset of the third imaging cell until a readout of the signal charge accumulated in the third imaging cell by exposure, the third sensitivity control line supplies to the third imaging cell a fourth sensitivity control signal having a waveform expressed by a fourth function obtained by time-shifting the first function.

5. The imaging system according to claim 1, wherein the first imaging device further comprises a third imaging cell having a variable sensitivity, and a third sensitivity control line electrically connected to the third imaging cell,
the third imaging cell comprises a photoelectron conversion area that receives light from the subject to generate a signal charge, and a signal detection circuit that detects the signal charge, and
during an exposure period from a reset of the third imaging cell until a readout of the signal charge accumulated in the third imaging cell by exposure, the third sensitivity control line supplies to the third imaging cell a fourth sensitivity control signal having a waveform expressed by a constant function.

6. The imaging system according to claim 1, wherein the orthogonal system is a complete orthogonal system.

7. The imaging system according to claim 1, wherein the first function takes only positive values by adding a first constant to one basis from among bases of a system of functions constituting an orthogonal system, and the second function takes only positive values by adding a second constant to another basis from among the bases.

8. An imaging system, comprising:
a first illuminator that irradiates a subject with light whose intensity varies over time; and a first imaging device that comprises a first imaging cell having a variable sensitivity, and a first sensitivity control line electrically connected to the first imaging cell, wherein the first imaging cell comprises a photoelectron conversion area that receives light from the subject to generate a signal charge, and a signal detection circuit that detects the signal charge, during an exposure period from a reset of the first imaging cell until a readout of the signal charge accumulated in the first imaging cell by exposure, the first sensitivity control line supplies to the first imaging cell a first sensitivity control signal having a waveform expressed by a first function, and the first function is a Walsh function that is not a constant function.

9. The imaging system according to claim 8, wherein the first function takes only positive values by adding a first constant to one basis from among bases of a system of functions constituting an orthogonal system.

10. An imaging system, comprising:

a first illuminator that irradiates a subject with light whose intensity varies over time; and a first imaging device that comprises a first imaging cell having a variable sensitivity, and a first sensitivity control line electrically connected to the first imaging cell, wherein the first imaging cell comprises a photoelectron conversion area that receives light from the subject to generate a signal charge, and a signal detection circuit that detects the signal charge, during an exposure period from a reset of the first imaging cell until a readout of the signal charge accumulated in the first imaging cell by exposure, the first sensitivity control line supplies to the first imaging cell a first sensitivity control signal having a waveform expressed by a first function, and during a second exposure period later than the exposure period, the first sensitivity control line supplies to the first imaging cell a third sensitivity control signal having a waveform expressed by a third function obtained by time-shifting the first function.

11. The imaging system according to claim 10, wherein the first function takes only positive values by adding a first constant to one basis from among bases of a system of functions constituting an orthogonal system.

12. An imaging system, comprising:

a first illuminator that irradiates a subject with light whose intensity varies over time; and a first imaging device that comprises a first imaging cell having a variable sensitivity, and a first sensitivity control line electrically connected to the first imaging cell, wherein the first imaging cell comprises a photoelectron conversion area that receives light from the subject to generate a signal charge, and a signal detection circuit that detects the signal charge, during an exposure period from a reset of the first imaging cell until a readout of the signal charge accumulated in the first imaging cell by exposure, the first sensitivity control line supplies to the first imaging cell a first sensitivity control signal having a waveform expressed by a first function, and during a second exposure period later than the exposure period, the first sensitivity control line supplies to the first imaging cell a third sensitivity control signal having a waveform expressed by a constant function.

13. The imaging system according to claim 12, wherein the first function takes only positive values by adding a first constant to one basis from among bases of a system of functions constituting an orthogonal system.

* * * * *